US012804887B2

(12) United States Patent
Wang et al.

(10) Patent No.: US 12,804,887 B2
(45) Date of Patent: Nov. 17, 2026

(54) SEMICONDUCTOR STRUCTURE INCLUDING POLYSILICON AS BOTTOM LAYER OF BIT LINE STRUCTURE AND METHOD OF MANUFACTURING THE SAME

(71) Applicant: NANYA TECHNOLOGY CORPORATION, New Taipei City (TW)

(72) Inventors: Mao-Ying Wang, New Taipei City (TW); Yu-Ting Lin, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 396 days.

(21) Appl. No.: 18/413,376

(22) Filed: Jan. 16, 2024

(65) Prior Publication Data

US 2025/0234516 A1 Jul. 17, 2025

(51) Int. Cl.
*H10B 12/00* (2023.01)

(52) U.S. Cl.
CPC ......... *H10B 12/482* (2023.02); *H10B 12/056* (2023.02); *H10B 12/36* (2023.02); *H10B 12/485* (2023.02)

(58) Field of Classification Search
CPC .... H10B 12/056; H10B 12/36; H10B 12/482; H10B 12/485
See application file for complete search history.

(56) References Cited

U.S. PATENT DOCUMENTS

2025/0072087 A1* 2/2025 Park .................... H10B 12/033
2025/0107073 A1* 3/2025 Oh ....................... H10B 12/053

* cited by examiner

*Primary Examiner* — Nelson Garces
(74) *Attorney, Agent, or Firm* — Xuan Zhang

(57) ABSTRACT

A semiconductor structure includes: a substrate including a plurality of fin structures; a dielectric layer, disposed over adjacent fin structures, wherein a top surface of the dielectric layer is a substantially planar surface; a bit line structure, disposed over the substrate and between adjacent fin structures, wherein the bit line structure includes a polysilicon layer contacting the top surface of the dielectric layer; and a spacer structure, surrounding the bit line structure, wherein the spacer structure contacts the top surface of the dielectric layer. A method of manufacturing the semiconductor structure is also provided.

11 Claims, 47 Drawing Sheets

SEMICONDUCTOR STRUCTURE INCLUDING POLYSILICON AS BOTTOM LAYER OF BIT LINE STRUCTURE AND METHOD OF MANUFACTURING THE SAME

TECHNICAL FIELD

The present disclosure relates to a method of manufacturing a semiconductor structure. Particularly, the present disclosure relates to an improved patterning result of a bit line structure.

DISCUSSION OF THE BACKGROUND

Semiconductor devices are used in a variety of electronic applications, such as personal computers, cellular phones, digital cameras, and other electronic equipment. The semiconductor devices are typically fabricated by sequentially depositing insulating or dielectric layers, conductive layers, and semiconductive layers of material over a semiconductor substrate, and patterning the various material layers using lithography to form circuit components and elements on the semiconductor substrate. As the semiconductor industry has progressed into advanced technology process nodes in pursuit of greater device density, higher performance, and lower costs, challenges of precise control of dimensions of elements have arisen.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure includes: a substrate, including a plurality of fin structures; a dielectric layer, disposed over adjacent fin structures, wherein a top surface of the dielectric layer is a substantially planar surface; a bit line structure, disposed over the substrate and between adjacent fin structures, wherein the bit line structure includes a polysilicon layer contacting the top surface of the dielectric layer; and a spacer structure, surrounding the bit line structure, wherein the spacer structure contacts the top surface of the dielectric layer.

Another aspect of the present disclosure provides a method for manufacturing a semiconductor structure. The method includes a number of operations. A substrate is provided, wherein the substrate includes a fin structure. A dielectric layer is formed over the substrate, wherein a top surface of the dielectric layer is substantially planar. A polysilicon layer is formed over the substrate and the dielectric layer. A bit line contact is formed on a top of the fin structure, wherein the bit line contact penetrates the polysilicon layer. A patterned mask is formed over the bit line contact and the polysilicon layer. The bit line contact and the polysilicon layer are patterned, wherein a sidewall of the bit line contact is a substantially straight sidewall and the top surface of the dielectric layer remains substantially planar after the patterning of the bit line contact and the polysilicon layer.

Another aspect of the present disclosure provides a method for manufacturing a semiconductor structure. The method includes a number of operations. A substrate is provided, wherein the substrate includes a plurality of fin structures in an array region of the substrate. An oxide layer is formed over the substrate and covers tops of the fin structures. A plurality of word line structures are formed alternately arranged with the plurality of fin structures, wherein a top surface of the oxide layer is substantially aligned with a top surface of the plurality of word line structures. A polysilicon layer is formed over the substrate, the plurality of word line structures, the plurality of fin structures, and the oxide layer. A plurality of bit line contacts are formed over the plurality of fin structures and penetrate the polysilicon layer. A patterned layer is formed over the polysilicon layer. The polysilicon layer is patterned using the patterned layer as a mask, thereby forming a patterned polysilicon layer, wherein a sidewall of the patterned polysilicon layer is substantially straight.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
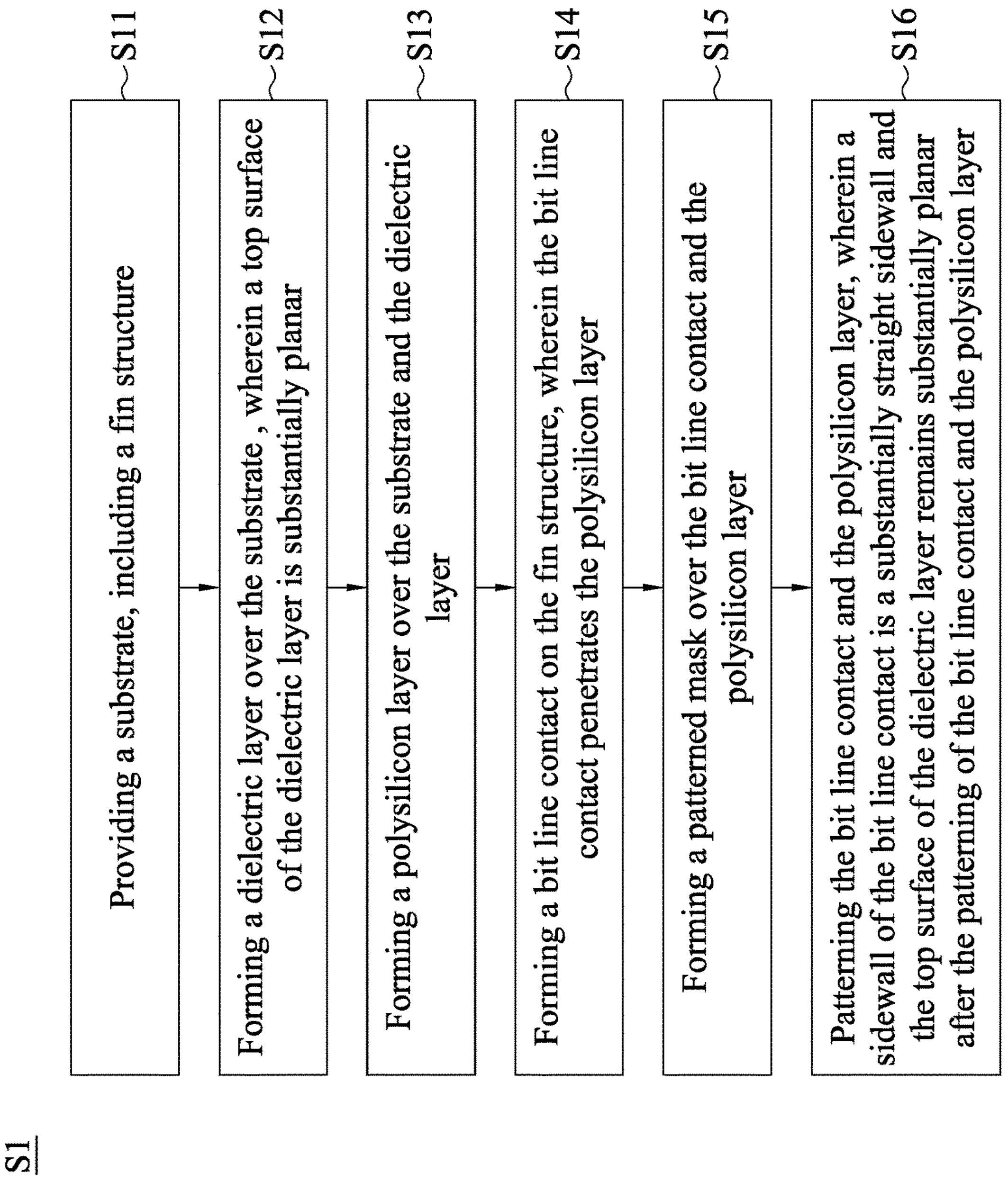
FIG. 1 is a flow diagram illustrating a method of manufacturing a semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

As the semiconductor industry has progressed into advanced technology process nodes in pursuit of greater device density, it has achieved an ability to provide advanced precision of photolithography. In order to further reduce device sizes, dimensions of elements and distances between elements have to be proportionally reduced. However, with the reductions in the dimensions of the elements and the distances between elements, challenges of precise control of the dimensions and the distances have arisen. For instance, a landing pad or a contact disposed between bit line structures may be unintentionally altered if a sidewall of the bit line structure cannot be precisely controlled to be straight.

FIG. 1 is a flow diagram illustrating a method S1 for manufacturing a semiconductor device in accordance with some embodiments of the present disclosure. The method S1 includes a number of operations (S11, S12, S13, S14, S15 and S16) and the description and illustrations are not deemed as a limitation to the sequence of the operations. In the operation S11, a substrate is provided, wherein the substrate includes a fin structure. In the operation S12, a dielectric layer is formed over the substrate, wherein a top surface of the dielectric layer is substantially planar. In the operation S13, a polysilicon layer is formed over the substrate and the dielectric layer. In the operation S14, a bit line contact is formed on a top of the fin structure, wherein the bit line contact penetrates the polysilicon layer. In the operation S15, a patterned mask is formed over the bit line contact and the polysilicon layer. In the operation S16, the bit line contact and the polysilicon layer are patterned, wherein a sidewall of the bit line contact is a substantially straight sidewall and the top surface of the dielectric layer remains substantially planar after the patterning of the bit line contact and the polysilicon layer. It should be noted that the operations of the method S1 may be rearranged or otherwise modified within the scope of the various aspects. Additional processes may be provided before, during, and after the method S1, and some other processes may be only briefly described herein. Thus, other implementations are possible within the scope of the various aspects described herein.

Figure 2:
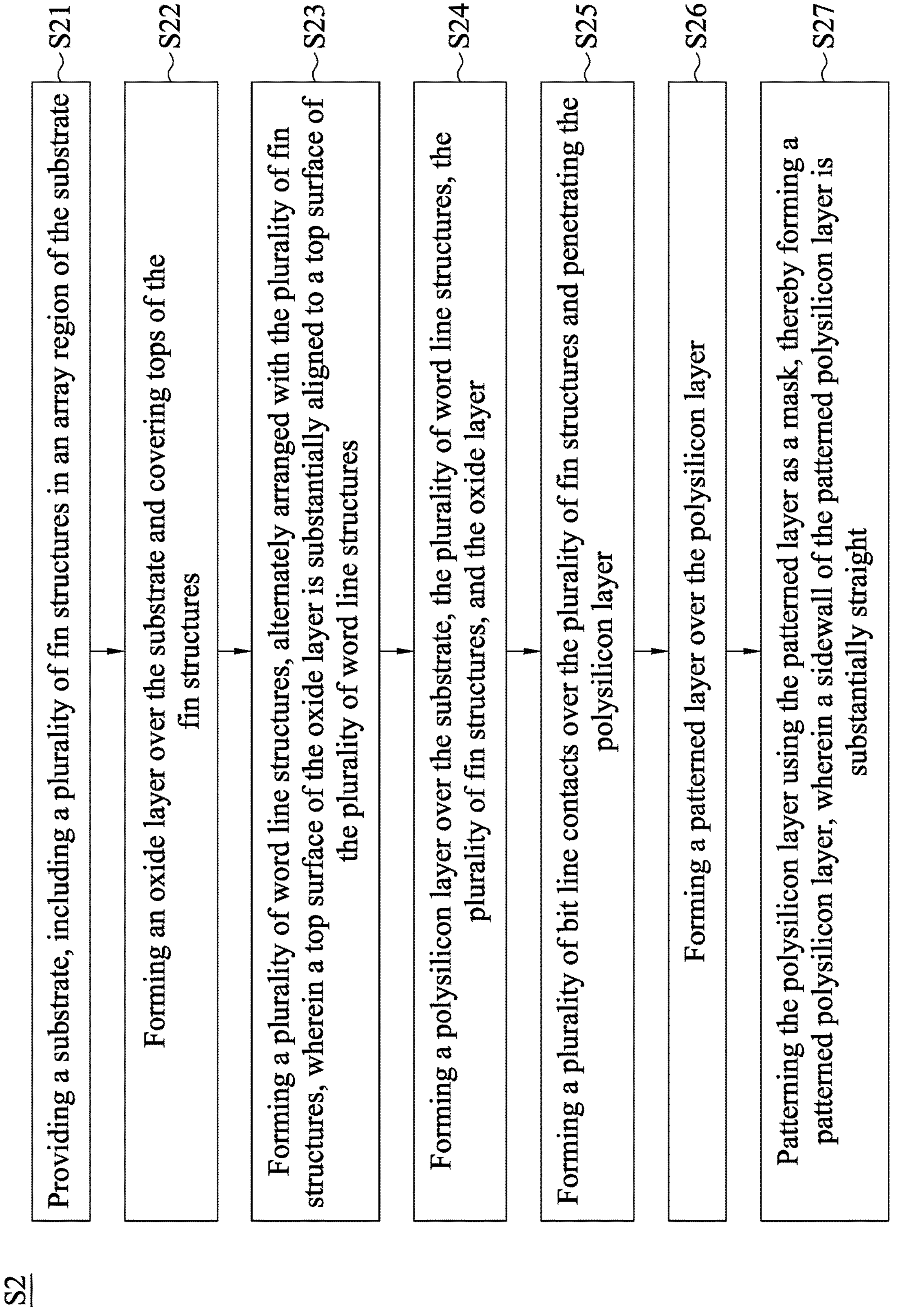
FIG. 2 is a flow diagram illustrating a method of manufacturing a semiconductor structure in accordance with some embodiments of the present disclosure.

FIG. 2 is a flow diagram illustrating a method S2 for manufacturing a semiconductor device in accordance with some embodiments of the present disclosure. The method S2 includes a number of operations (S21, S22, S23, S24, S25, S26 and S27) and the description and illustrations are not deemed as a limitation to the sequence of the operations. In the operation S21, a substrate is provided, wherein the substrate includes a plurality of fin structures in an array region of the substrate. In the operation S22, an oxide layer is formed over the substrate and covers tops of the fin structures. In the operation S23, a plurality of word line structures are formed alternately arranged with the plurality of fin structures, wherein a top surface of the oxide layer is substantially aligned with a top surface of the plurality of word line structures. In the operation S24, a polysilicon layer is formed over the substrate, the plurality of word line structures, the plurality of fin structures, and the oxide layer. In the operation S25, a plurality of bit line contacts are formed over the plurality of fin structures and penetrate the polysilicon layer. In the operation S26, a patterned layer is formed over the polysilicon layer. In the operation S27, the polysilicon layer is patterned using the patterned layer as a mask, thereby forming a patterned polysilicon layer, wherein a sidewall of the patterned polysilicon layer is substantially straight. It should be noted that the operations of the method S2 may be rearranged or otherwise modified within the scope of the various aspects. Additional processes may be provided before, during, and after the method S2, and some other processes may be only briefly described herein. Thus, other implementations are possible within the scope of the various aspects described herein.

The method S1 and the method S2 are within a same concept of the present disclosure, and in order to further illustrate details of the method S1 and the method S2, and the concept of the present disclosure, the method S1 and the method S2 are comprehensively described with embodiments of the present disclosure.

FIGS. 3 to 47 are schematic diagrams illustrating various fabrication stages constructed according to the method S1 and/or the method S2 for manufacturing a semiconductor structure 10 in accordance with some embodiments of the present disclosure. The stages shown in FIGS. 3 to 47 are also illustrated schematically in the process flow in FIG. 1 or FIG. 2. In the subsequent discussion, the fabrication stages shown in FIGS. 3 to 47 are discussed in reference to the process steps in FIGS. 1 and 2.

Figure 3:
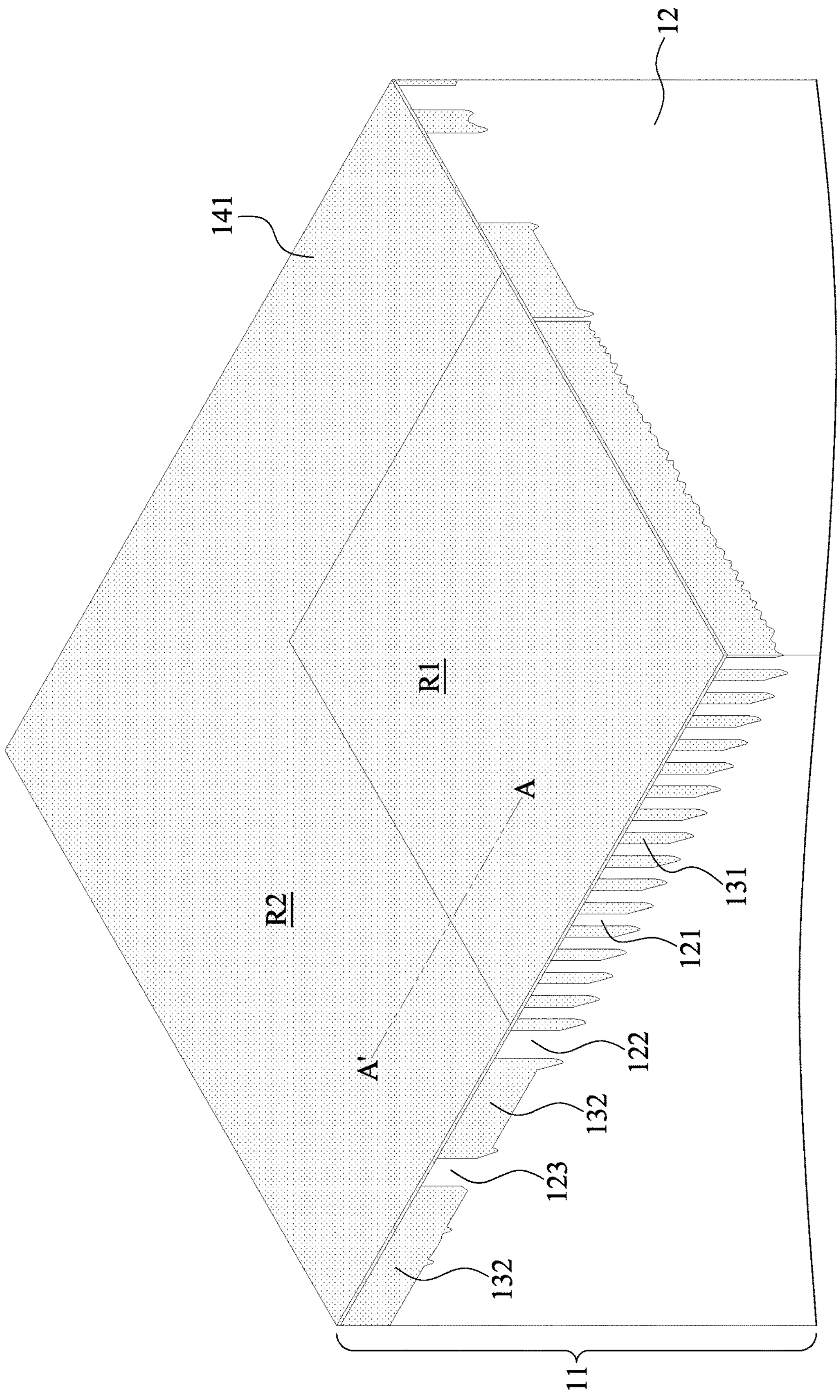
FIG. 3 is a schematic 3D diagram of an intermediate stage in formation of a semiconductor structure in accordance with some embodiments of the present disclosure.
Figure 4:
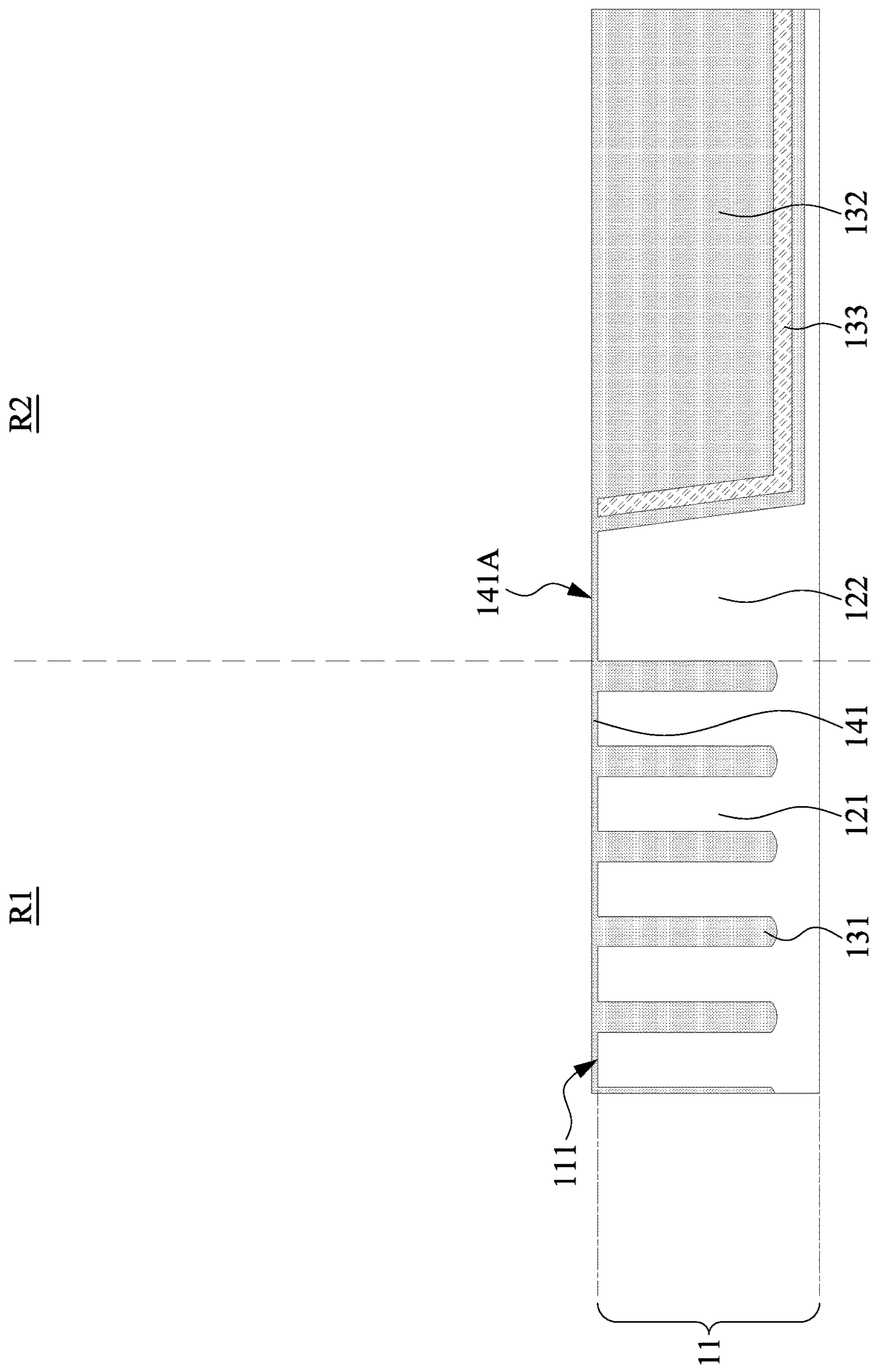
FIGS. 4 to 36 are cross-sectional diagrams of intermediate stages along a line A-A' shown in FIG. 3 or a line B-B' shown in FIG. 37 in the formation of the semiconductor structure in accordance with some embodiments of the present disclosure.

Referring to FIGS. 3 and 4, FIG. 3 is a schematic 3D diagram at a stage of the method S1 and/or the method S2, and FIG. 4 is a schematic cross-sectional diagram along a line A-A' in FIG. 3 in accordance with some embodiments of the present disclosure. In the operation S11 and/or the operation S21, a substrate 11 is provided, received, or formed.

In some embodiments, the substrate 11 may have a multilayer structure, or the substrate 11 may include a multilayer compound semiconductor structure. In some embodiments, the substrate 11 includes semiconductor devices, electrical components, electrical elements or a combination thereof. In some embodiments, the substrate 11 includes transistors or functional units of transistors. In some embodiments, the substrate 11 includes active components, passive components, and/or conductive elements. The active components may include a memory die (e.g., a dynamic random-access memory (DRAM) die, a static random-access memory (SRAM) die, etc.), a power management die (e.g., a power management integrated circuit (PMIC) die), a logic die (e.g., a system-on-a-chip (SoC), a central processing unit (CPU), a graphics processing unit (GPU), an application processor (AP), a microcontroller, etc.), a radio frequency (RF) die, a sensor die, a micro-electro-mechanical-system (MEMS) die, a signal processing die (e.g., a digital signal processing (DSP) die), a front-end die (e.g., an analog front-end (AFE) die) or other active components. Each of the active components may include multiple transistors. The transistors can include planar transistors, multi-gate transistors, gate-all-around field-effect transistors (GAAFET), fin field-effect transistors (FinFET), vertical transistors, nanosheet transistors, nanowire transistors, or a combination thereof. The passive components may include a capacitor, a resistor, an inductor, a fuse or other passive components. The conductive elements may include metal lines, metal islands, conductive vias, contacts or other conductive elements.

The active components, passive components, and/or conductive elements as mentioned above can be formed in and/or over a semiconductor substrate. The semiconductor substrate may be a bulk semiconductor, a semiconductor-on-insulator (SOI) substrate, or the like. The semiconductor substrate can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient Si:Ge feature in which Si and Ge compositions change from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy.

For a purpose of simplicity, the substrate 11 depicted in FIGS. 3 and 4 can be a topmost portion of a multilayer structure of the substrate 11. The substrate 11 may include an array region R1 and a peripheral region R2 surrounding the array region R1. In some embodiments, the active components or the transistors are mostly formed in the array region R1, and the peripheral region R2 is for circuit routing and may include passive components. In some embodiments, the substrate 11 includes a silicon material 12 and a dielectric material 13. The dielectric material 13 may include multiple dielectric portions 131 in the array region R1. The dielectric portions 131 become multiple isolations in the silicon material 12. In some embodiments, the dielectric portions 131 may have a pillar-like configuration and may be inserted into the silicon material 12 to define multiple pillar-like silicon portions 121 alternately arranged with the multiple dielectric portions 131 in the array region R1. The pillar-like silicon portions 121 may be referred to as fin structures 121.

The silicon material 12 can further include one or more silicon portions 122 disposed in the peripheral region R2 proximal to the array region R1 for a purpose of separation of the devices in the array region R1 and the peripheral region R2. The silicon material 12 may further include one or more silicon portions 123 (shown in FIG. 3) disposed in the peripheral region R2 away from the array region R1 for a purpose of formation of peripheral circuits or devices. The dielectric material 13 can further include one or more dielectric portions 132 in the peripheral region R2. In some embodiments, a dielectric layer 133 is optionally embedded in the dielectric portions 132.

Memory cells or devices may be formed in the array region R1 of the substrate 11 (not shown). For a purpose of illustration, the figures show a portion of the substrate 11 above the memory cells or memory devices, and word line (WL) structures and bit line (BL) structures are formed in subsequent processing in the topmost portion of the substrate 11 shown in FIGS. 3 and 4. In some embodiments, each of the dielectric portions 131 and the silicon portions 121 extends along a Y direction in the array region R1 from a top view perspective. In some embodiments, multiple WL structures extending along the Y direction are subsequently formed in the array region R1 for electrical connection to the memory cells or memory devices.

A dielectric sublayer 141 may be formed over a top surface 111 of the substrate 11 in the operation S12 or S22. In some embodiments, the dielectric sublayer 141 is conformal to the top surface 111 of the substrate 11. In some embodiments, the dielectric sublayer 141 is in contact with the substrate 11. In some embodiments, the dielectric sublayer 141 is formed in the array region R1 and the peripheral region R2. The dielectric sublayer 141 may have a top surface 141A being substantially planar. In some embodiments, the top surface 141A is a planar surface extending along an X-Y plane. In some embodiments, the dielectric sublayer 141 includes oxide such as silicon oxide. In some embodiments, the dielectric sublayer 141 is formed using a chemical vapor deposition (CVD), physical vapor deposition (PVD) or any other suitable process. In some embodiments, a thickness of the dielectric sublayer 141 is in a range of 2 to 10 nanometers (nm). In some embodiments, the thickness of the dielectric sublayer 141 is about 5 nm.

Figure 5:
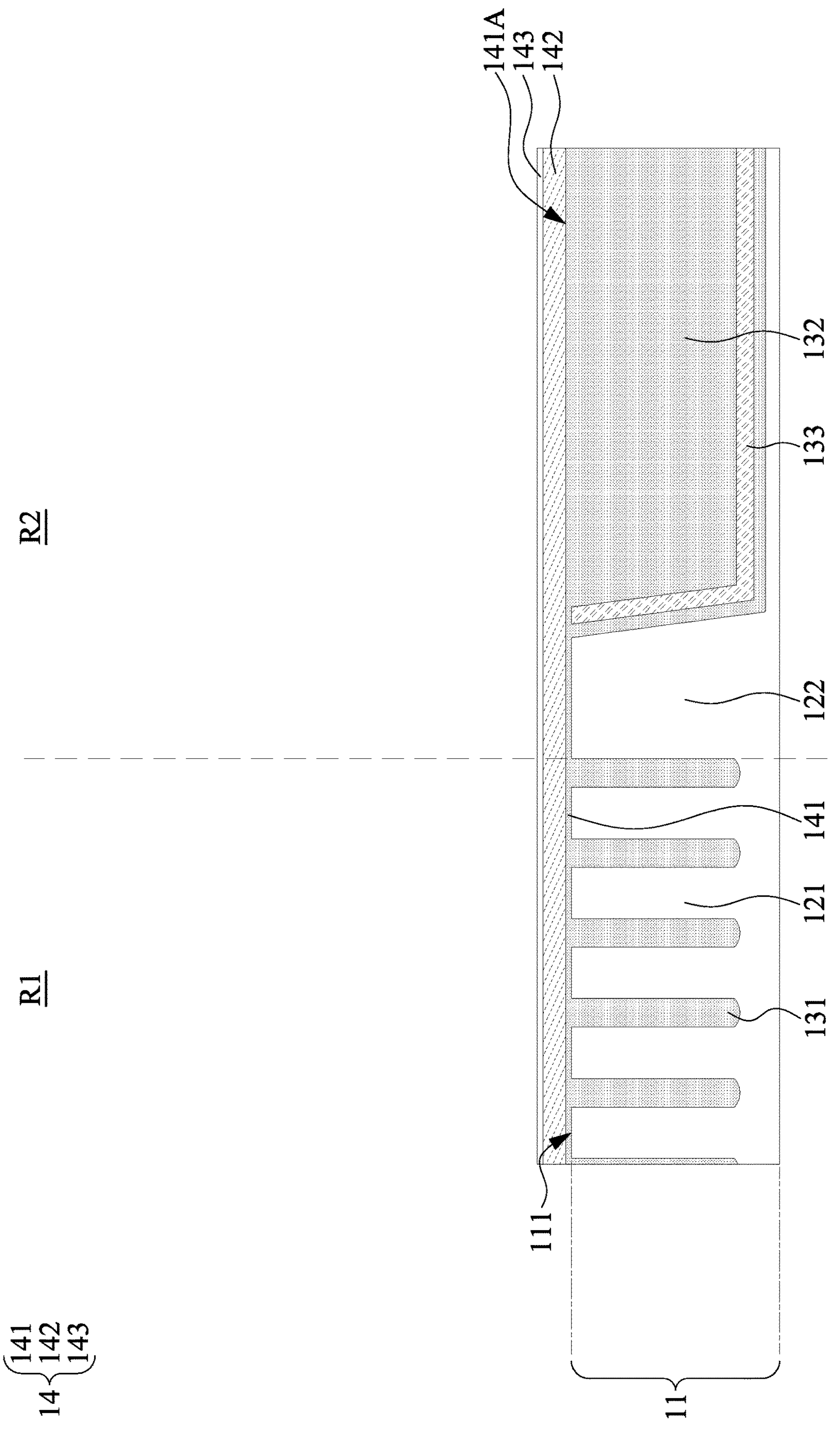

Referring to FIG. 5, FIG. 5 is a schematic cross-sectional diagram along the line A-A' in FIG. 3 at a stage of the method S1 and/or the method S2 in accordance with some embodiments of the present disclosure. Another dielectric sublayer 142 is formed over the dielectric sublayer 141. In some embodiments, the dielectric sublayer 142 includes oxide such as silicon oxide. In some embodiments, the dielectric sublayer 142 is formed using CVD, PVD or any other suitable process. The dielectric sublayer 142 can be conformal to the dielectric sublayer 141. In some embodiments, the dielectric sublayer 142 has a top surface being substantially planar. In some embodiments, a thickness of the dielectric sublayer 142 is in a range of 10 to 20 nm. In some embodiments, the thickness of the dielectric sublayer 142 is about 15 nm.

A dielectric layer 143 can optionally be formed over the dielectric sublayer 142. The dielectric layer 143 can be conformal to the dielectric sublayer 142. In some embodiments, the dielectric layer 143 has a top surface being substantially planar. In some embodiments, the dielectric layer 143 includes nitride, such as silicon nitride. The dielectric layer 143 is for a purpose of preventing peeling of a carbon layer (e.g., 22 in FIG. 6) formed in subsequent processing. In some embodiments, the dielectric sublayers 141 and 142 (and optionally the dielectric layer 143) together define a dielectric layer 14. In some embodiments, a thickness of the dielectric layer 143 is in a range of 2 to 7 nm. In some embodiments, the thickness of the dielectric layer 143 is about 5 nm. In some embodiments, a thickness of the dielectric layer 14 is in a range of 15 to 35 nm. For a purpose of simplicity, the dielectric layer 143 is omitted in the figures of subsequent processing. It should be noted that a number of sublayers of the dielectric layer 14 can depend on different applications. The dielectric layer 14 can be a single layer or a multi-layer structure.

Figure 6:
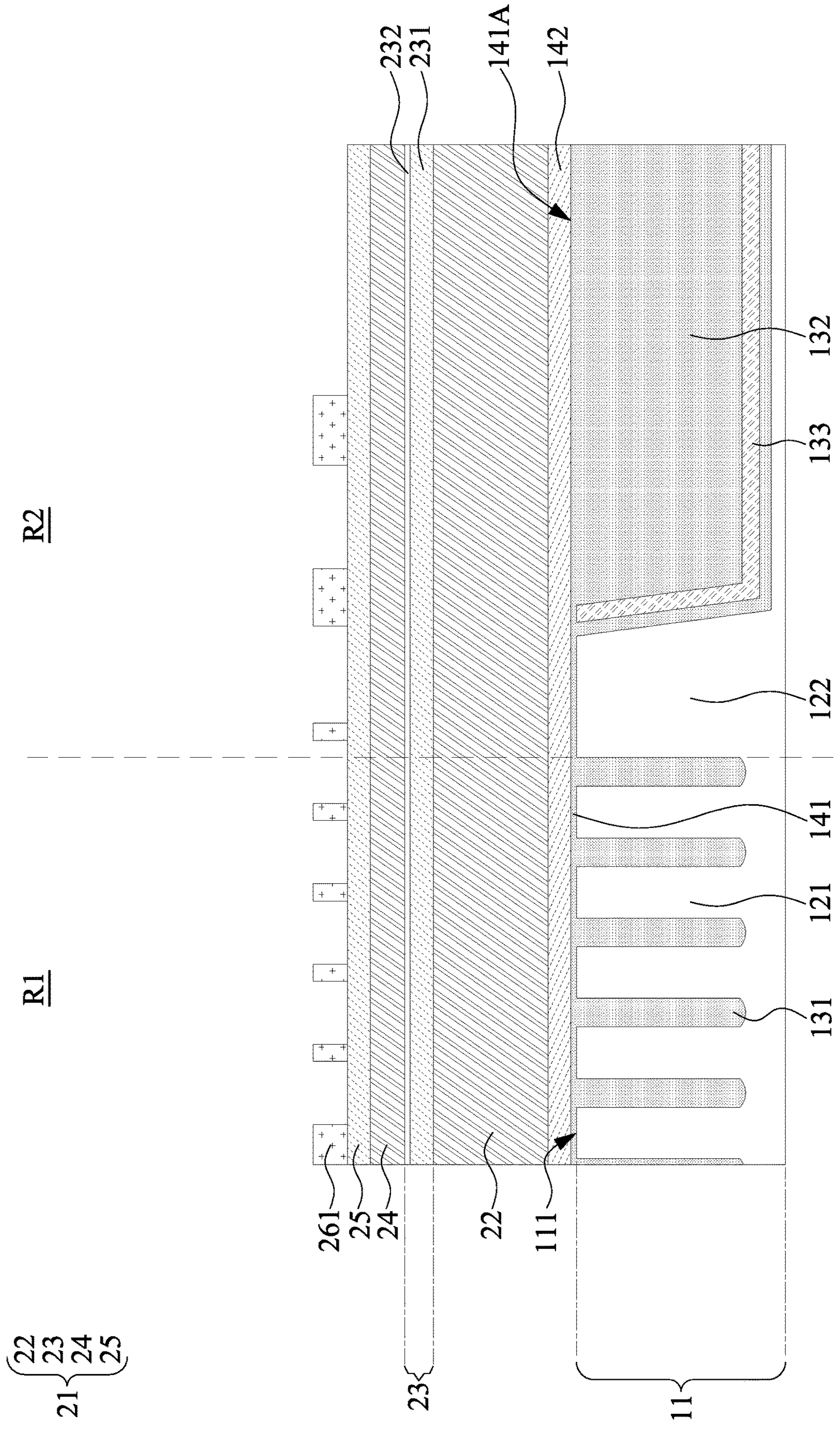

Referring to FIG. 6, FIG. 6 is a schematic cross-sectional diagram along the line A-A' in FIG. 3 at a stage of the method S1 and/or the method S2 in accordance with some embodiments of the present disclosure. After the operation S12 and/or the operation S22, a multi-layer structure 21 is formed over the substrate 11 and the dielectric layer 14.

The multi-layer structure 21 can be a hard-mask structure and may include several layers stacked over each other. In some embodiments, the multi-layer structure 21 includes a first layer 22, a second layer 23, a third layer 24 and a fourth layer 25. In some embodiments, the first layer 22, the second layer 23, the third layer 24 and the fourth layer 25 are sequentially formed over the dielectric layer 14.

In some embodiments, the first layer 22 is disposed on the dielectric layer 14. In some embodiments, the first layer 22 includes carbon. In some embodiments, the first layer 22 is formed by CVD, PVD, or any other suitable process. In some embodiments, the second layer 23 is disposed over the first layer 22. In some embodiments, the second layer 23 is an antireflective coating (ARC) layer. The second layer 23 may include magnesium fluoride, silicon nitride, silicon dioxide, titanium dioxide, aluminum oxide, other suitable materials, or a combination thereof. In some embodiments, the second layer 23 may be formed by a plasma-enhanced CVD (PECVD) process.

The second layer 23 can include a first sublayer 231 and a second sublayer 232. In some embodiments, the first sublayer 231 is an oxide-rich layer, and the second sublayer 232 is a silicon-rich layer. In some embodiments, a thickness of the first sublayer 231 is greater than a thickness of the second sublayer 232.

The third layer 24 and the fourth layer 25 can be similar to the first layer 22 and the first sublayer 231, respectively. In some embodiments, the third layer 24 includes carbon. In some embodiments, the third layer 24 is disposed over the second layer 23. In some embodiments, the fourth layer 25 is an ARC layer. In some embodiments, the fourth layer 25 is a single layer structure. In some embodiments, the fourth layer 25 is an oxide-rich layer. In some embodiments, a thickness of the first layer 22 is greater than a thickness of the third layer 24. In some embodiments, a thickness of the fourth layer 25 is substantially equal to the thickness of the first sublayer 231 of the second layer 23.

Formations and materials of the third layer 24 and the fourth layer 25 can be similar to those of the first layer 22 and the first sublayer 231, respectively, and repeated description is omitted herein. In some embodiments, the deposition of each of the first, second, third and fourth layers 22, 23, 24 and 25 may be performed in-situ to save processing time and reduce possibility of contamination. As used herein, the term "in-situ" is used to refer to processes in which the substrate 11 being processed is not exposed to an external ambient (e.g., external to the processing system) environment.

The multi-layer structure 21 functions as a hard mask to define a pattern of the WL structures to be formed in the substrate 11. In some embodiments, the fourth layer 25 is a topmost layer of the multi-layer structure 21 and is formed prior to formation of a photoresist layer 261. In some embodiments, the fourth layer 25 is formed between the third layer 24 and the photoresist layer 261 in order to eliminate problems associated with reflection of light during exposure of the photoresist layer 261. The photoresist layer 261 is formed and patterned as shown in FIG. 6 after the formation of the multi-layer structure 21. In some embodiments, the photoresist layer 261 is referred to as a patterned mask layer 261.

Figure 7:
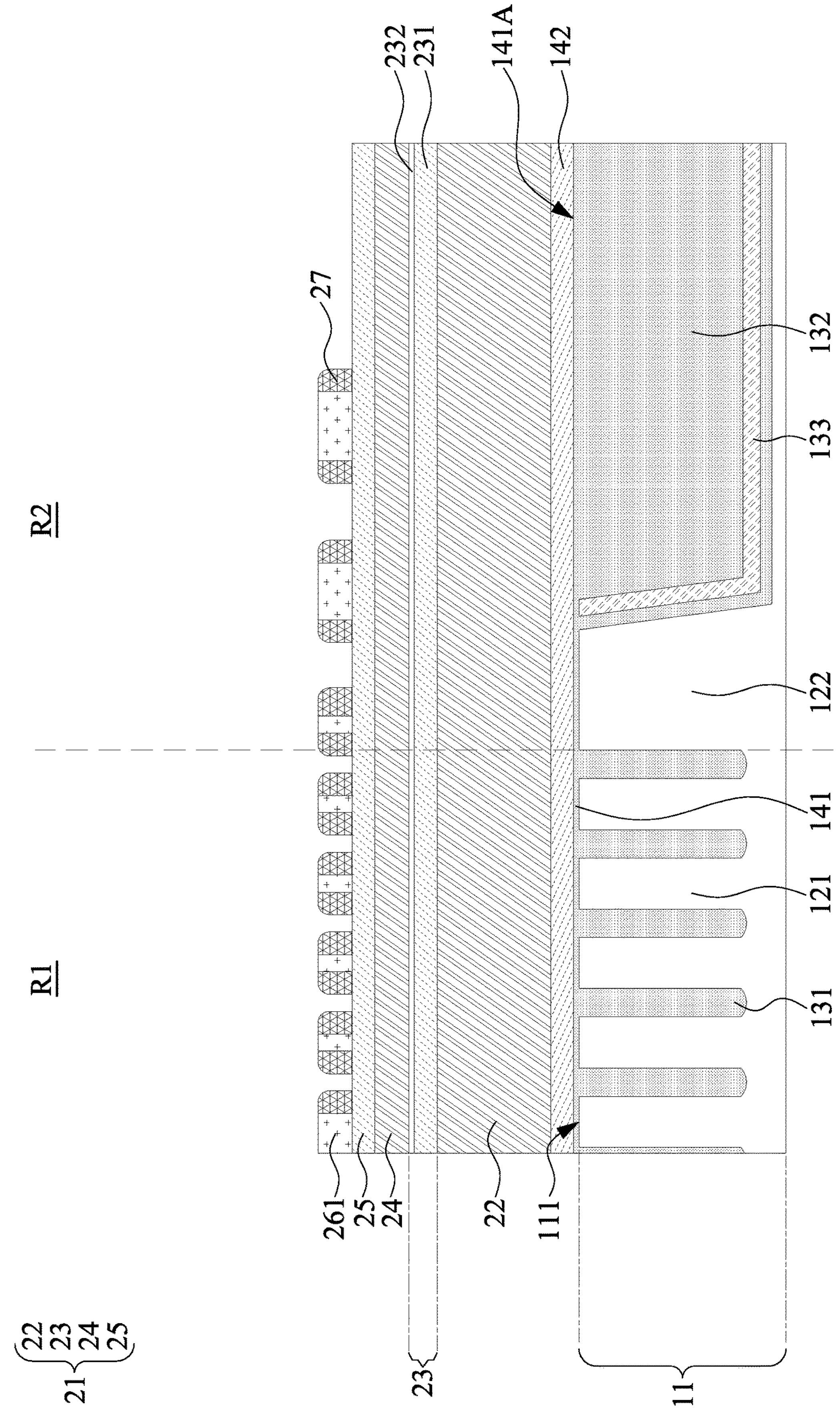

Referring to FIG. 7, a spacer structure 27 is formed surrounding each of a plurality of portions of the photoresist layer 261 after the operations shown in FIG. 6 according to the method S1 and/or the method S2. The spacer structure 27 can be formed by any suitable process. For example, a layer of spacer material (e.g., oxide, nitride, oxynitride or a combination thereof) is deposited conformal to the photoresist layer 261, and a spacer etching operation is performed on the layer of spacer material. The photoresist layer 261 is removed after the formation of the spacer structure 27. A pattern of the spacer structure 27 is aligned with the positions of the WL structures to be formed in subsequent processing.

Prior to the formation of the WL structures of the operation S23, the pattern of the spacer structure 27 is transferred to the multi-layer structure 21. Operations of patterning the multi-layer structure 21 are illustrated in FIGS. 8 to 13.

Figure 8:
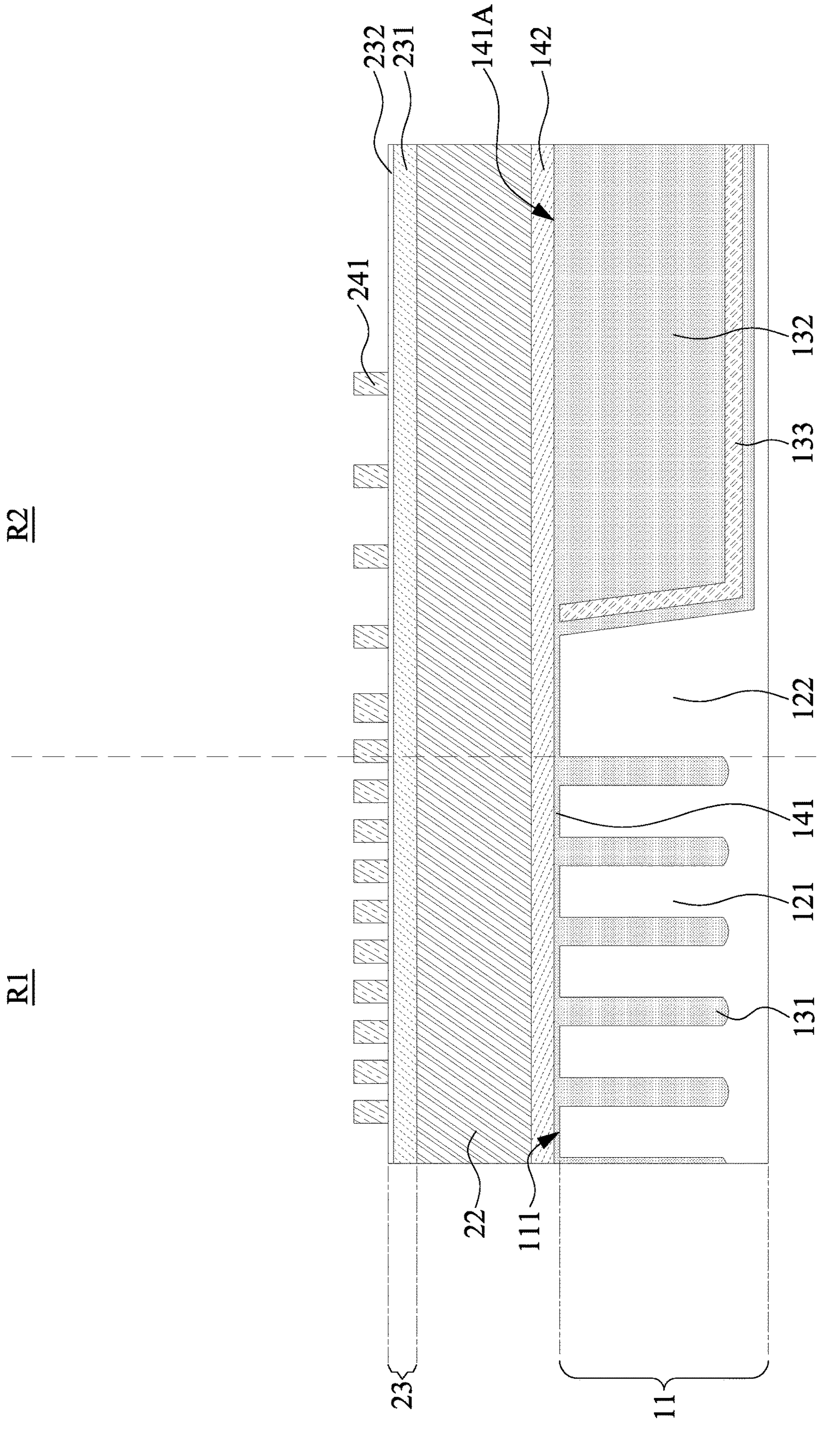

Referring to FIG. 8, the pattern of the spacer structure 27 is transferred to the third layer 24 by a patterning operation to form a patterned third layer 241. In some embodiments, the fourth layer 25 is patterned concurrently, during the patterning operation performed on the third layer 24. In some embodiments, the spacer structure 27 and the fourth layer 25 are removed after the patterning operation. In some embodiments, a suitable etching operation is performed to pattern the fourth layer 25 and the third layer 24. Accordingly, the patterned third layer 241 having a pattern substantially identical to the pattern of the spacer structure 27 is formed.

Figure 9:
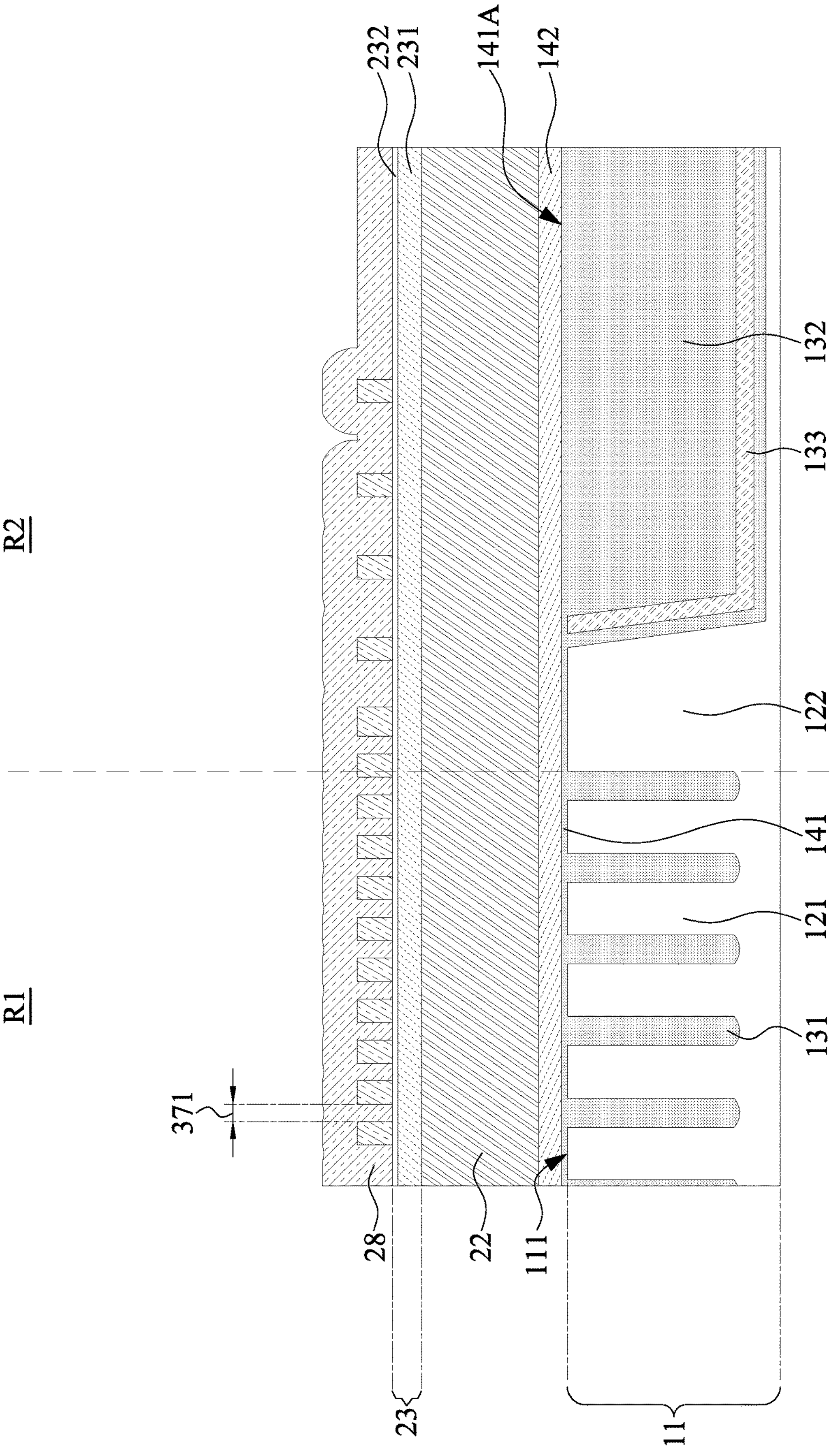

Referring to FIG. 9, a dielectric layer 28 is formed over the patterned third layer 241 after the patterning operation shown in FIG. 8. In some embodiments, the dielectric layer 28 is formed by a blanket deposition. In some embodiments, the dielectric layer 28 at least fills spaces between portions of the patterned third layer 241. In some embodiments, the dielectric layer 28 is disposed over and between the portions of the patterned third layer 241. In some embodiments, a thickness of the dielectric layer 28 is substantially greater than one-half of a distance 317 between adjacent portions of the patterned third layer 241 for a purpose of filling spaces between the portions of the patterned third layer 241. In some embodiments, the formation of the dielectric layer 28 includes CVD, PVD, or a combination thereof. In some embodiments, the dielectric layer 28 includes one or more dielectric materials. The dielectric materials of the dielectric layer 28 may be selected from oxide or nitride.

Figure 10:
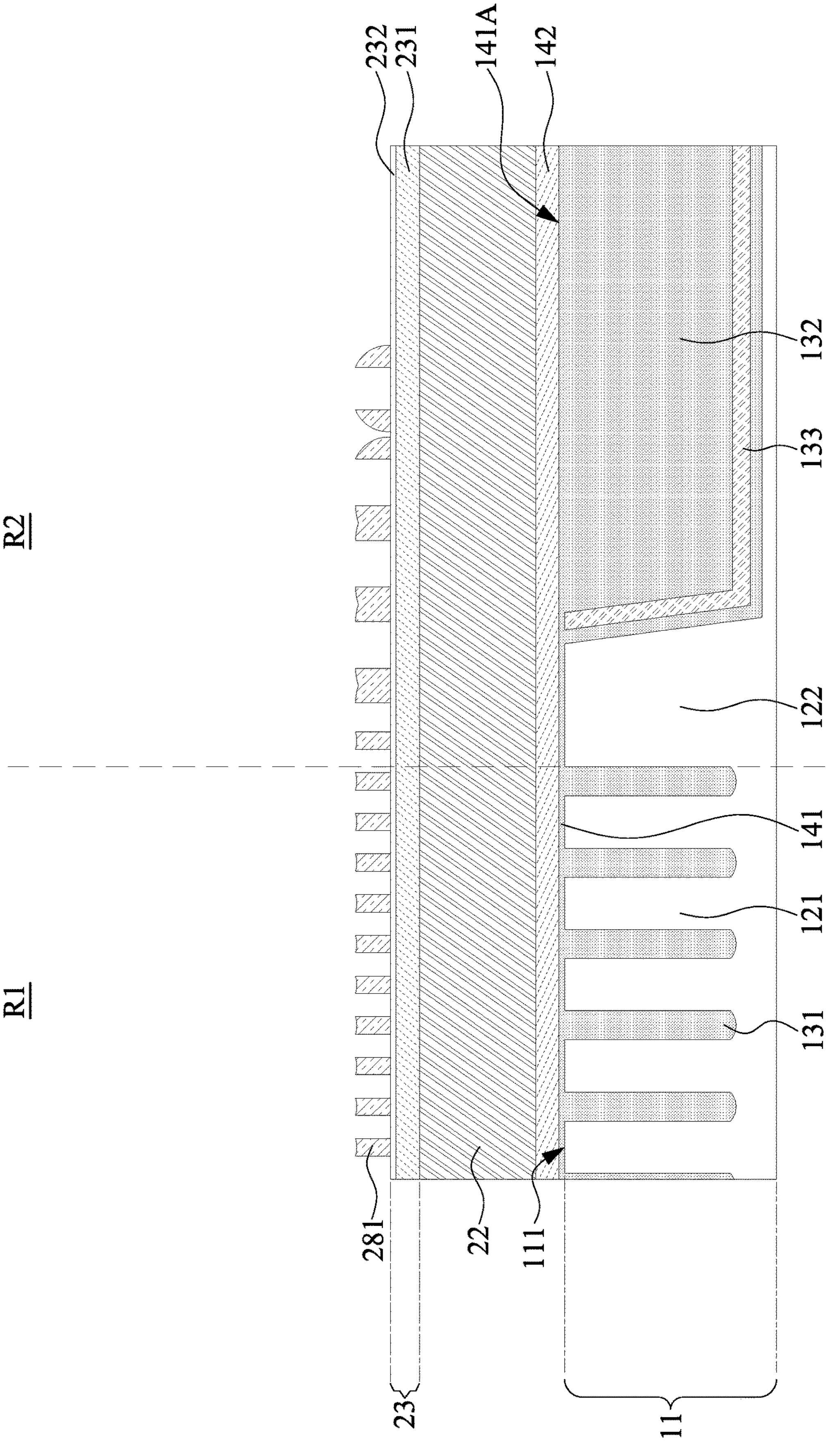

Referring to FIG. 10, a spacer etching operation is performed on the dielectric layer 28 after the formation of the dielectric layer 28. The patterned third layer 241 shown in FIG. 9 may be exposed after the spacer etching, and the patterned third layer 241 can then be removed. A patterned dielectric layer 281 is thereby formed, wherein the patterned dielectric layer 281 has a pattern inverse to the pattern of the patterned third layer 241.

Figure 11:
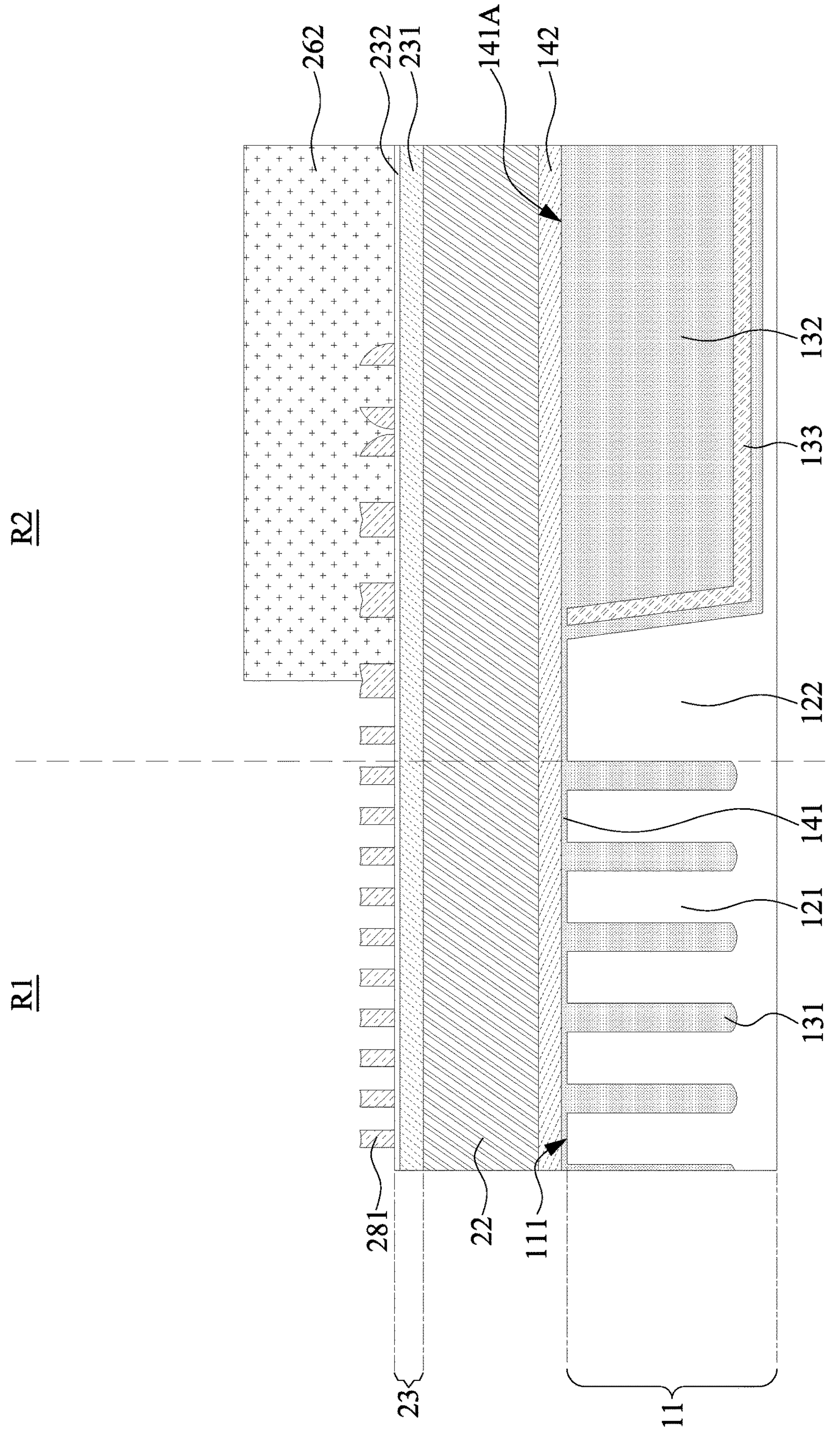

Referring to FIG. 11, a photoresist layer 262 is formed over the patterned dielectric layer 281 in the peripheral region R2. In some embodiments, the photoresist layer 262 fills spaces between portions of the patterned dielectric layer 281 in the peripheral region R2. In some embodiments, the photoresist layer 262 covers an entirety of the peripheral region R2.

Figure 12:
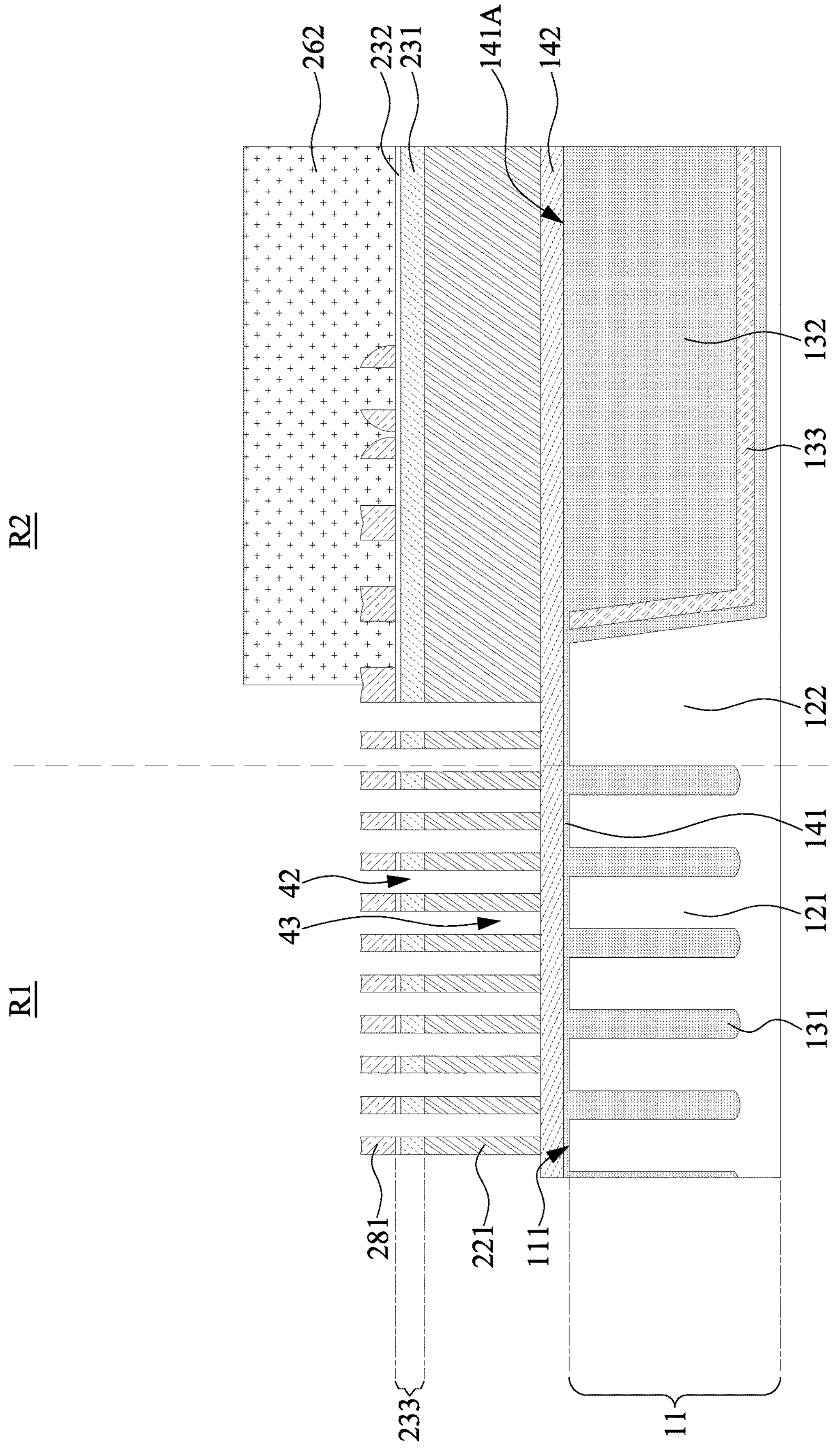

Referring to FIG. 12, an etching operation is performed on the second layer 23 and the first layer 22 in the array region R1 to form a patterned second layer 233 and a patterned first layer 221. A plurality of openings 42 are defined by the patterned second layer 233, and a plurality of openings 43 are defined by the patterned first layer 221. In some embodiments, the etching operation shown in FIG. 12 stops at an exposure of the dielectric layer 14.

The etching operation illustrated in FIG. 12 may include one or more etching steps. In some embodiments, the etching operation includes an etching step having a low selectivity between materials of the second layer 23 and the first layer 22. In some embodiments, the etching step includes a high selectivity to materials of the second layer 23 and the first layer 22. In some embodiments, the etching step includes a low selectivity to a material of the dielectric layer 14. A comprehensive pattern of the patterned dielectric layer 281 in the array region R1 is therefore transferred to the first layer 22 to form the patterned first layer 221.

Figure 13:
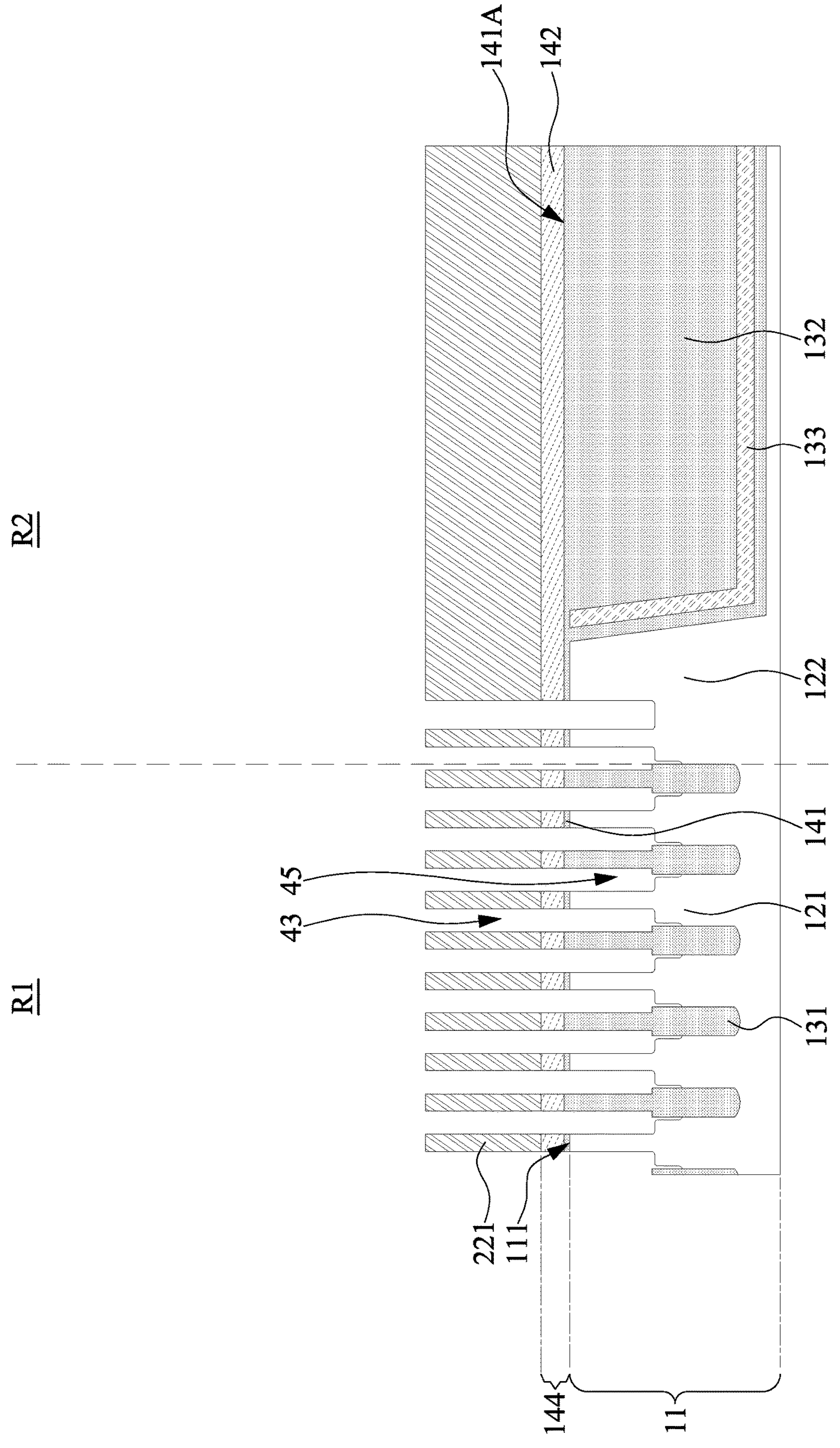

Referring to FIG. 13, after the formation of the openings 43 and the patterned first layer 221, the photoresist layer 262, the patterned dielectric layer 281, and the patterned second layer 233 are removed. A pattern of the patterned first layer 221 is transferred to the substrate 11. In some embodiments, an etching operation is performed to pattern the dielectric layer 14 and the substrate 11. In some embodiments, a plurality of openings 44 and a plurality of trenches 45 are formed by the etching operation shown in FIG. 13. In some embodiments, each of the openings 44 is defined by the dielectric layer 14, and penetrates the dielectric layer 14. Each of the openings 44 is surrounded by the dielectric layer 14, and a patterned dielectric layer 144 is thereby formed.

In some embodiments, the trenches 45 are defined by the silicon portions 121 of the substrate 11 and the dielectric portions 131 adjacent to the silicon portions 121 in the array region R1. In some embodiments, the trenches 45 are formed by a dry etching operation. In some embodiments, the dry etching operation has a low selectivity between a material of the silicon portions 121 and a material of the dielectric portions 131. In some embodiments, the etching operation illustrated in FIG. 13 includes one or more etching steps. In some embodiments, the etching operation of FIG. 13 includes a first etching step targeting the dielectric materials of the dielectric layer 14 and the dielectric portions 131, and a second etching step targeting the material of the silicon portions 121. In some embodiments, the first etching step includes a high selectivity to the materials of the dielectric layer 14 and the materials of the dielectric portions 131. In some embodiments, the second etching step includes a high selectivity to the materials of the silicon portions 121. The trenches 45 may define positions and configurations of the WL structures. In some embodiments, depths of the trenches 45 are controlled for a purpose of the formation of the WL structures.

Figure 14:
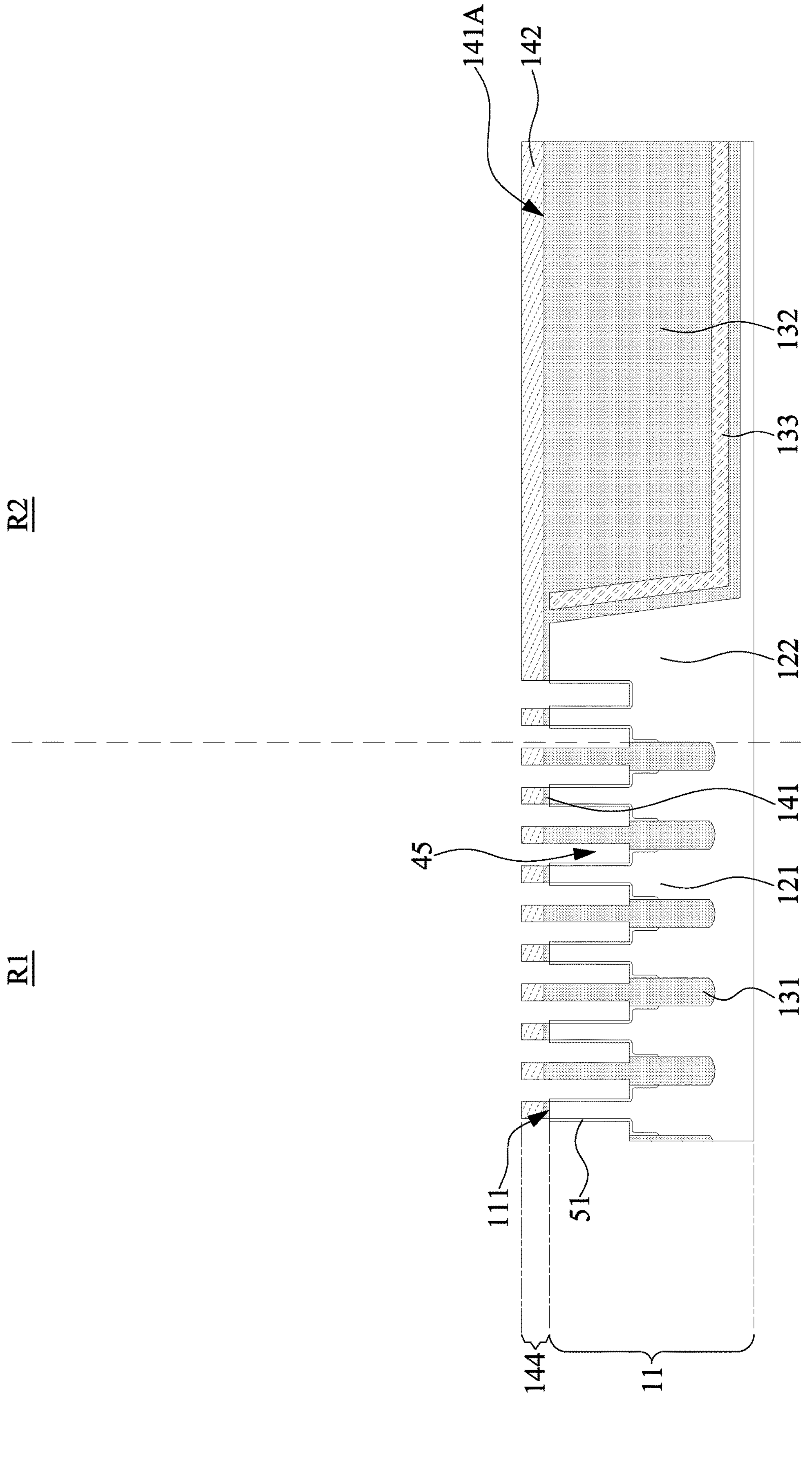

Referring to FIG. 14, after the etching operation shown in FIG. 13, the patterned first layer 221 is removed, e.g., by another etching operation, and a dielectric layer 51 is then formed on exposed sidewalls of the silicon portions 121. In some embodiments, the dielectric layer 51 lines the exposed sidewalls of the silicon portions 121 in the trenches 45. In some embodiments, the dielectric layer 51 contacts the silicon portions 121. In some embodiments, the dielectric layer 51 is formed by a thermal oxidation. In some embodiments, the dielectric layer 51 includes silicon oxide. In some embodiments, the dielectric layer 51 contacts an edge of the dielectric sublayer 141 shown in FIG. 14. In some embodiments, materials of the dielectric layer 51 and the dielectric sublayer 141 are the same.

FIGS. 15 to 20 are schematic cross-sectional diagrams at different stages of the formation of the WL structures 50 during the operation S23 of the method S2 or prior to the operation S13 of the method S1.

Figure 15:
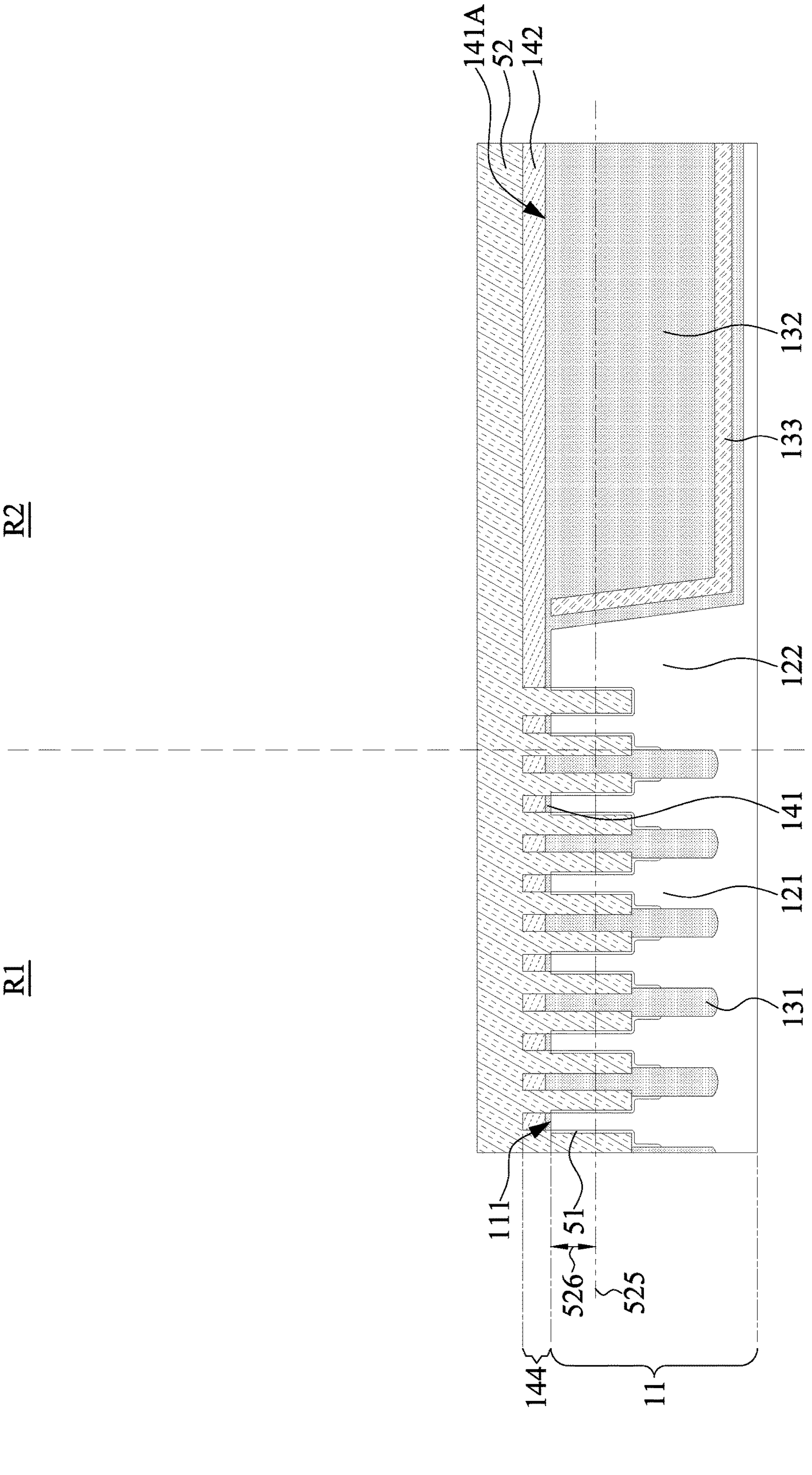

Referring to FIG. 15, after the formation of the dielectric layer 51, a conductive material 52 is formed over the substrate 11 and the patterned dielectric layer 144. The conductive material 52 may fill the openings 44 and the trenches 45. In some embodiments, the conductive material 52 fills an entirety of the trenches 45. In some embodiments, the conductive material 52 is formed by a deposition. In some embodiments, the conductive material 52 includes aluminum (Al), copper (Cu), tungsten (W), titanium (Ti), tantalum (Ta), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), titanium nitride (TiN), tungsten nitride (WN), tantalum nitride (TaN), ruthenium (Ru), titanium silicon nitride (TiSiN), other suitable materials, or a combination thereof. In some embodiments, the conductive material 52 is W, TiN, or a combination thereof.

Figure 16:
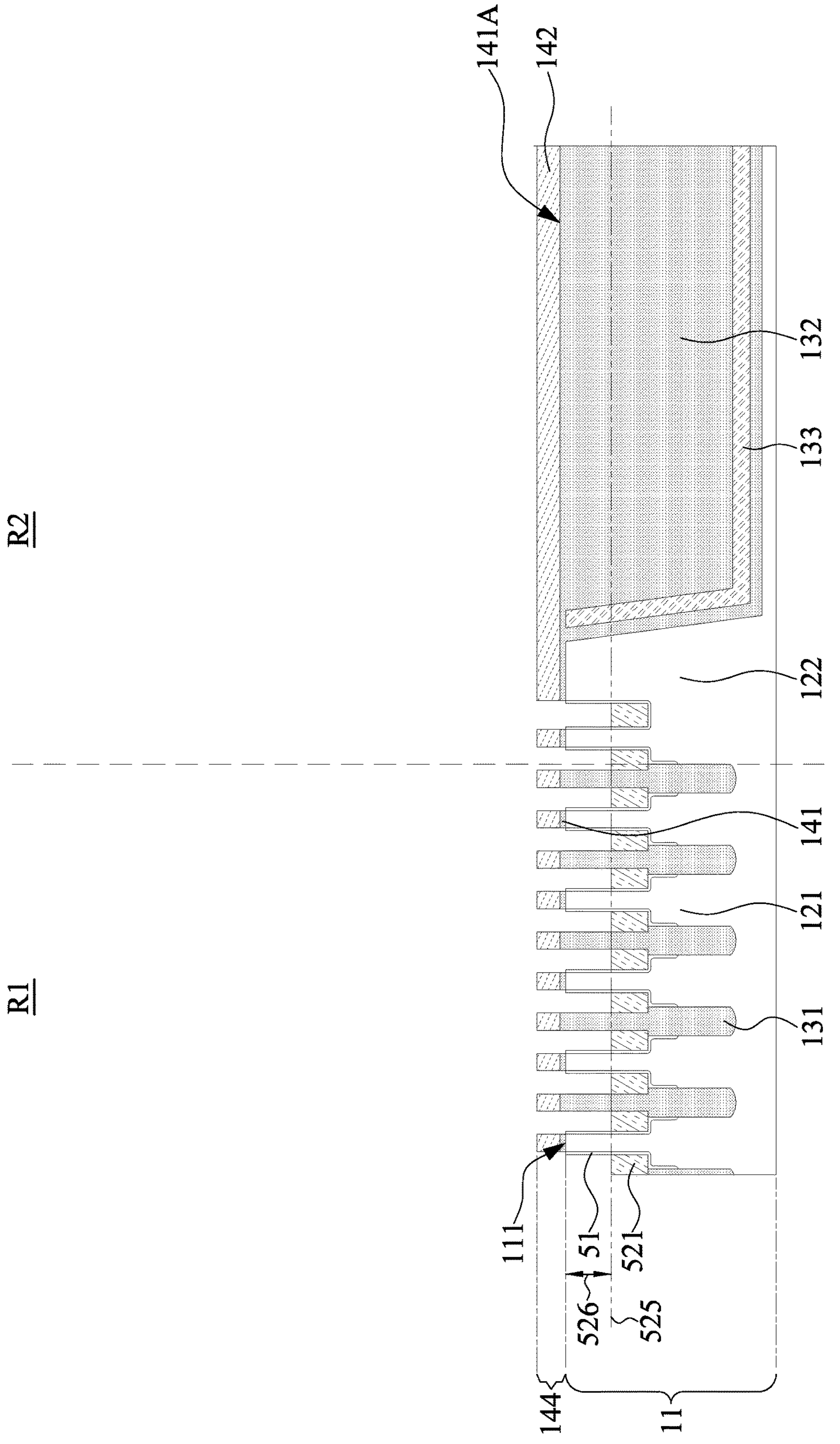

Referring to FIG. 16, after the formation of the conductive material 52, the method S1 or the method S2 may further include removing an upper portion of the conductive material 52. In some embodiments, a plurality of first contact layers 521 are formed in the trenches 45 respectively.

Referring back to FIG. 15, a dashed line labeled 525 indicates a designed top surface of the first contact layers 521 shown in FIG. 16. For a purpose of electrical connection, the designed top surface 525 should be lower than the top surface 111 of the substrate 11. In other words, a distance 526 from the top surface 111 of the substrate 11 to the designed top surface 525 should be greater than zero. However, a range of the distance 526 can be adjusted according to different applications, and is not limited herein. In addition, it should be noted that the figures are for a purpose of illustration, and tops of different first contact layers 521 can be at roughly a same elevation.

Figure 17:
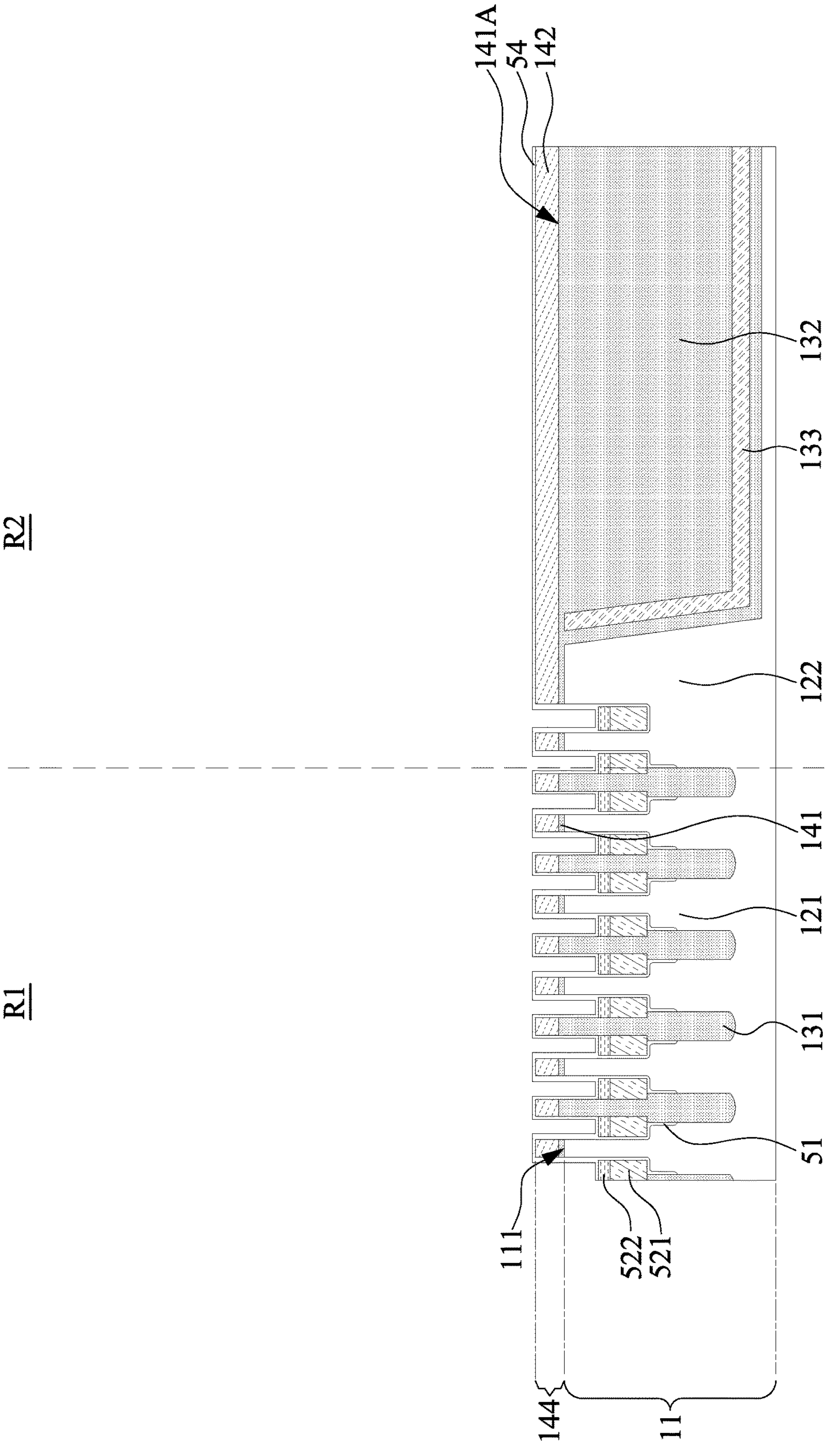

Referring to FIG. 17, a plurality of second contact layers 522 are formed in the trenches 45 over the plurality of first contact layers 521 respectively. The formation of the second contact layers 522 can be similar to the formation of the first contact layers 521, and repeated description is omitted herein. In some embodiments, the second contact layers 522 can include semiconductive materials, e.g., polysilicon.

After the formation of the second contact layers 522, a barrier layer 54 may be formed over the substrate 11. The barrier layer 54 is for a purpose of prevention of gate oxide loss during processing. In some embodiments, the barrier layer 54 includes oxide, e.g., silicon oxide. In some embodiments, the barrier layer 54 is formed by deposition. In some embodiments, a conformal deposition is performed to form the barrier layer 54. In some embodiments, the barrier layer 54 is formed by CVD, atomic layer deposition (ALD), PECVD, plasma-enhanced atomic layer deposition (PEALD) or a combination thereof. In some embodiments, a thickness of the barrier layer 54 is in a range of 3 to 5 nm. It should be noted that materials of the barrier layer 54 and the dielectric layer 51 can be identical, and an interface between the barrier layer 54 and the dielectric layer 51 may not be observed.

Figure 18:
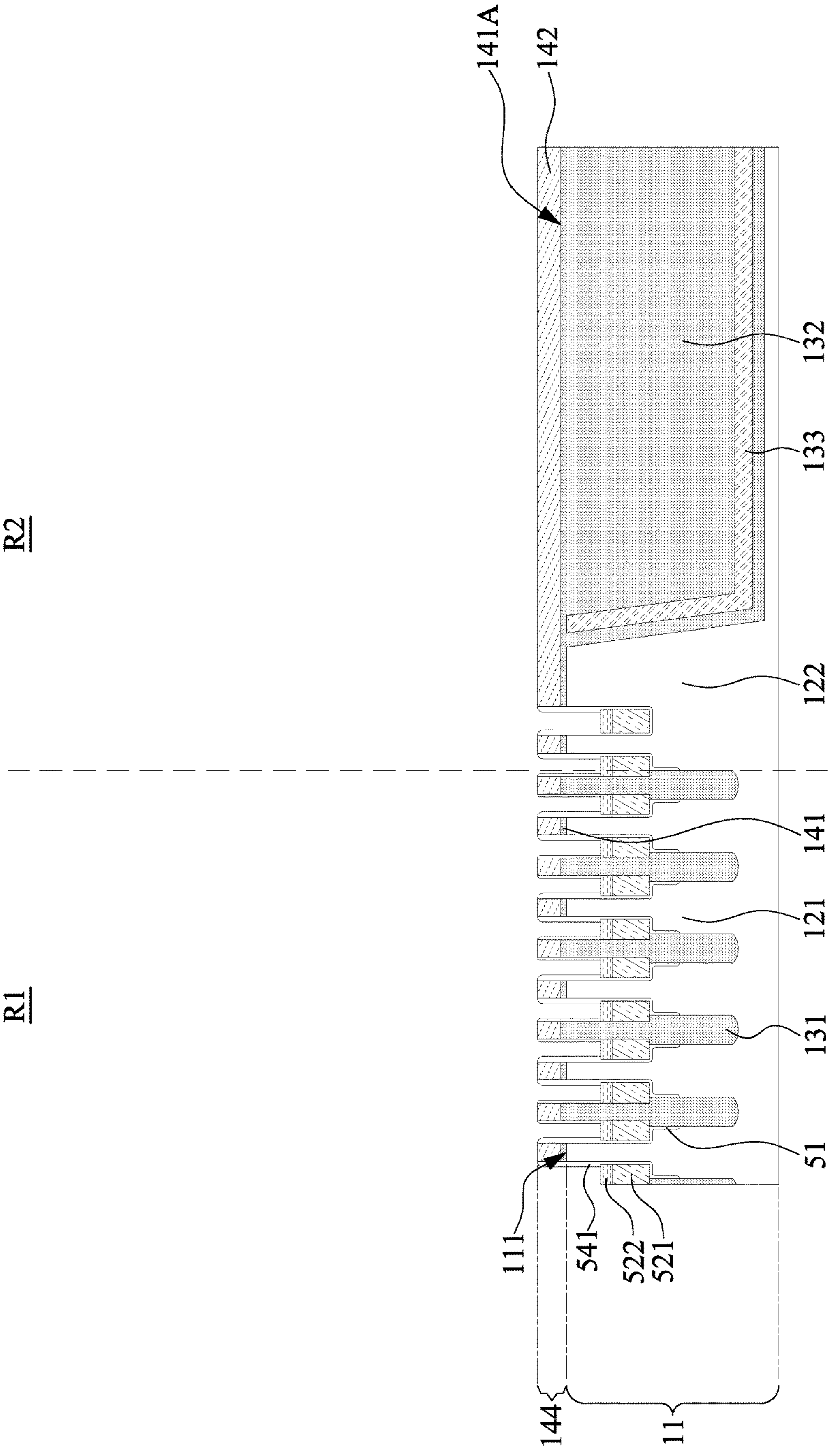

Referring to FIG. 18, an etch back operation is optionally performed on the barrier layer 54 to form a spacer layer 541.

In some embodiments, horizontal portions of the barrier layer 54 shown in FIG. 17 are removed. In some embodiments, top surfaces of the patterned dielectric layer 144 are exposed. In some embodiments, top surfaces of the second contact layers 522 are exposed.

Figure 19:
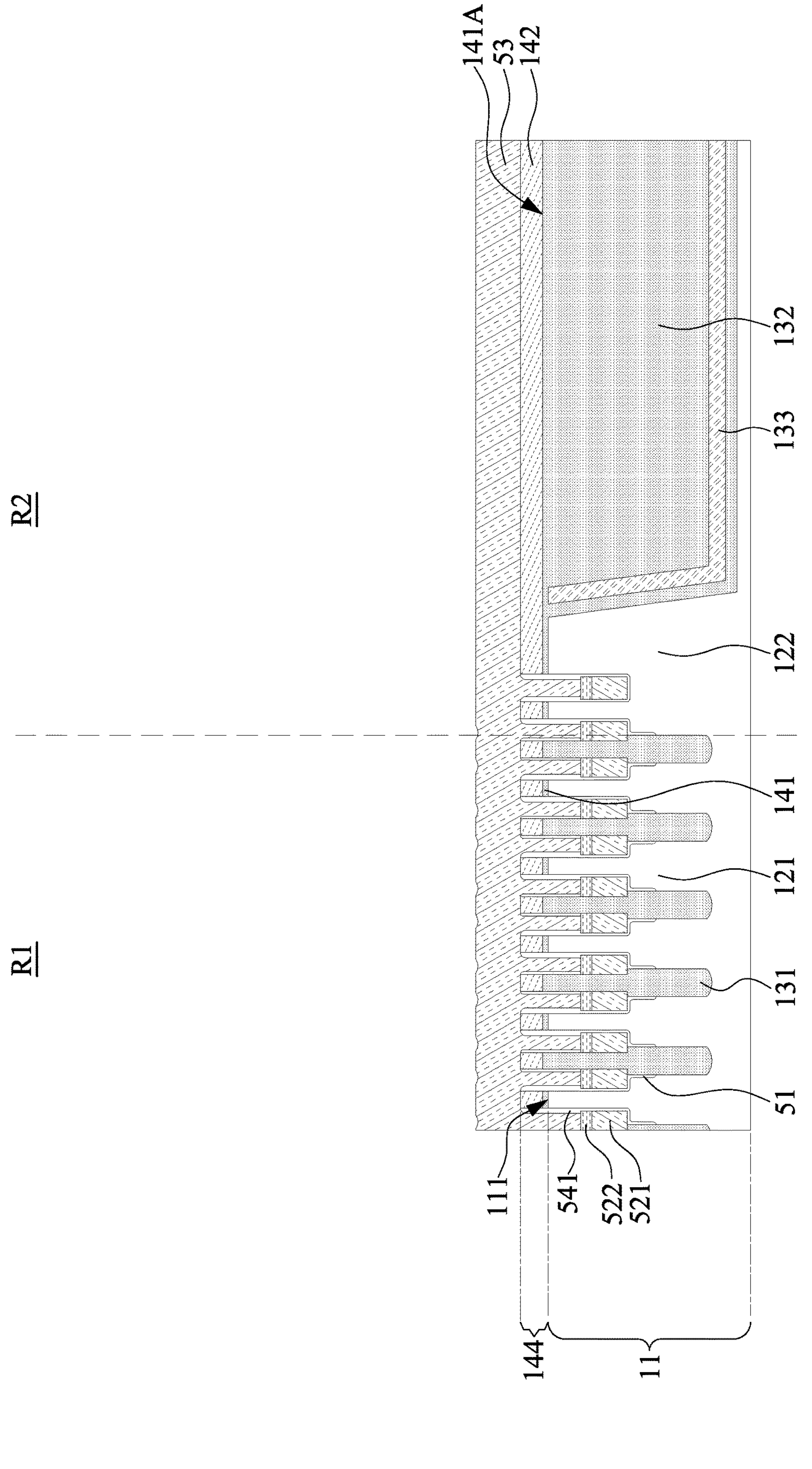

Referring to FIG. 19, a dielectric layer 53 is formed over the substrate 11 and covers the second contact layers 522. In some embodiments, the dielectric layer 53 includes nitride (e.g., silicon nitride). In some embodiments, the dielectric layer 53 fills the trenches 45 above the first contact layers 522. In some embodiments, the dielectric layer 53 covers the patterned dielectric layer 14. In some embodiments, the dielectric layer 53 is formed in the array region R1 and the peripheral region R2. In some embodiments, the dielectric layer 53 covers an entirety of the substrate 11. In some embodiments, the dielectric layer 53 covers an entirety of the patterned dielectric layer 14.

Figure 20:
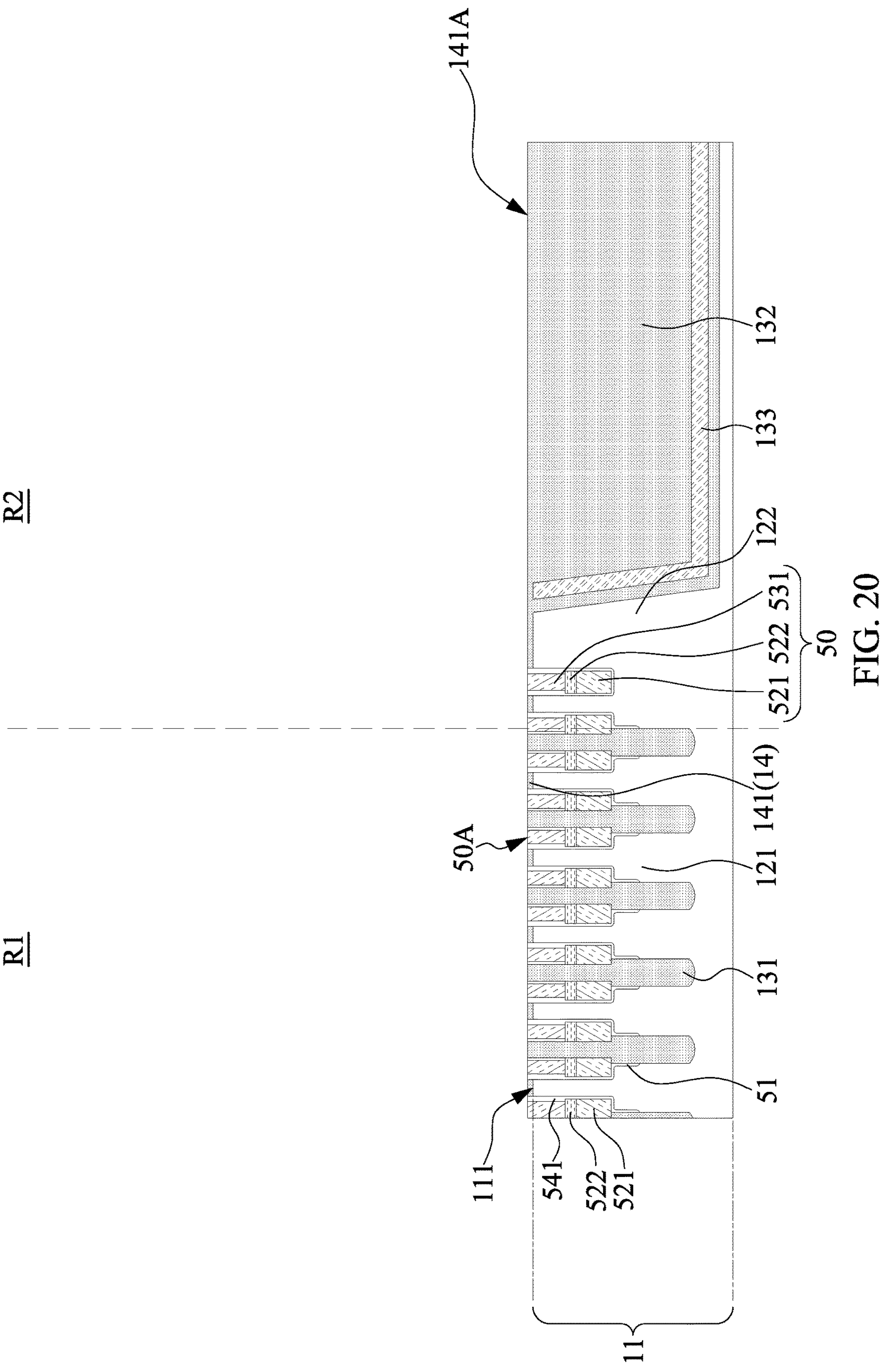

Referring to FIG. 20, a planarization is performed on the dielectric layer 53, and a plurality of dielectric portions 531 are formed in the trenches 45 respectively. The planarization may stop on the dielectric sublayer 141. It should be noted that the dielectric layer 14 shown in the previous figures can be a single layer, and the planarization may be stopped when a thickness of the dielectric layer 14 is reduced to about 5 nm. In other words, the dielectric layer 14 having a thickness about 5 nm is left remaining on the substrate 11 after the planarization. In some embodiments, the remaining dielectric layer 14 covers an entirety of the substrate 11. The planarization may include one or more suitable operations, such as chemical mechanical polishing (CMP), a dry etching operation, or a wet etching operation. In some embodiments, top surfaces of the dielectric portions 531 are substantially aligned with the top surface 141A of the dielectric sublayer 141 (or a top surface of the remaining dielectric layer 14). In some embodiments, the top surfaces of the dielectric portions 531 are substantially coplanar with the top surface 141A of the dielectric sublayer 141 (or the top surface of the remaining dielectric layer 14). A plurality of WL structures 50 are thereby formed in the trenches 45. In some embodiments, each of the WL structures 50 includes the first contact layer 521, the second contact layer 522 and the dielectric portion 531. In some embodiments, the WL structures 50 are disposed on two opposite sides of one or more of the silicon portions 121.

It should be noted that the top surfaces of the dielectric portions 531 define top surfaces 50A of the WL structures 20. Therefore, in some embodiments, the top surfaces 50A of the WL contacts 50 are substantially aligned with the top surface 141A of the dielectric sublayer 141 (or the top surface of the remaining dielectric layer 14). In some embodiments, the top surfaces 50A of the WL contacts 50 are substantially coplanar with the top surface 141A of the dielectric sublayer 141 (or the top surface of the remaining dielectric layer 14).

Figure 21:
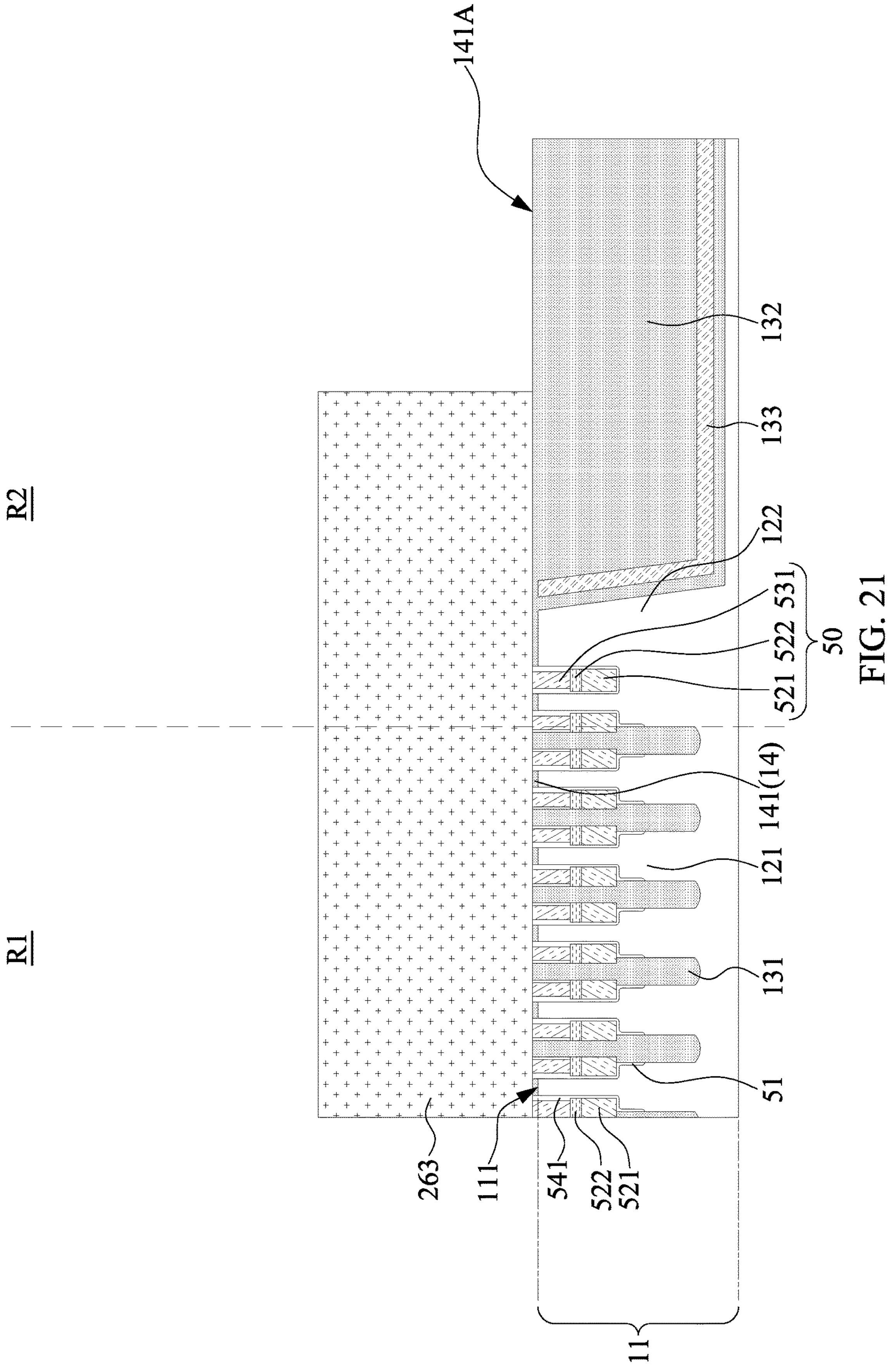

Referring to FIG. 21, prior to formation of a polysilicon layer in the operation S13 of the method S1 or the operation S24 of the method S2, a photoresist layer 263 is formed over the substrate 11 and covers all of the substrate 11 in the array region R1. In some embodiments, for a purpose of ensuring that all of the WL structures 50 in the array region R1 are covered by the photoresist layer 263, the photoresist layer 263 may further cover a portion of the peripheral region R2 proximal to the array region R1. In some embodiments, a boundary of the photoresist layer 263 is disposed in the peripheral region R2 over the dielectric portion 132 proximal to the array region R1.

Figure 22:
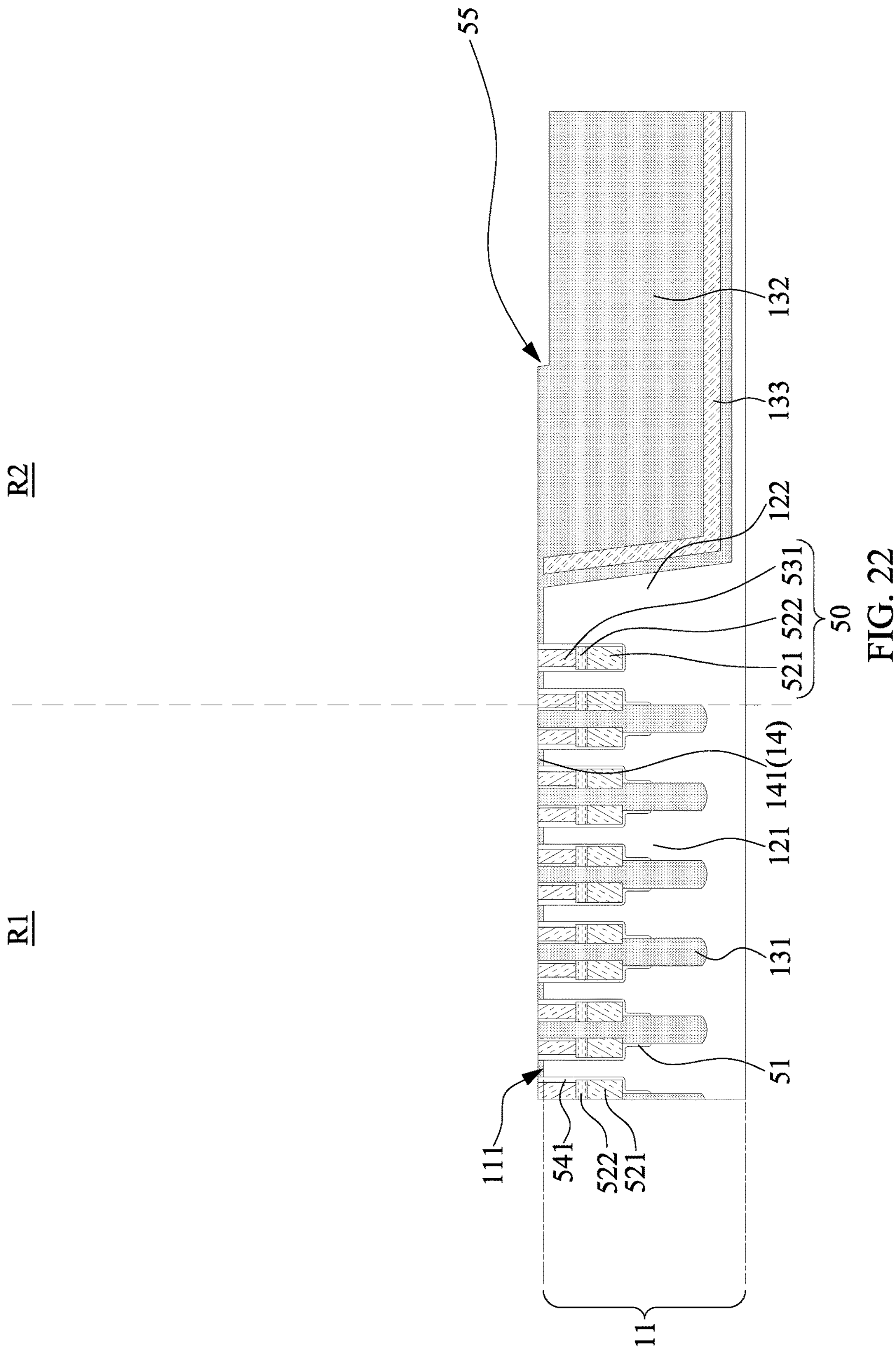

Referring to FIG. 22, after the formation of the photoresist layer 263, an etching operation is performed on exposed portions of the dielectric sublayer 141. The dielectric layer sublayer 141 in at least a portion of the peripheral region R2 is removed. In some embodiments, a step 55 is formed at a top surface of the dielectric portion 132. In some embodiments, the step 55 has a height approximately equal to the thickness of the dielectric sublayer 141. In some embodiments, the height of the step 55 is about 5 nm. The purpose of the removal of the dielectric sublayer 141 in the peripheral region R2 is for the formation of the peripheral circuits or devices in the silicon portions 123 shown in FIG. 3. In some embodiments, the etching operation illustrated in FIG. 22 is performed to expose the silicon portions 123 (shown in FIG. 3) in the peripheral region R2. The photoresist layer 263 can be removed after the etching operation or the formation of the peripheral devices.

Figure 23:
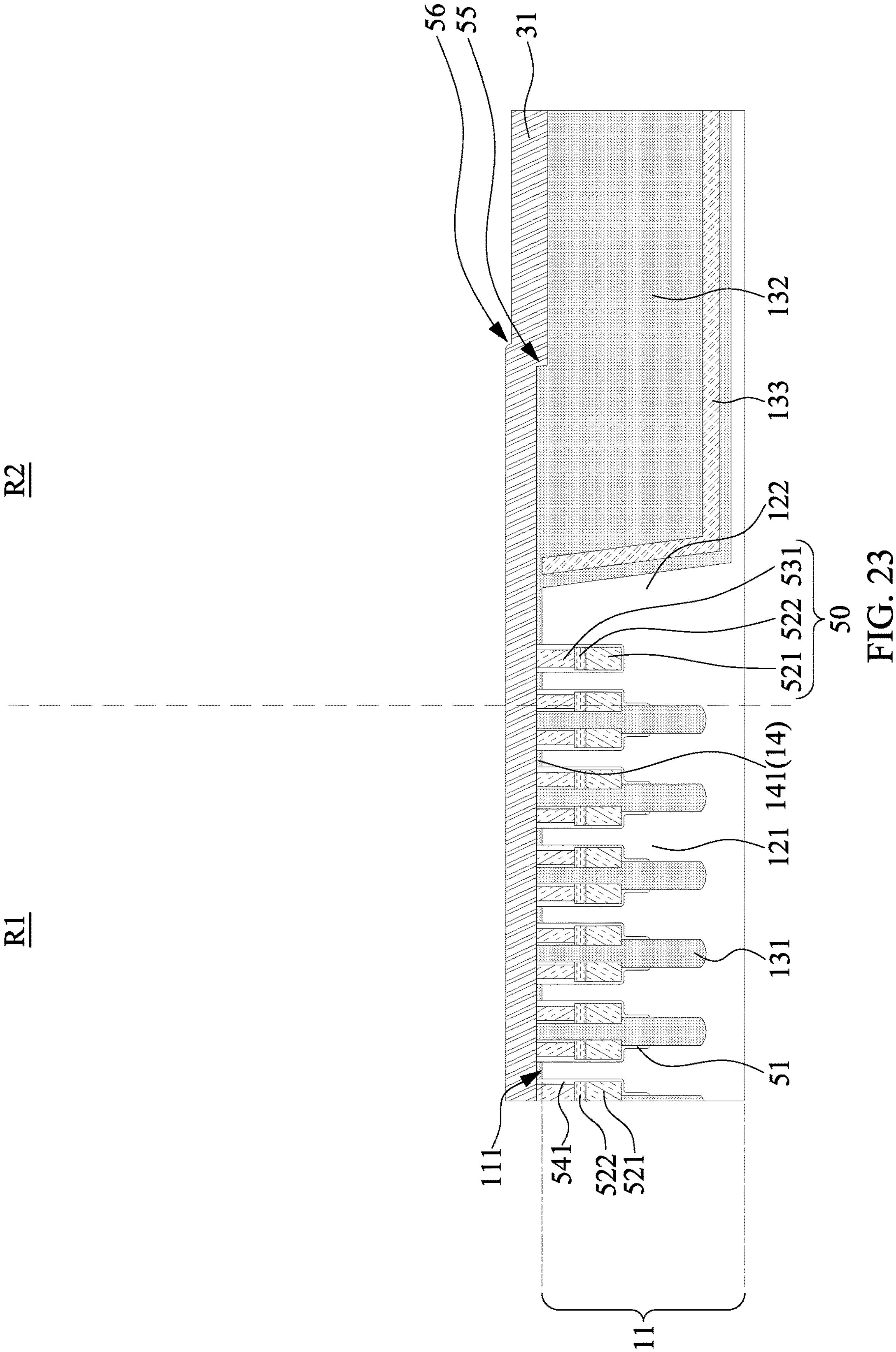

Referring to FIG. 23, proceeding to the operation S13 of the method S1 or the operation S24 of the method S2, a polysilicon layer 31 is formed over the substrate 11. In some embodiments, the polysilicon layer 31 is formed in the array region R1 and the peripheral region R2. In some embodiments, the polysilicon layer 31 covers an entirety of the substrate 11. In some embodiments, the polysilicon layer 31 has a configuration conformal to remaining portions of the dielectric sublayer 141 and the substrate 11. In some embodiments, the polysilicon layer 31 has a step 56 corresponding to the step 55 shown in FIG. 22. In some embodiments, the polysilicon layer 31 is an undoped polysilicon layer 31, which means the polysilicon layer 31 does not include P-type or N-type dopants. In some embodiments, the polysilicon layer 31 has a neutral conductivity. In some embodiments, a thickness of the polysilicon layer 31 is in a range of 20 to 50 nm.

Figure 24:
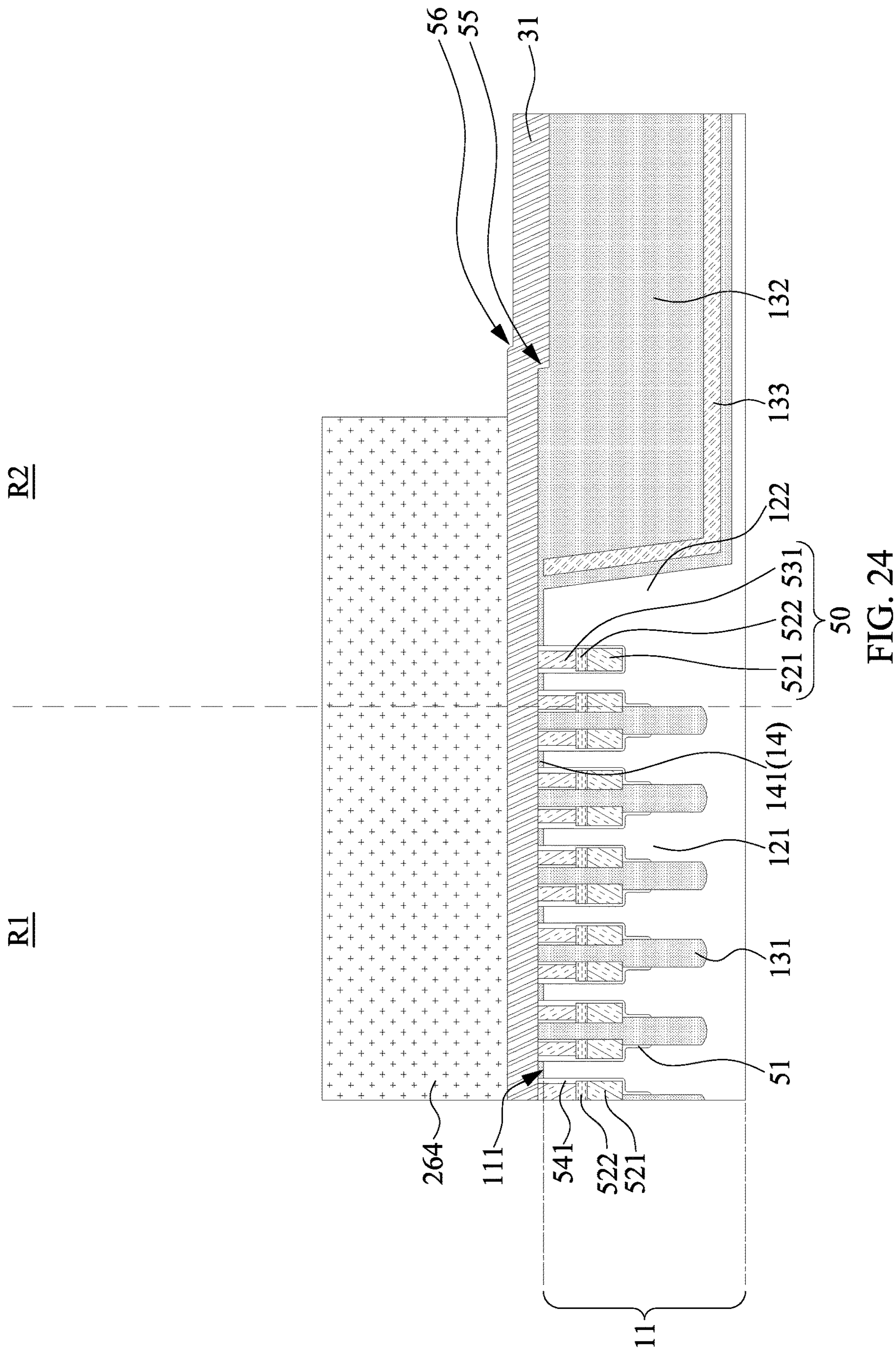

Referring to FIG. 24, after the formation of the polysilicon layer 31, a photoresist layer 264 is formed covering the substrate 11 in the array region R1 and optionally a portion of the substrate 11 in the peripheral region R2 proximal to the array region R1. In some embodiments, a boundary of the photoresist layer 264 is disposed in the peripheral region R2 over the dielectric portion 132 proximal to the array region R1. The photoresist layer 264 may cover or expose the step 56 of the polysilicon layer 31. In some embodiments as shown in FIG. 24, the step 56 of the polysilicon layer 31 is exposed through the photoresist layer 264.

Figure 25:
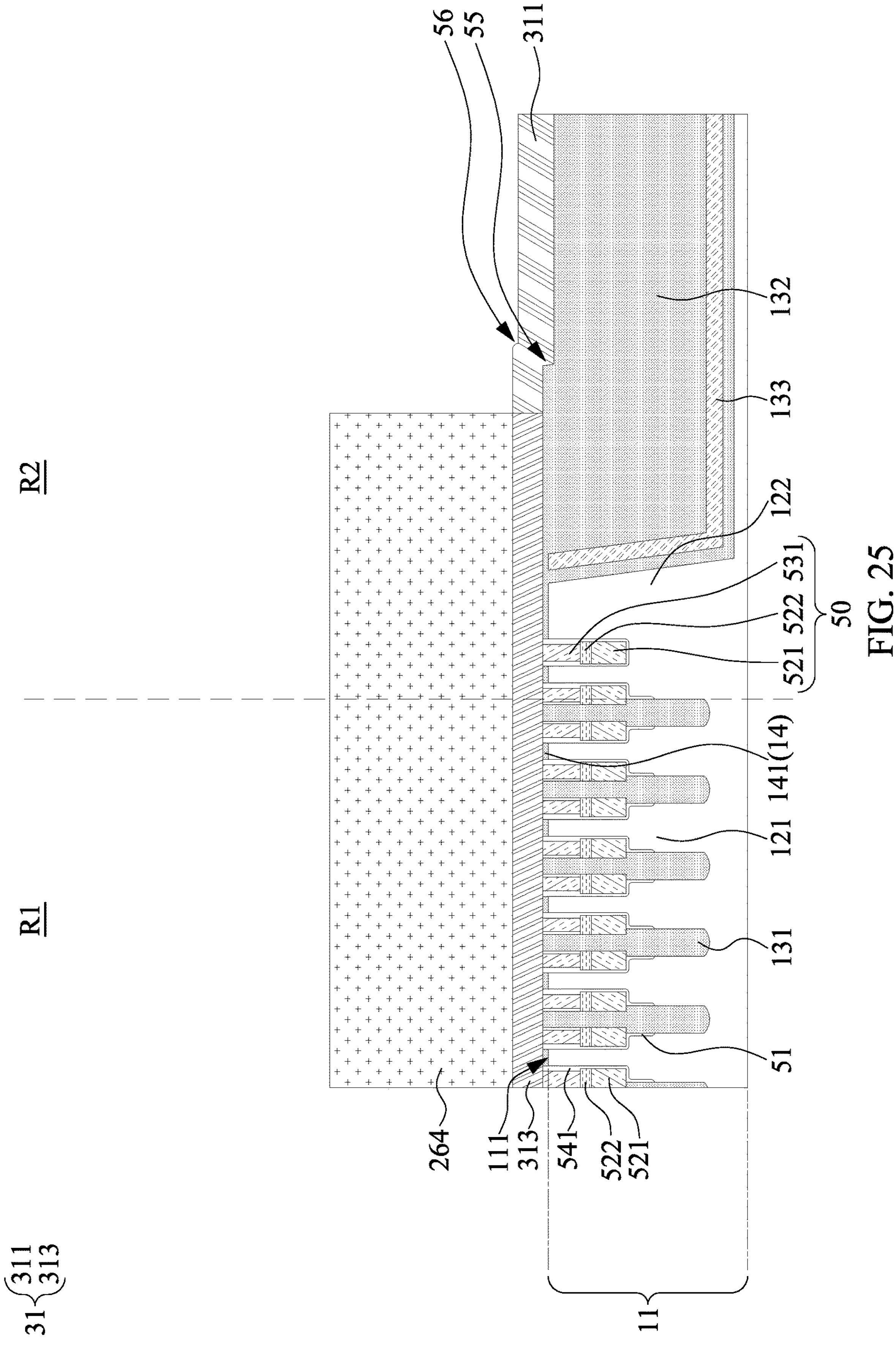

Referring to FIG. 25, a doping operation is performed on a portion of the polysilicon layer 31 exposed through the photoresist layer 264. Dopants with a first conductivity type (e.g., N-type) are introduced to the portion of the polysilicon layer 31 exposed through the photoresist layer 264. As a result, the polysilicon layer 31 at this stage includes an undoped portion 313 and a doped portion 311. In some embodiments, the undoped portion 313 is covered by the photoresist layer 264, and the doped portion 311 is exposed through the photoresist layer 264. An annealing operation may be performed after the doping operation for activation. In some embodiments, a boundary between the undoped portion 313 and the doped portion 311 may not be aligned with the boundary of the photoresist layer 264 due to diffusion of dopants during annealing. In some embodiments, the doped portion 311 can extend below the photoresist layer 264 after the annealing operation. In alternative embodiments, the boundary between the undoped portion 313 and the doped portion 311 is aligned with the boundary of the photoresist layer 264. The photoresist layer 264 is removed after the doping operation.

Figure 26:
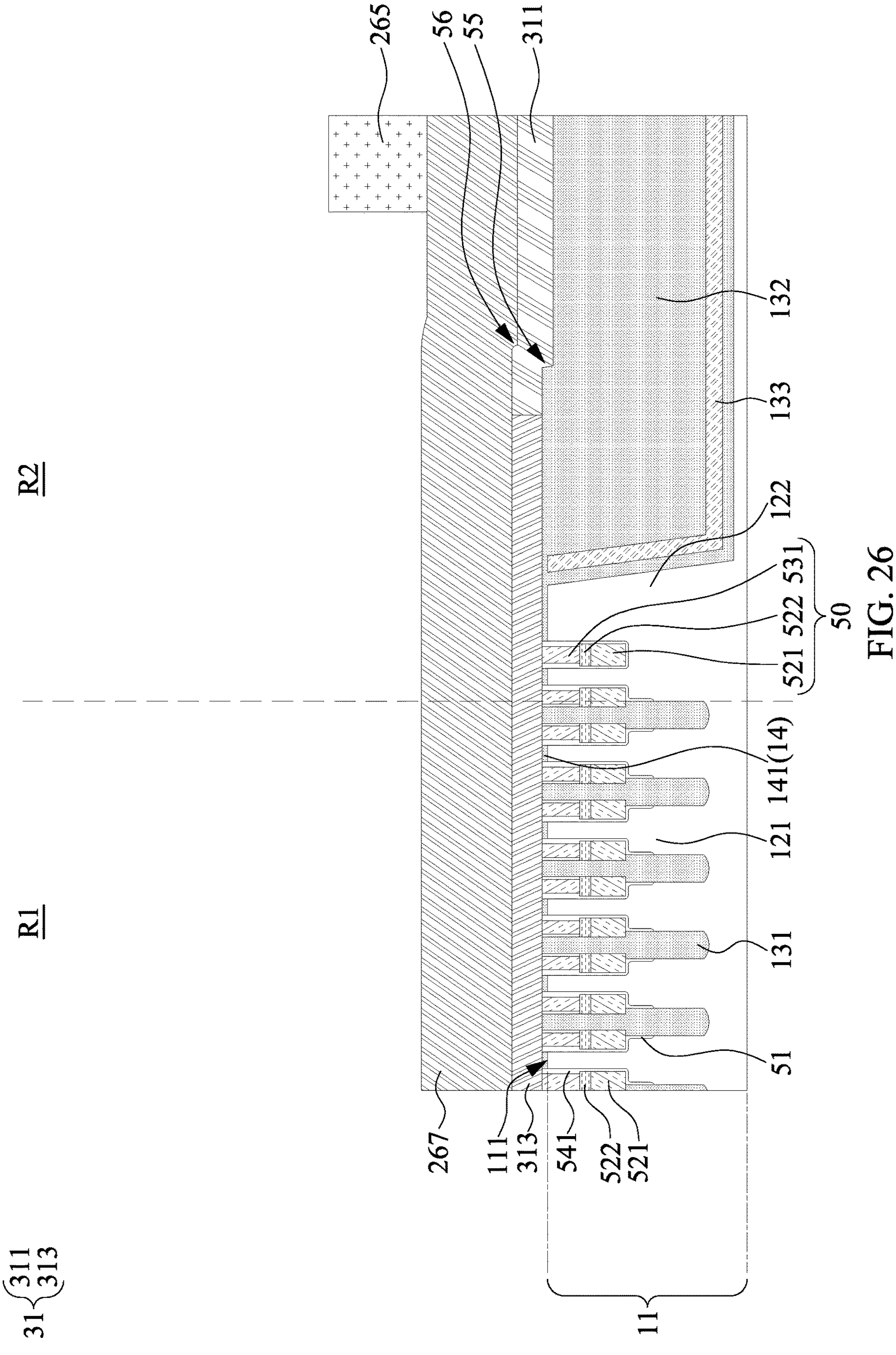

Referring to FIG. 26, a mask layer 267 and a photoresist layer 265 are formed over the polysilicon layer 31. In some embodiments, the photoresist layer 265 covers at least the silicon portion(s) 123 (not shown in FIG. 26, please refer to FIG. 3) in the peripheral region R2. The mask layer 267 can include suitable materials, such as oxide, nitride, oxynitride, carbon, or a combination thereof. For a purpose of ensuring that an entirety of the undoped portion 313 of the polysilicon layer 31 is exposed, the photoresist layer 265 covers only a portion of the doped portion 311 in the peripheral region R2. In some embodiments, a portion of the dielectric portion 132 proximal to the array region R1 is exposed through the photoresist layer 265. In some embodiments, a boundary of the photoresist layer 265 is within an area of coverage of the doped portion 311 of the polysilicon layer 31. In some embodiments, the boundary of the photoresist layer 265 is farther away from the array region R1 than the step 55.

Figure 27:
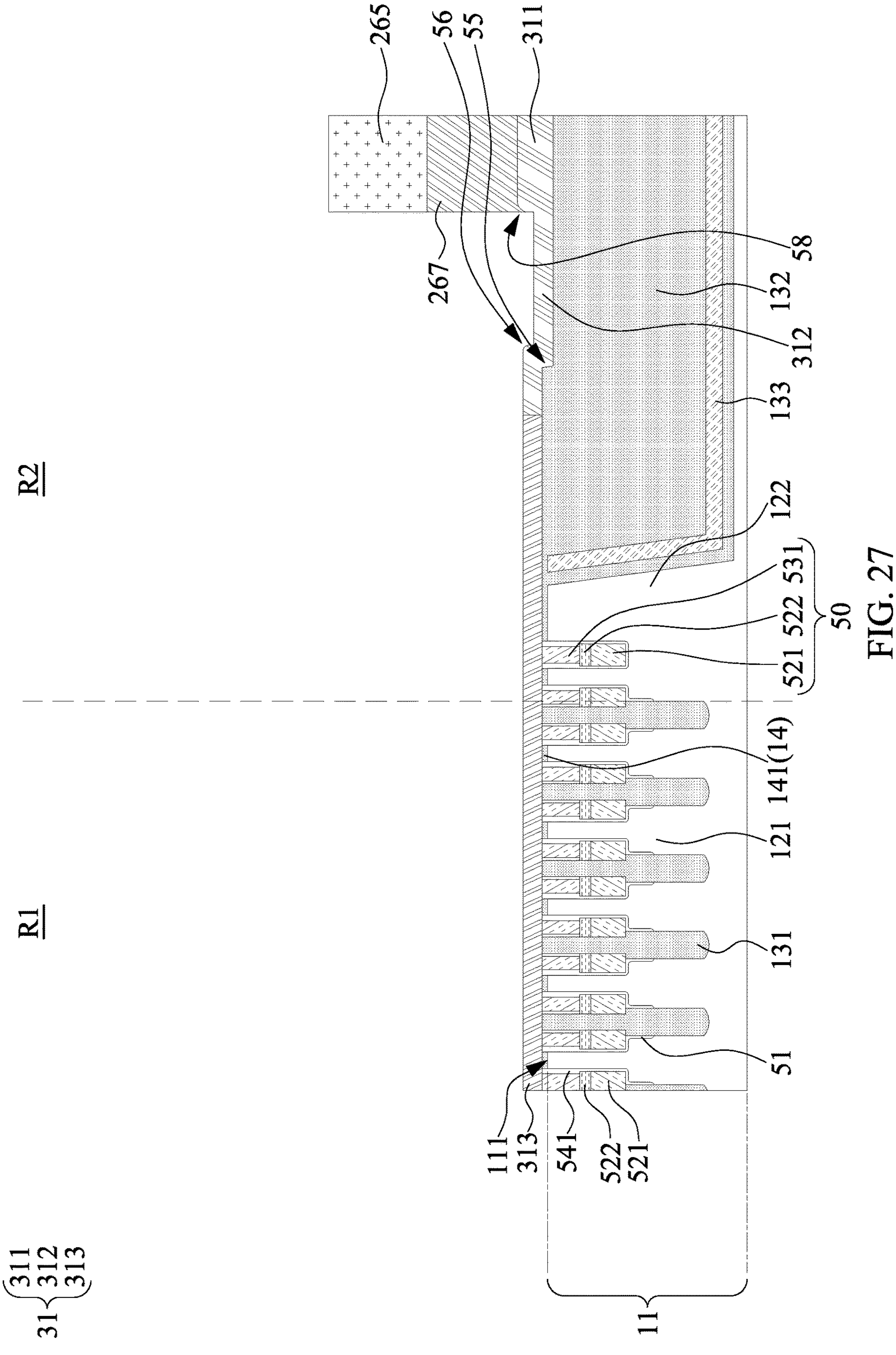

Referring to FIG. 27, an etching operation is performed to remove portions of the mask layer 267 exposed through the photoresist layer 265, and a thickness of a portion of the polysilicon layer 31 exposed through the photoresist layer 265 is reduced. A patterned mask layer 268 is thereby formed. In some embodiments, the thickness of the exposed portion of the polysilicon layer 31 is reduced to about half the thickness of the polysilicon layer 31 originally formed in FIG. 23. In some embodiments, a thickness of the undoped portion 313 is reduced to about 10 to 20 nm. In some embodiments, a thickness of a portion of the doped portion 311 exposed through the photoresist layer 265 is also reduced to about 10 to 20 nm. In some embodiments, a thickness of the photoresist layer 265 is reduced by the etching operation.

For a purpose of illustration, the portion of the doped portion 311 having a reduced thickness is relabeled as the doped portion 312, and the doped portion 311 refers to the remainder of the doped portion 311 having the original thickness. As shown in FIG. 27, a step 57 is formed corresponding to the step 56 shown in FIG. 26 as a result of the etching operation. In addition to the step 57, the polysilicon layer 31 further includes a step 58 at a boundary between the doped portion 311 and the doped portion 312. In some embodiments, the step 58 has a sidewall substantially aligned with the boundary of the photoresist layer 265 or the patterned mask layer 268. In some embodiments, a height of the step 57 is substantially less than a height of the step 58. In some embodiments, the height of the step 55 is substantially less than a height of the step 58. In some embodiments, a thickness of the doped portion 311 at this stage is substantially same as the thickness of the polysilicon layer 31 at the stage illustrated in FIG. 23.

Figure 28:
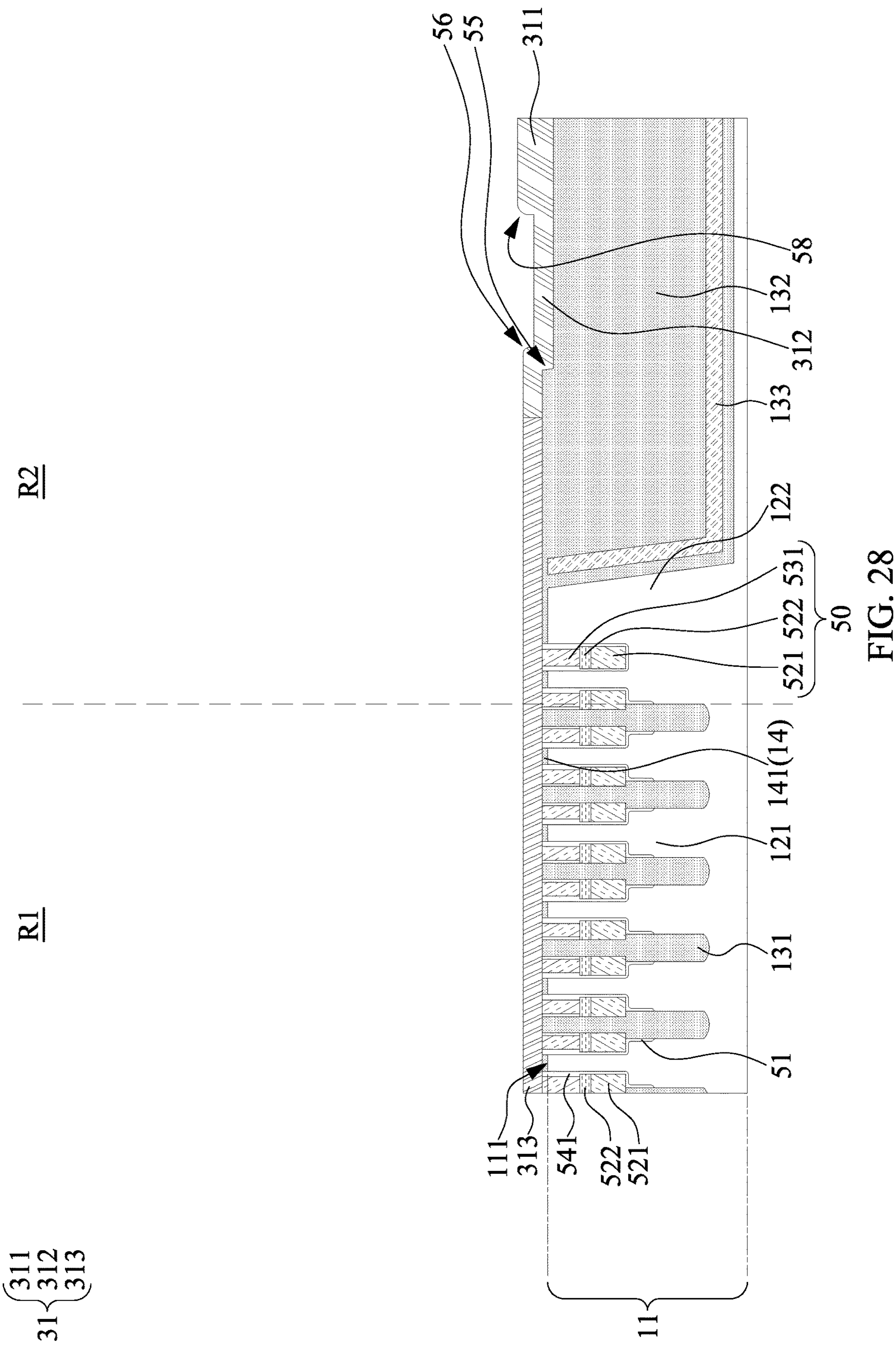

Referring to FIG. 28, the photoresist layer 265 and the patterned mask layer 268 are removed. The doped portion 311 in the peripheral region R2 is thereby exposed.

Figure 29:
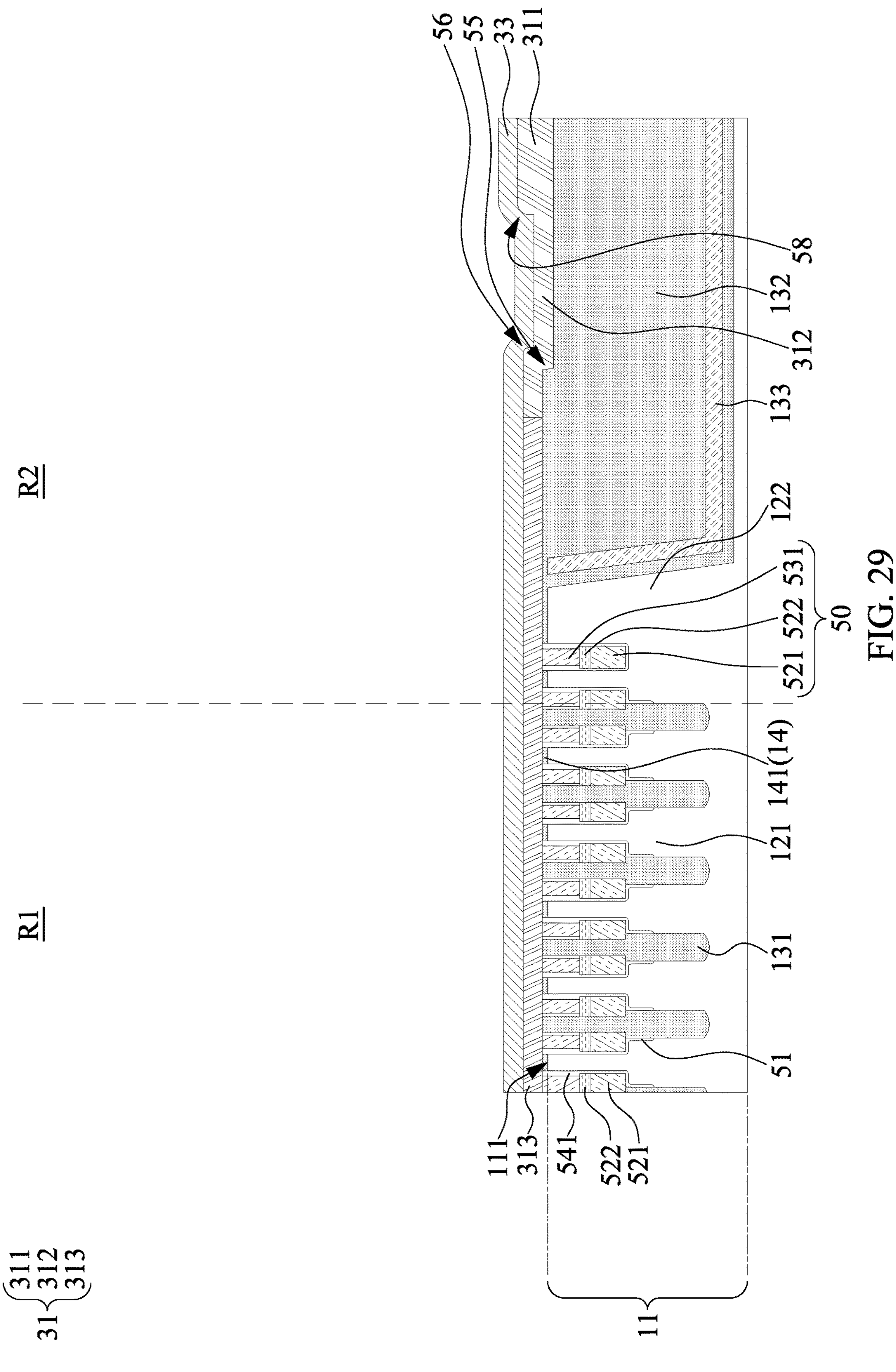

Referring to FIG. 29, a cap layer 33 is formed over the polysilicon layer 31. In some embodiments, a thickness of the cap layer 33 is in a range of 20 to 50 nm. In some embodiments, the cap layer 33 is formed for a purpose of protection of the polysilicon layer 31 during formation of BL contacts 351 in the subsequent processing.

Figure 30:
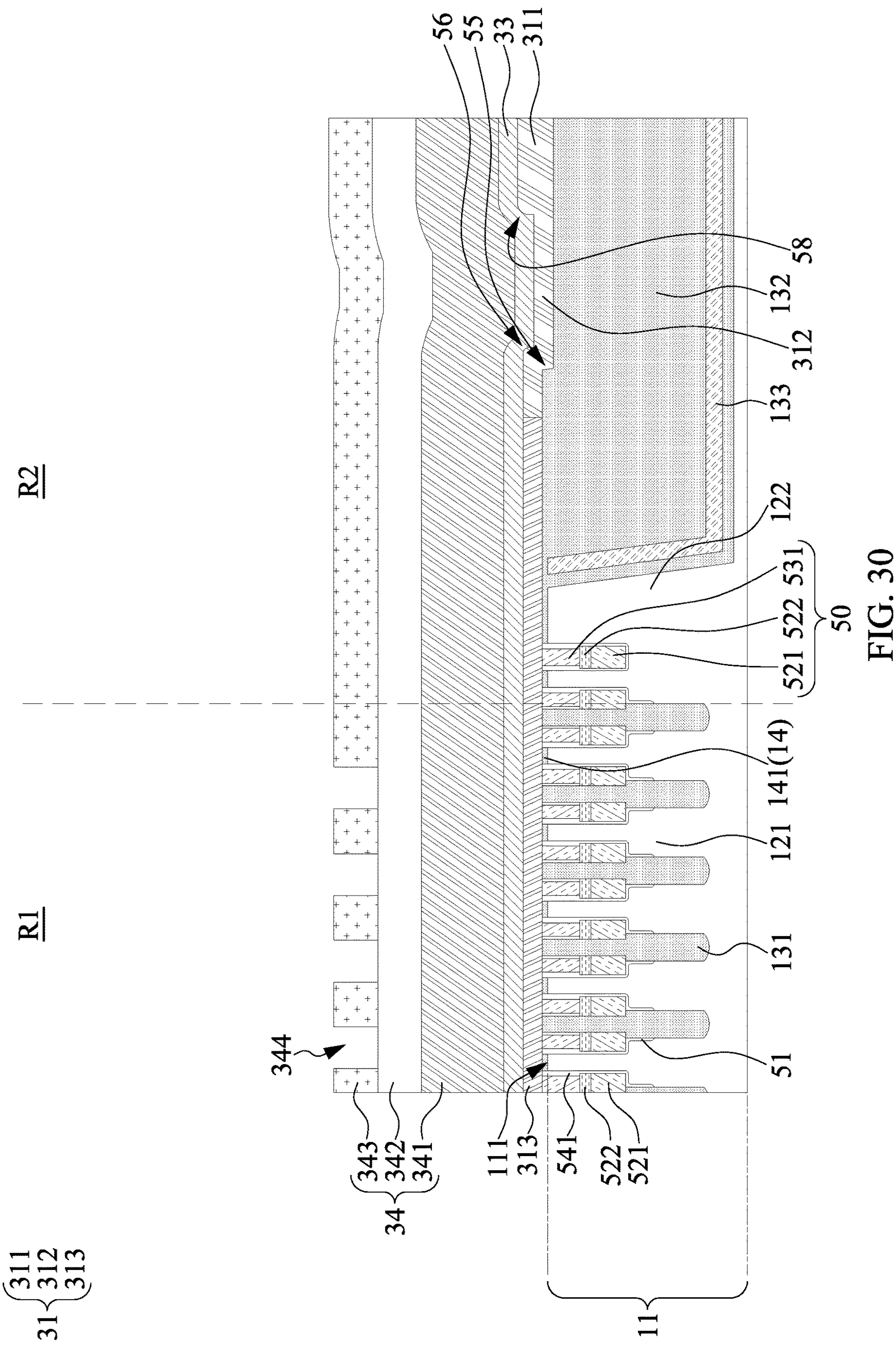

Referring to FIG. 30, a multi-layer mask structure 34 is formed over the cap layer 33. In some embodiments, the multi-layer mask structure 34 includes a first layer 341, a second layer 342 and a third layer 343 sequentially stacked over the cap layer 33. In some embodiments, the first layer 341 is referred to as an underlayer. In some embodiments, the first layer 341 includes carbon. In some embodiments, a thickness of the first layer 341 is in a range of 60 to 100 nm. In some embodiments, the second layer 342 is an ARC layer. In some embodiments, the second layer 342 includes silicon. In some embodiments, a thickness of the second layer 342 is in a range of 20 to 60 nm. In some embodiments, the third layer 343 include oxide. In some embodiments, a thickness of the third layer 343 is in a range of 20 to 60 nm. The third layer 343 may be patterned, thereby having a plurality of openings 344 for definition of positions of the BL contacts 351 to be formed in the subsequent processing.

Figure 31:
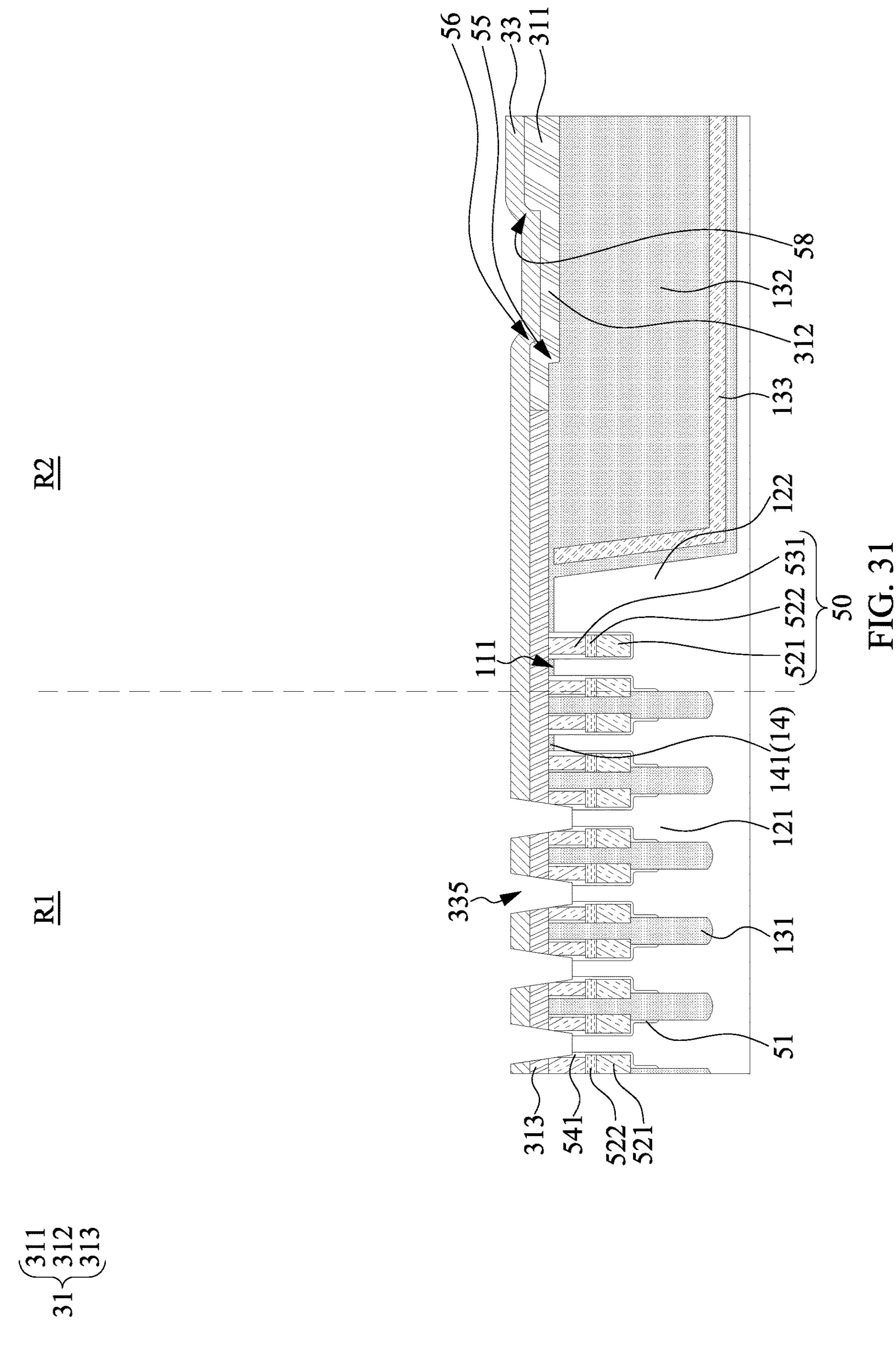

Referring to FIG. 31, a pattern of the third layer 343 is transferred to the substrate 11. In some embodiments, one or more etching operations are performed on the second layer 342 and the third layer 343 shown in FIG. 30. In some embodiments, one or more etching operations are performed on the cap layer 33, the undoped portion 313 of the polysilicon layer 31, the dielectric portions 531, and the silicon portions 121. In some embodiments, an etching operation selective to oxide material is performed. In some embodiments, an etching operation selective to silicon material is performed. In some embodiments, a plurality of openings 335 penetrating the cap layer 33, the undoped portion 313 of the polysilicon layer 31, and the dielectric sublayer 141 are thereby formed. In some embodiments, portions of the cap layer 33 are removed. In some embodiments, portions of the undoped portion 313 of the polysilicon layer 31 are removed. In some embodiments, portions of the dielectric sublayer 141 are removed. In some embodiments, portions of the dielectric portions 531 are removed. In some embodiments, upper portions of the silicon portions 121 in the array region R1 are removed.

Figure 32:
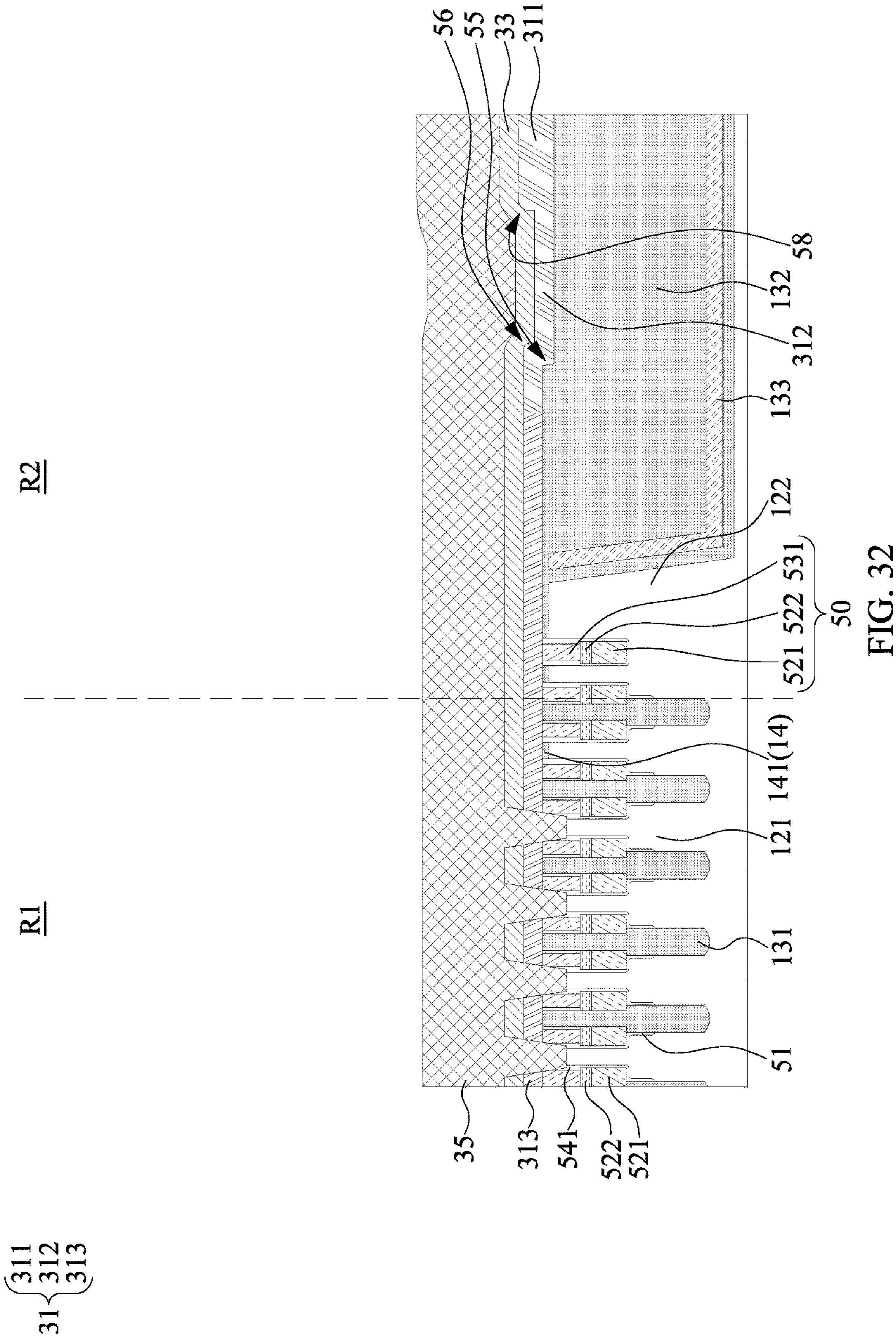

Referring to FIG. 32, proceeding to the operation S14 of the method S1 or the operation S25 of the method S2, a contact material layer 35 is formed over the dielectric layer 53 and fills the openings 335. In some embodiments, the contact material layer 35 is formed by a deposition. The contact material layer 35 fills each of the openings 335. The contact material layer 35 may further cover a top surface of the dielectric layer 53. In some embodiments, the contact material layer 35 in the openings 335 contacts the silicon portions 121. In some embodiments, the contact material layer 35 in the openings 335 contacts the dielectric portions 531.

In some embodiments, a material of the contact material layer 35 includes polysilicon. In some embodiments, the contact material layer 35 is a polysilicon doped with dopants of the first conductivity type. In some embodiments, the contact material layer 35 is an N-type polysilicon layer. In some embodiments, a concentration of the first-conductivity-type dopants of the contact material layer 35 is substantially equal to or greater than a concentration of the first-conductivity-type dopants of the doped portion 311 of the polysilicon layer 31.

Figure 33:
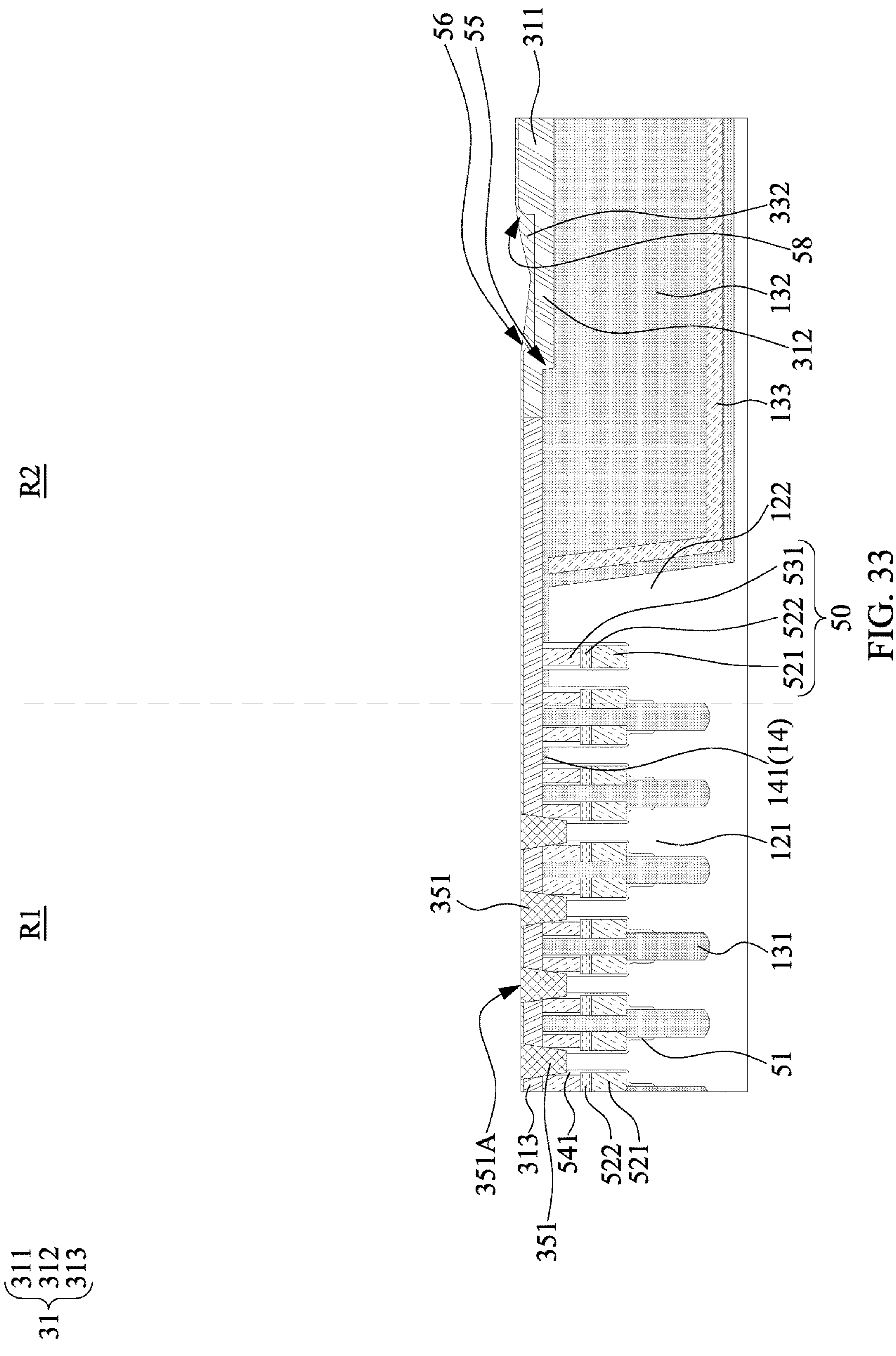

Referring to FIG. 33, an etching operation is performed to remove an upper portion of the contact material layer 35 and an upper portion of the cap layer 33. In some embodiments, the etching operation stops when a thickness of the cap layer 33 remaining on the polysilicon layer 31 is about 2 to 5 nm. A plurality of BL contacts 351 disposed in the trenches 335 are thereby formed, and a remaining cap layer 332 is also formed. In some embodiments, top surfaces 351A of the BL contacts 351 are substantially aligned with a top surface of the remaining cap layer 332 over the undoped portion 313 surrounding the top surfaces 351A of the BL contacts 351. In some embodiments, the remaining cap layer 332 covers an entirety of the polysilicon layer 31. In some embodiments, a portion of the remaining cap layer 332 over the undoped portion 313 of the polysilicon layer 31 has a thickness of about 3 nm. In some embodiments, a portion of the remaining cap layer 332 over the doped portion 311 of the polysilicon layer 31 has a thickness substantially equal to the thickness of the portion of the remaining cap layer 332 over the undoped portion 313. In some embodiments, the thickness of the portion of the remaining cap layer 332 over the doped portion 311 of the polysilicon layer 31 is about 3 nm.

In some embodiments, the remaining cap layer 332 further covers the steps 57 and 58 of the polysilicon layer 31. In some embodiments, the remaining cap layer 332 covers an entirety of the doped portion 312 between the undoped portion 313 and the doped portion 311. In some embodiments, the remaining cap layer 332 has various thicknesses along a horizontal direction. In some embodiments, a portion of the remaining cap layer 332 over the doped portion 312 proximal to the step 58 has a maximum thickness across an entire remaining cap layer 332.

Figure 34:
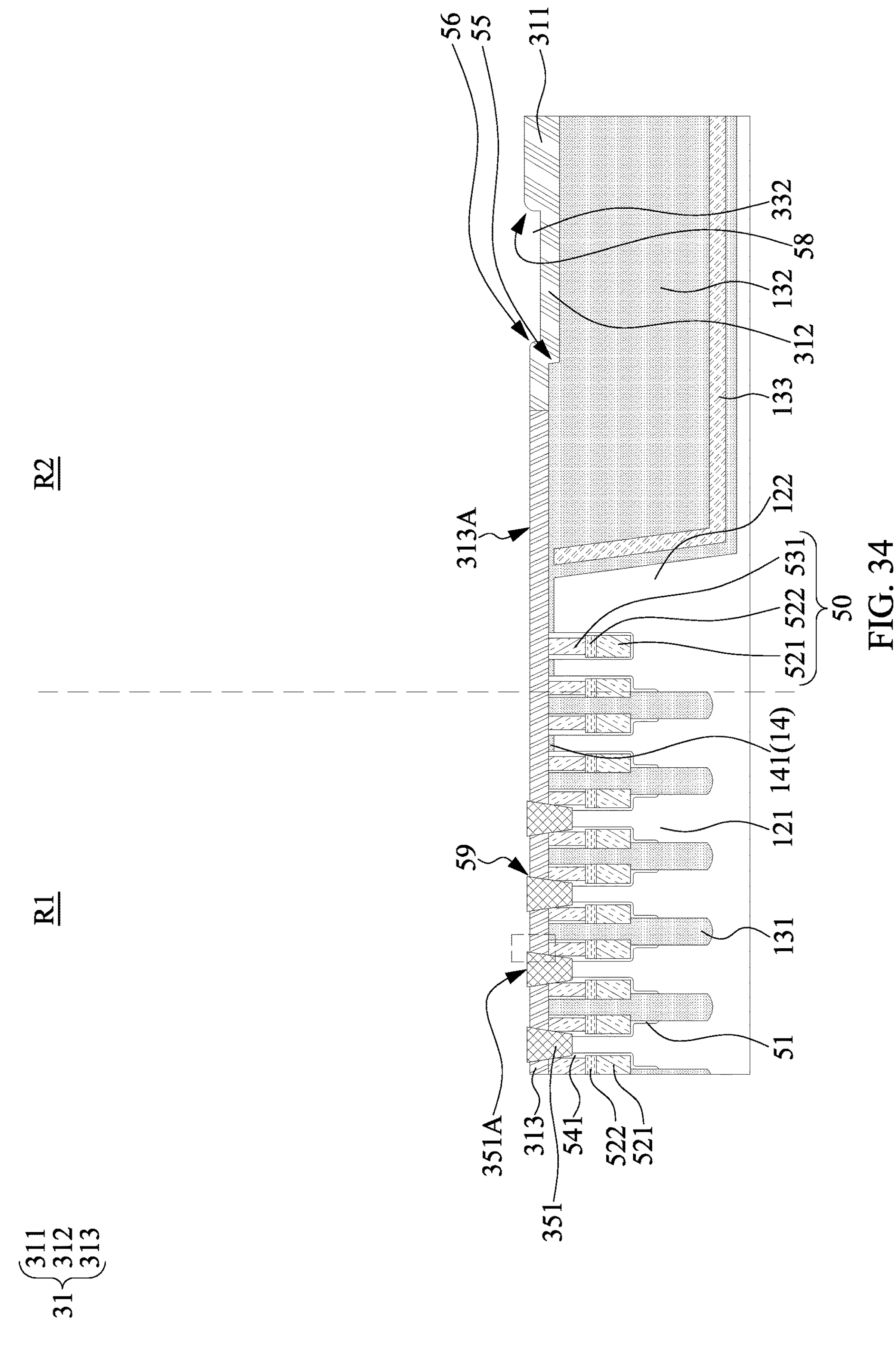
Figure 34A:
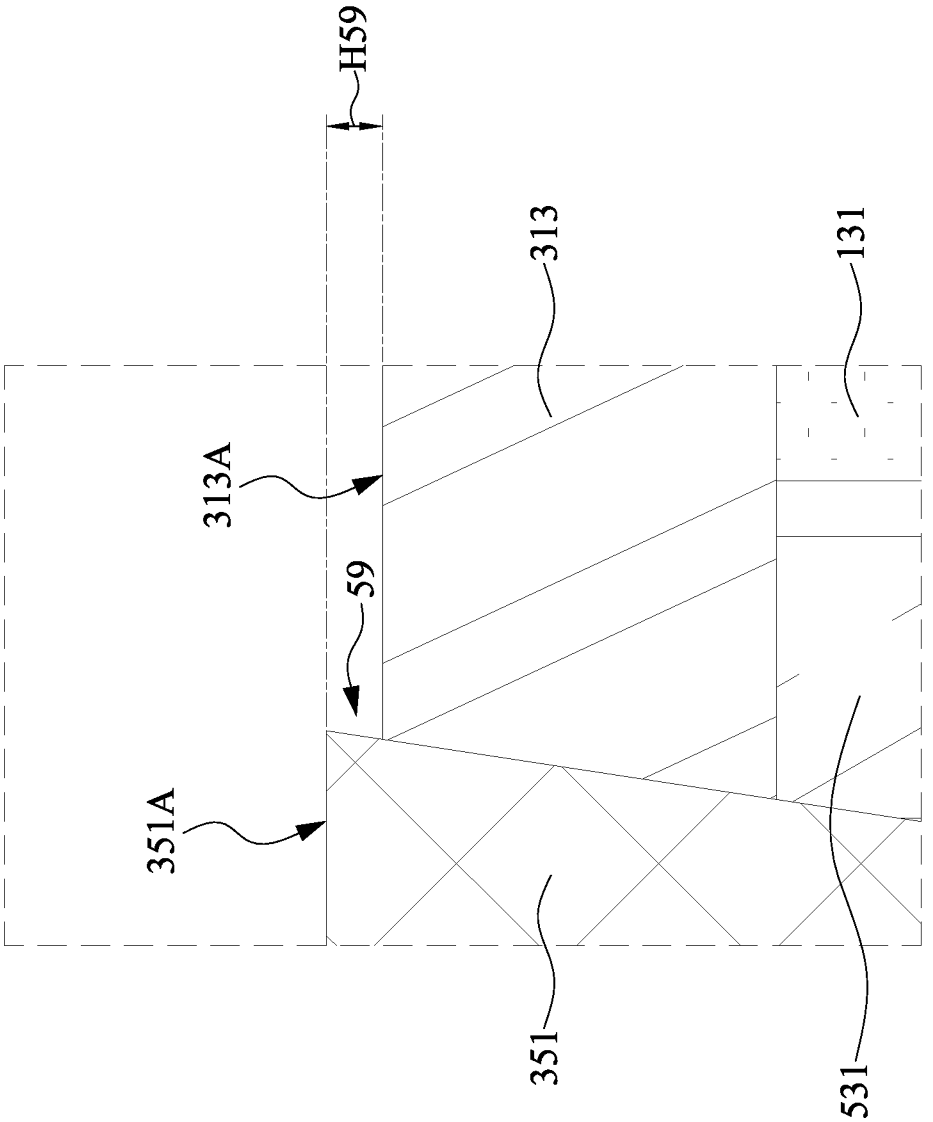

Referring to FIG. 34, the remaining cap layer 332 shown in FIG. 33 is removed. In some embodiments, an etching operation targeting the remaining cap layer 332 is performed. In some embodiments, the etching operation has a low or zero rate of removal of polysilicon material. The upper portion of the cap layer 33 and the remaining cap layer 332 to be removed individually can prevent damage to the doped portion 311 of the polysilicon layer 31 and the peripheral devices.

It should be noted that, since the top surfaces 351A of the BL contacts 351 are substantially aligned with the top surface of the remaining cap layer 332 over the undoped portion 313 surrounding the BL contacts 351 at the previous stage as shown in FIG. 33, a step 59 is generated between the top surface 351A of the BL contact 351 and a top surface 313A of the undoped portion 313. In some embodiments, a height H59 of the step 59 is approximately equal to the thickness of the portion of the remaining cap layer 332 over the undoped portion 313 shown in FIG. 33. In some embodiments, the height H59 of the step 59 is about 3 nm. In other words, the top surface 351A of the BL contact 351 is about 3 nm higher than the top surface 313A of the undoped portion 313 of the polysilicon layer 31 in the array region. A portion of the intermediate structure of FIG. 34 is enlarged to show the step 59 for a purpose of clarity and illustration.

Figure 35:
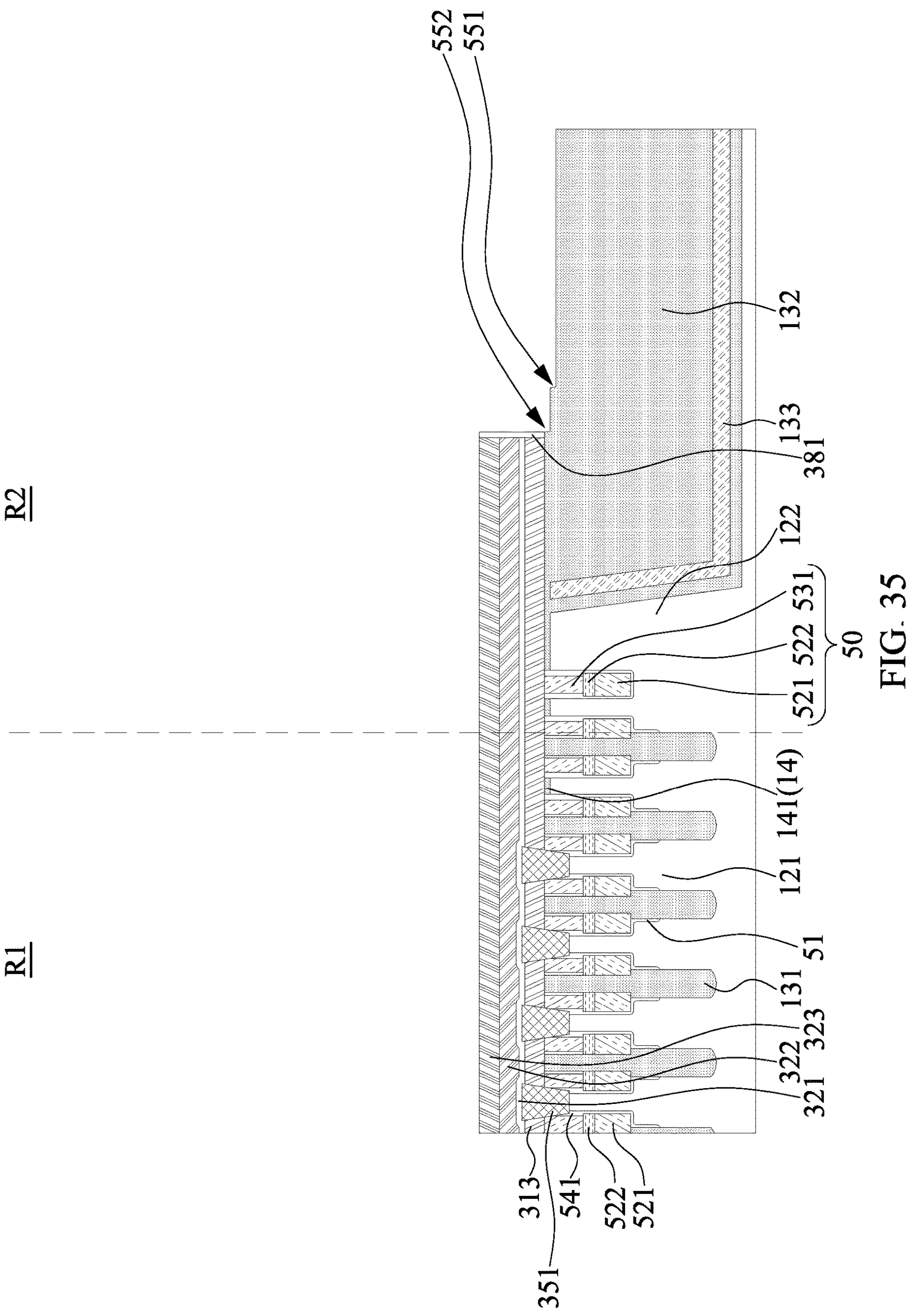

Referring to FIG. 35, prior to the operation S15 of the method S1 or the operation S26 of the method S2, multiple layers 321, 322 and 323 are sequentially formed over the BL contacts 351 and the undoped portion 313 of the polysilicon layer 31. In some embodiments, depositions of the layers 321, 322 and 323 together define a multi-layer structure. In some embodiments, depositions of the layers 321, 322 and 323 are sequentially performed to form the layers 321, 322 and 323 covering an entirety of the substrate 11, and then one or more etching operations are performed on the layers 321, 322 and 323 to remove portions of the layers 321, 322 and 323 in the peripheral region R2. The layers 321, 322 and 323 covering the array region R1 and a portion of the peripheral region R2 proximal to the array region R1 as shown in FIG. 35 are thereby formed. In some embodiments, the polysilicon layer 31 is patterned using the layers 321, 322 and 323 as a mask, and thereby the doped portions 311 and 312 are removed as shown in FIG. 35. In addition, a spacer layer 381 can be optionally formed on sidewalls of the layers 321, 322 and 323 and the undoped portion 313 in the peripheral region R2. The formation of the spacer layer 381 can be achieved by any suitable process. For example, a conformal deposition followed by a spacer etching operation may be performed to form the spacer layer 381.

In some embodiments, an upper portion of the dielectric portion 132 may be removed during the etching operations of the layers 321, 322 and 323, the polysilicon layer 31, and the spacer layer 381. Therefore, a step 551 corresponding to the step 55 shown in FIG. 34, and a step 552 at a boundary of the spacer layer 381 (or a boundary of the undoped portion 313 if the spacer layer 381 is not formed), are formed.

The layers 321, 322 and 323 may define a stack of a BL structure in subsequent processing. In some embodiments, the layer 321 is a first metal layer of the BL structure. In some embodiments, the layer 321 includes titanium (Ti), titanium nitride (TiN), tungsten nitride (WN), tungsten silicon (WSi), or a combination thereof. In some embodiments, the layer 322 is a second metal layer of the BL structure. In some embodiments, the layer 322 includes tungsten (W), other suitable metals, or a combination thereof. In some embodiments, the layer 323 is a top dielectric layer of the BL structure. In some embodiments, the layer 323 includes nitride, other suitable dielectric materials, or a combination thereof. In some embodiments, the spacer layer 381 includes nitride.

Figure 36:
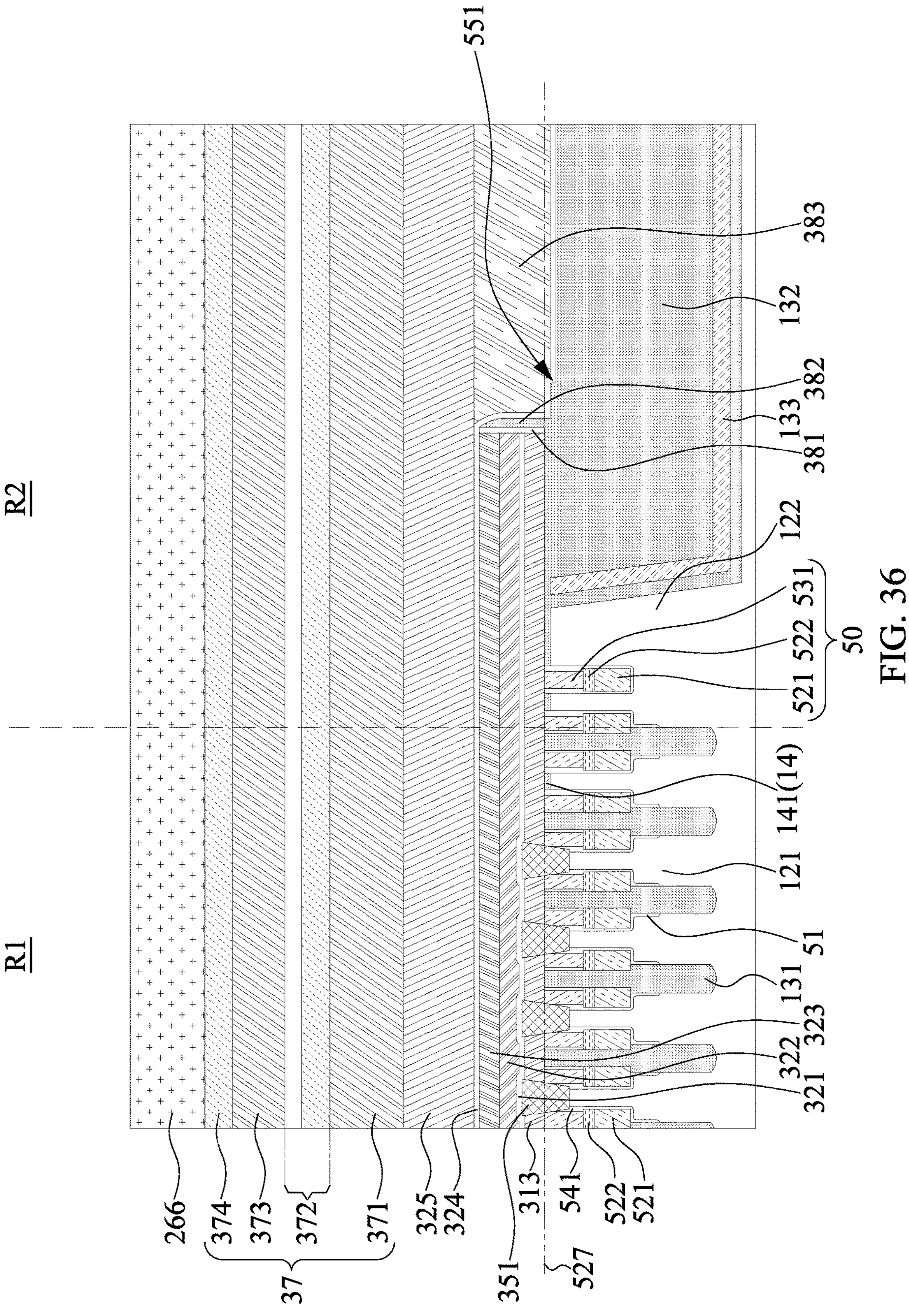

Referring to FIG. 36, a spacer layer 382, a linear layer 324, a compensation layer 383, a hard layer 325, and a mask stack structure 37 are formed over the intermediate structure of FIG. 35. The mask stack structure 37 can be referred to as a multi-layer structure 37. In some embodiments, the spacer layer 382 having a dielectric material different from that of the spacer layer 381 is formed on a sidewall of the spacer layer 381. In some embodiments, the spacer layer 382 includes oxide. The formation of the spacer layer 382 can be similar to that of the spacer layer 381, and repeated description is omitted herein.

In some embodiments, the linear layer 324 is formed after the formation of the spacer layer 382. In some embodiments, the linear layer 324 includes nitride. In some embodiments, the compensation layer 383 is formed after the formation of the linear layer 324. In some embodiments, a top surface of the compensation layer 383 is substantially at an elevation same as that of a top surface of the linear layer 324. In some embodiments, the hard layer 325 is formed on the compensation layer 383 and the linear layer 324. In some embodiments, the hard layer 325 includes nitride.

The mask stack structure 37 may include multiple layers 371, 372, 373 and 374. The mask stack structure 37 can be similar to the multi-layer structure 21 shown in FIG. 6. More specifically, the layer 371 can be similar to the first layer 22 or can include a material same as that of the first layer 22; the layer 372 can be similar to the second layer 23 or can include a material same as that of the second layer 23; the layer 373 can be similar to the third layer 24 or can include a material same as that of the third layer 24; and the layer 374 can be similar to the fourth layer 25 or can include a material same as that of the fourth layer 25. Repeated description is omitted herein; however, such omission is not intended to limit the present disclosure. Similar to the second layer 23 shown in FIG. 6, the layer 372 can include one or more sublayers depending on different applications.

Next, a photoresist layer 266 is formed over the mask stack structure 37. It should be noted that a pattern of the photoresist layer 266 is for definition of positions of the BL structures in subsequent processing. The pattern of the photoresist layer 266 may not be shown in the cross-sectional diagrams of the WL structures.

Figure 37:
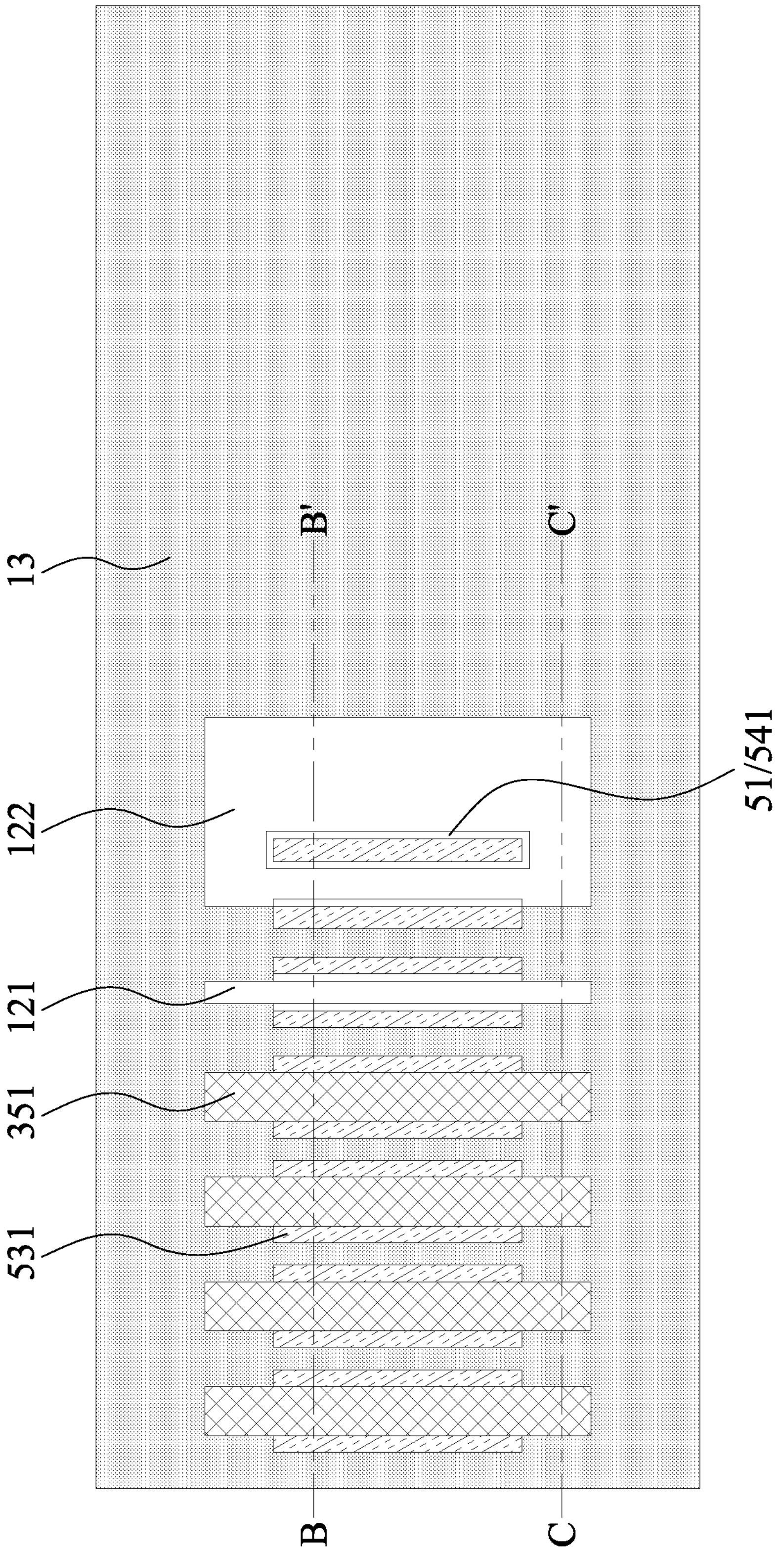
FIG. 37 is a schematic top view diagram of an intermediate stage in the formation of the semiconductor structure in accordance with some embodiments of the present disclosure.

Referring to FIG. 37, FIG. 37 is a schematic top view perspective of the intermediate structure along a line 527 in FIG. 36. In some embodiments, FIGS. 4 to 36 are cross-sectional diagrams along a line B-B' shown in FIG. 37. For a purpose of illustration of formation of the BL structures, FIGS. 38 to 45 are cross-sectional diagrams along a line C-C' shown in FIG. 37.

Figure 38:
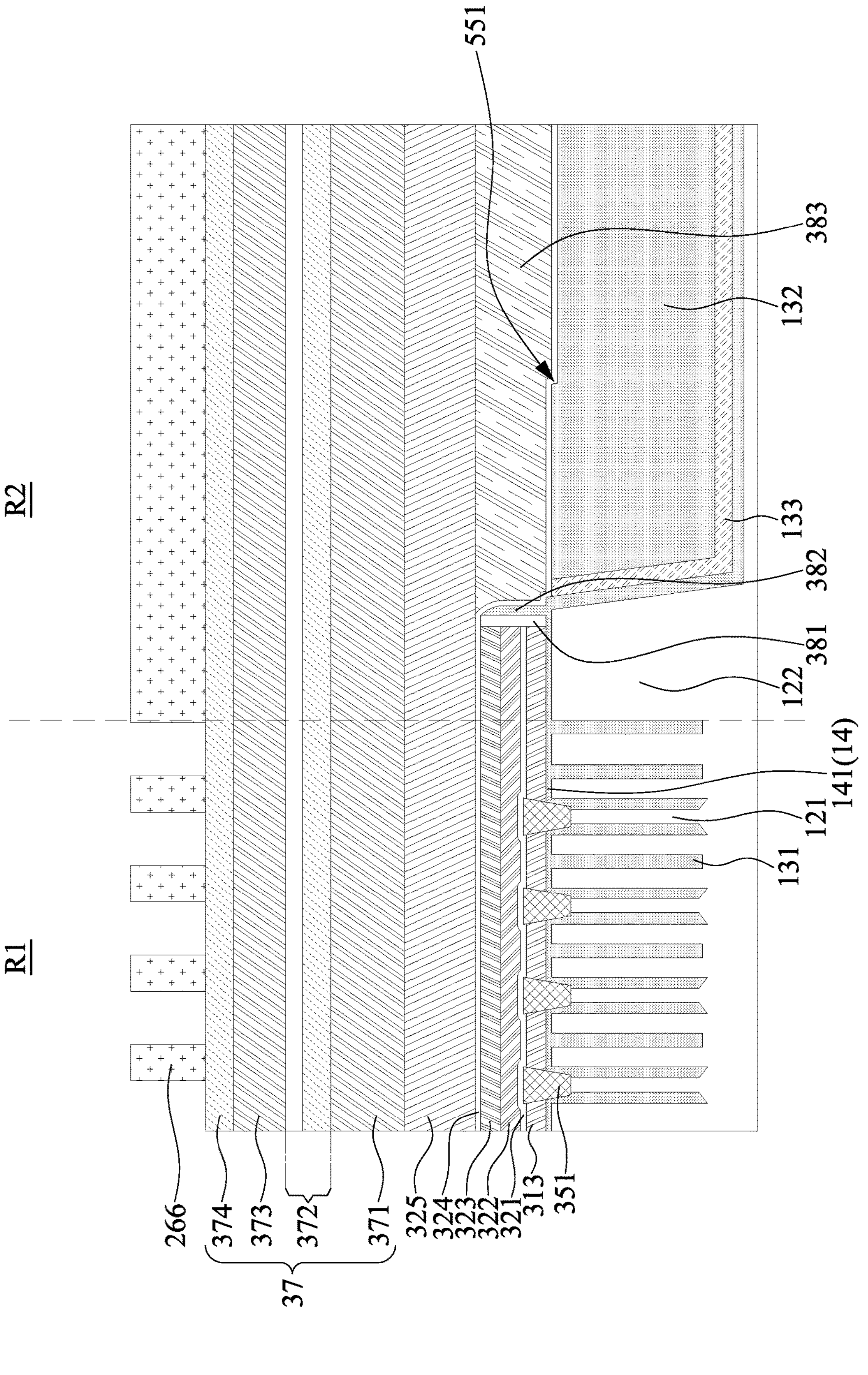
FIGS. 38 to 45 are cross-sectional diagrams of intermediate stages along a line C-C' shown in FIG. 37 in the formation of the semiconductor structure in accordance with some embodiments of the present disclosure.

Referring to FIG. 38, the pattern of the photoresist layer 266 is formed to define the BL structures. In some embodiments, an entirety of the peripheral region R2 is covered by the photoresist layer 266.

Figure 39:
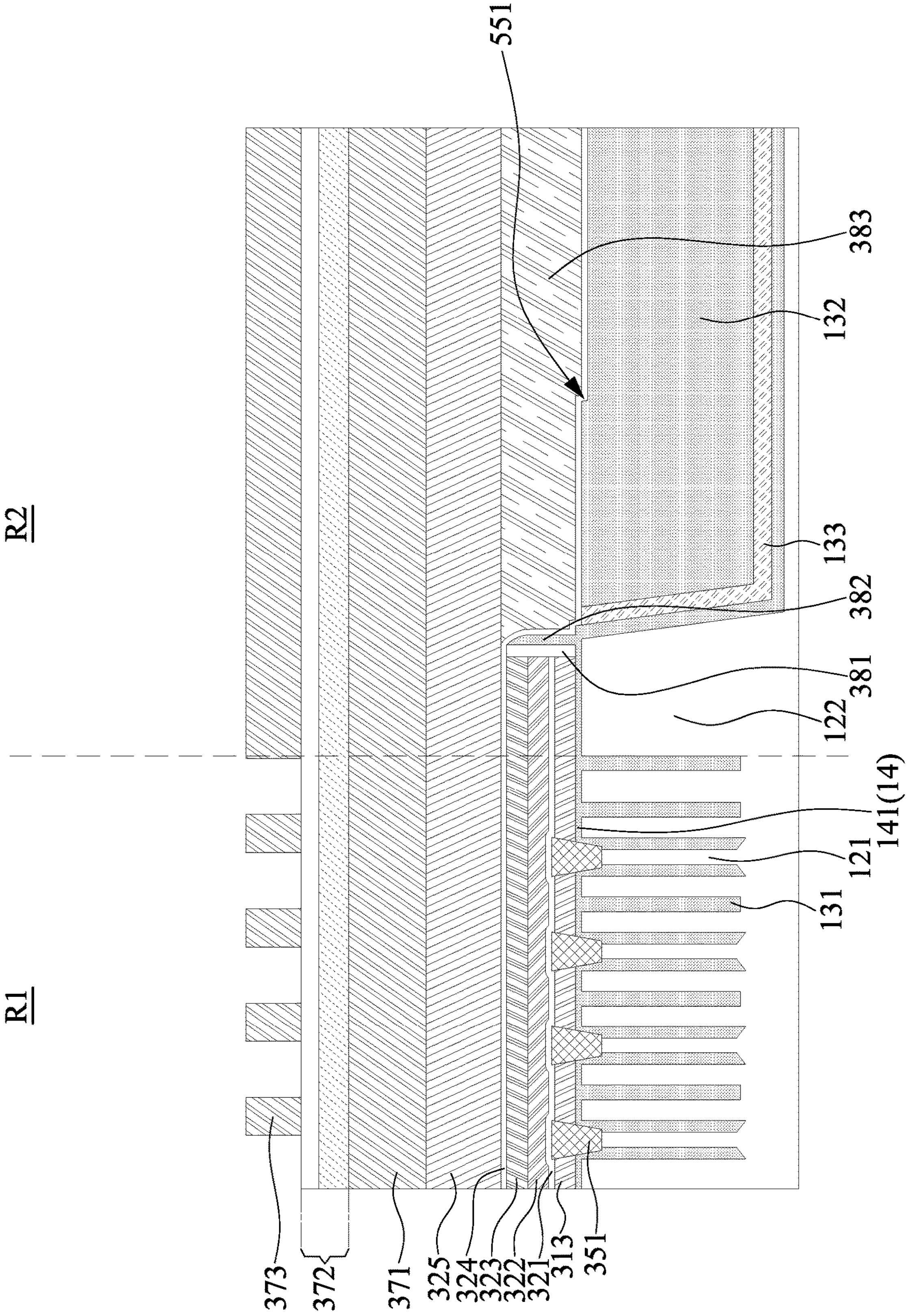

Referring to FIG. 39, the pattern of the photoresist layer 266 shown in FIG. 38 is transferred to the layer 373. In some embodiments, one or more etching operations are performed on the layers 374 and 373 using the photoresist layer 266 shown in FIG. 38 as a mask. In some embodiments, the layer 374 is removed after the patterning of the layer 373.

Figure 40:
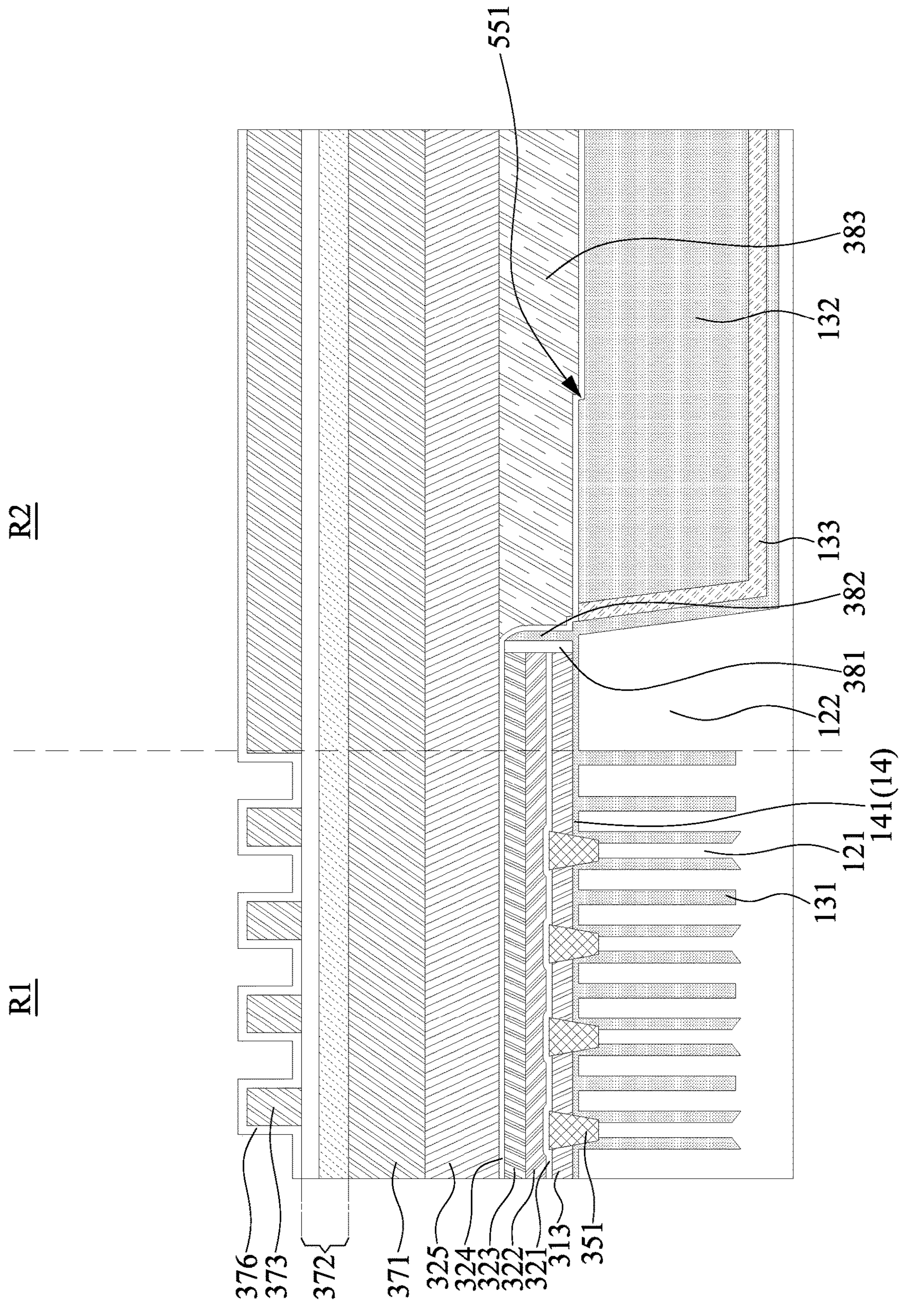

Referring to FIG. 40, a spacer layer 376 is formed over the layer 373 after the patterning of the layer 373. In some embodiments, the spacer layer 376 is conformal to the layer 373. In some embodiments, the spacer layer 376 is formed by a deposition operation. In some embodiments, the spacer layer 376 includes oxide.

Figure 41:
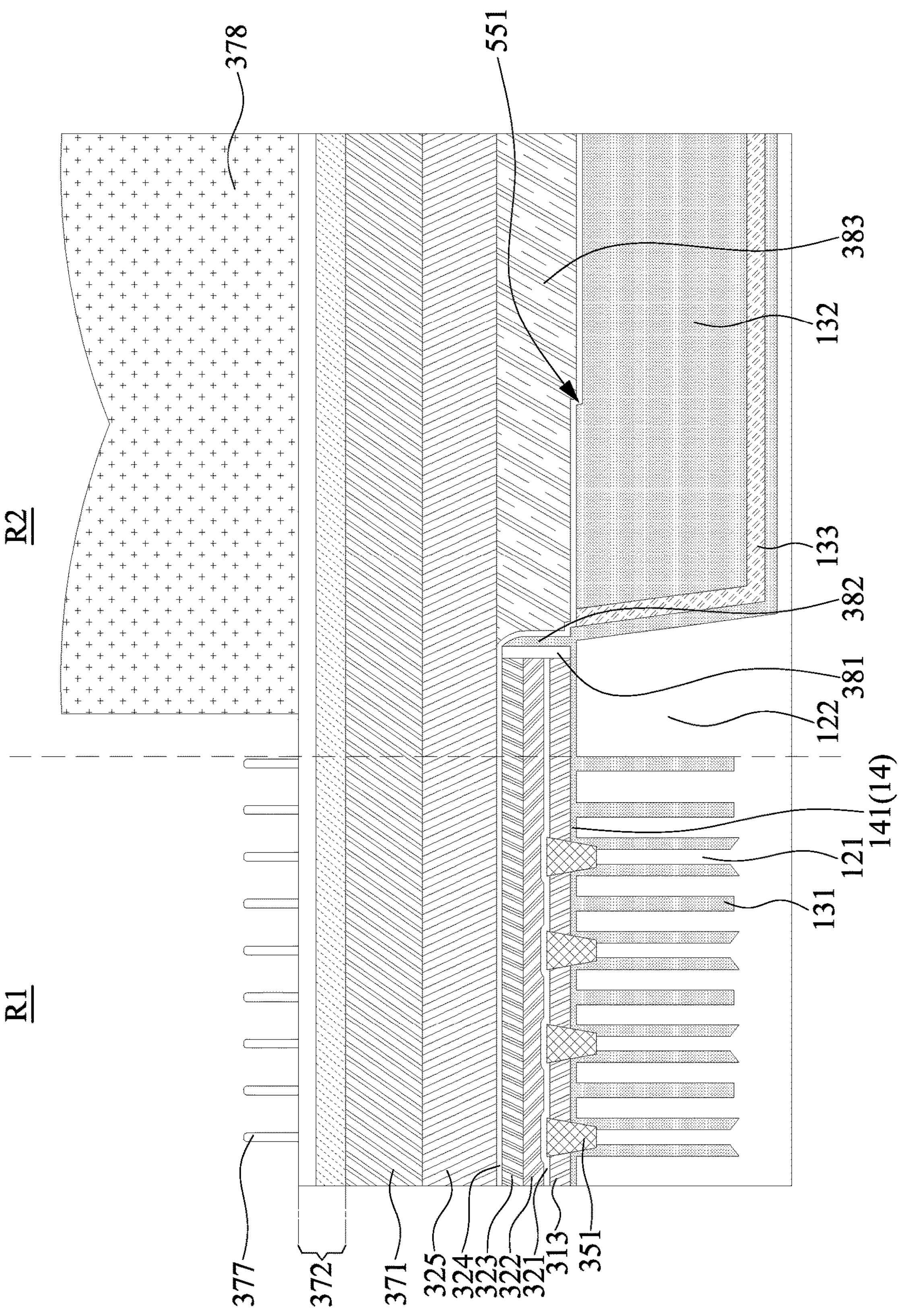

Referring to FIG. 41, a spacer etching operation is performed on the spacer layer 376, thereby forming a spacer structure 377. The spacer structure 377 may include multiple segments for definition of positions of BL structures to be formed. In some embodiments, the layer 373 is removed after the spacer etching operation. In some embodiments, a photoresist layer 378 is formed over the peripheral region R2 after the removal of the layer 373. In some embodiments, the photoresist layer 378 contacts the layer 372 in the peripheral region R2.

Figure 42:
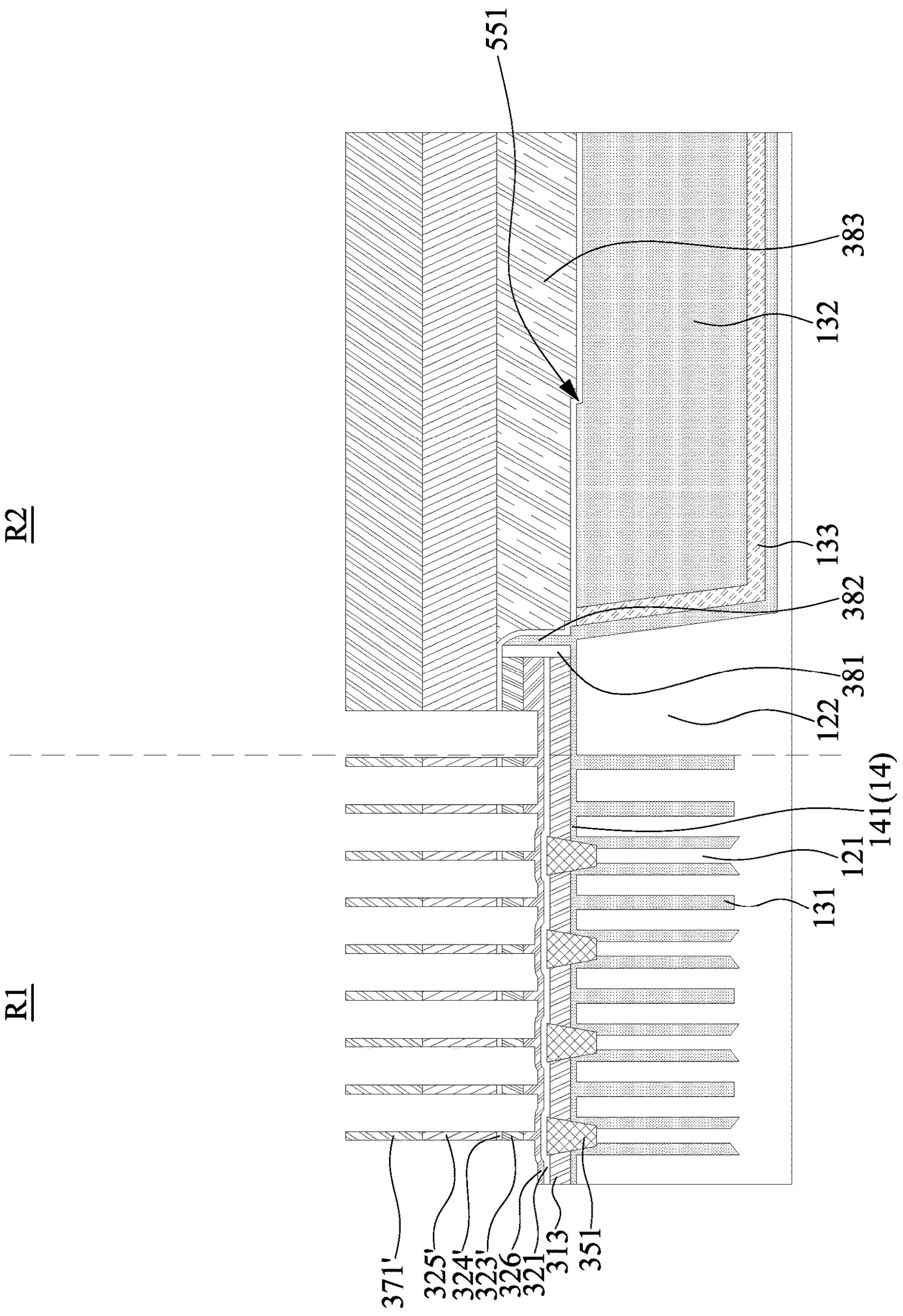

Referring to FIG. 42, in the operation S15 of the method S1 or the operation S26 of the method S2, a patterned mask layer 325' is formed. In some embodiments, one or more etching operations are performed on the layers 372 and 371, the hard layer 325, the linear layer 324, and the layer 323. In some embodiments, the one or more etching operations are performed sequentially by changing etchants injected into a chamber. In some embodiments, the one or more etching operations are performed sequentially in a same chamber. The layer 322 may or may not be removed by the one or more etching operations. In some embodiments, the one or more etching operations illustrated in FIG. 42 target a nitride material. In some embodiments, upper portions of the layer 322 are removed as a side effect of the one or more etching operations illustrated in FIG. 42. In some embodiments, exposed portions of the layer 322 are partially removed by the one or more etching operations. In some embodiments, the layer 321 remains covered by the layer 322 after the one or more etching operations. In some embodiments, the spacer structure 377 and the photoresist layer 378 are removed after the one or more etching operations.

After the one or more etching operations, the layer 371 includes a plurality of segments 371' disposed in the array region R1. In some embodiments, the layer 371 is patterned, and the hard layer 325, the linear layer 324, and the layer 323 are patterned using the patterned layer 371 as a mask. In some embodiments, the patterned layer 371 is used as a mask for the etching operations performed on the layers (e.g., 325, 324, 323 and 322) below the patterned layer 371. After the one or more etching operations, the hard layer 325 includes a plurality of segments 325' disposed in the array region R1 and below the segments 371'. After the one or more etching operations, the linear layer 324 includes a plurality of segments 324' disposed in the array region R1 and below the segments 325'. After the one or more etching operations, the layer 323 includes a plurality of segments 323' disposed in the array region R1 and below the segments 324'. After the one or more etching operations, the layer 322 becomes a patterned layer 326.

Figure 43:
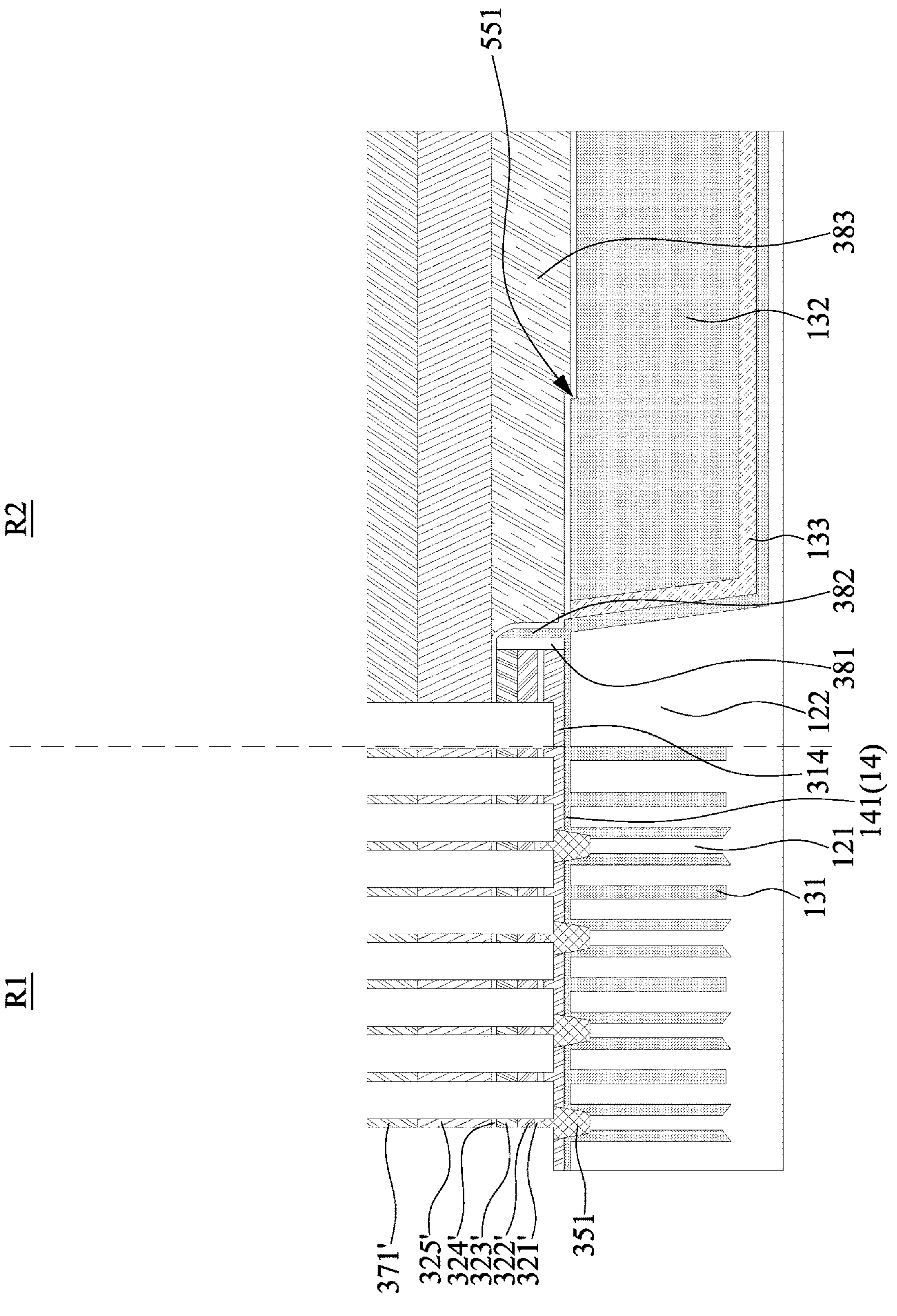

Referring to FIG. 43, an etching operation is performed on the patterned layer 326. After the etching operation illustrated in FIG. 43, the patterned layer 326 includes a plurality of segments 322'. In some embodiments, the etching operation illustrated in FIG. 43 targets a metallic material. In some embodiments, portions of the layer 321 are also removed, as the layer 321 includes metallic material. After the etching operation illustrated in FIG. 43, the layer 321 includes a plurality of segments 321'. In some embodiments, portions of the undoped portion 313 of the polysilicon layer 31 are also removed as a side effect of the etching operation illustrated in FIG. 43. For a purpose of illustration, after the etching operation illustrated in FIG. 43, the undoped portion 313 is relabeled as 314. In some embodiments, the BL contacts 351 may be partially removed simultaneously with the removal of the portions of the undoped portion 313 as the side effect of the etching operation. It should be noted that a thickness of the layer 371 (including the segments 371') may be reduced by the etching operation illustrated in FIG. 43.

Figure 44:
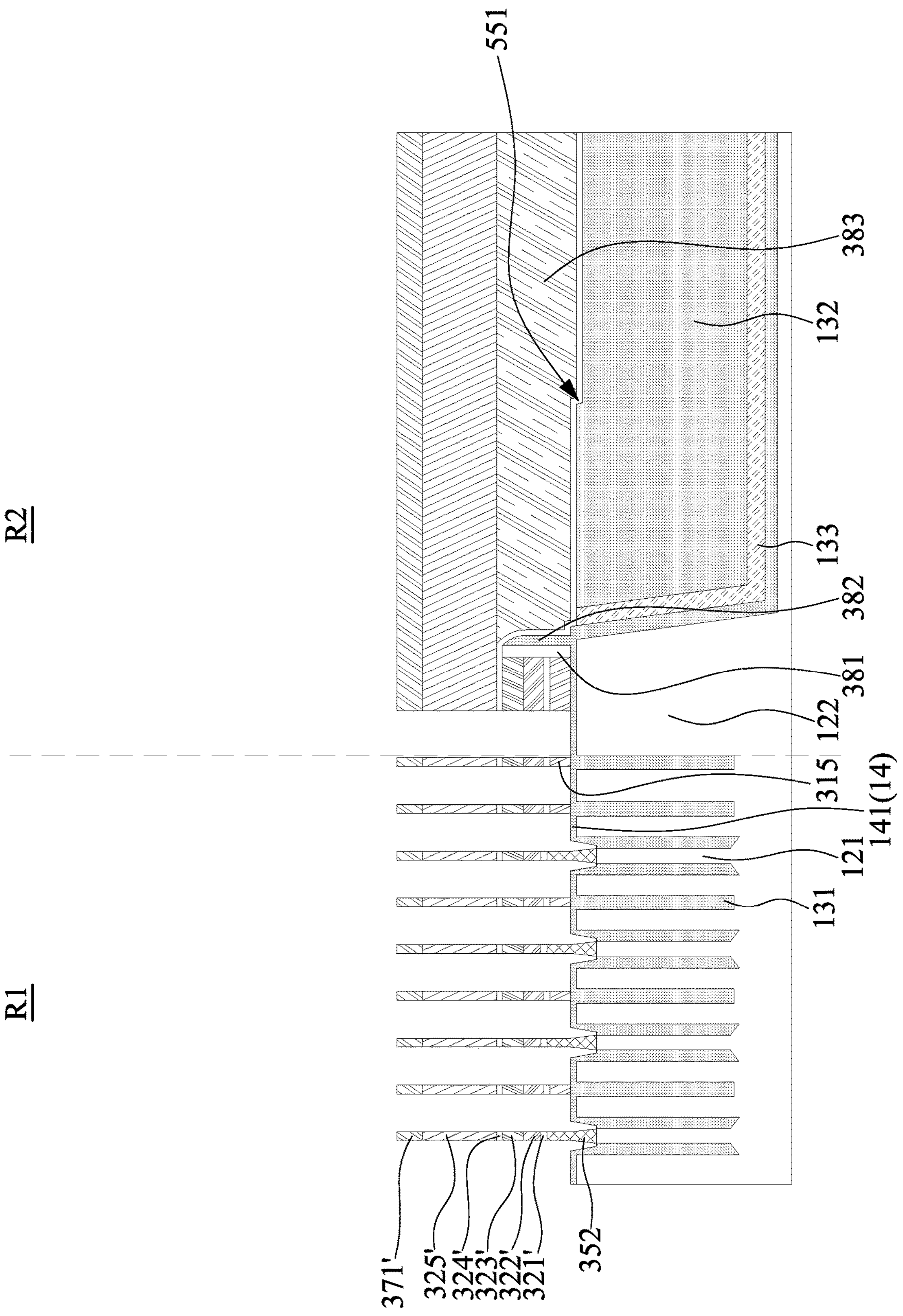

Referring to FIG. 44, in the operation S16 of the method S1 or the operation S27 of the method S2, an etching operation is performed on BL contacts 351 and the undoped portion 314 of the polysilicon layer 31. After the etching operation illustrated in FIG. 44, the undoped portion 314 includes a plurality of segments 315 disposed in the array region R1. For a purpose of illustration, after the etching operation illustrated in FIG. 44, the BL contacts 351 are relabeled as BL contacts 352. In some embodiments, the etching operation illustrated in FIG. 44 targets a polysilicon material. In some embodiments, the dielectric sublayer 141 (or the remaining dielectric layer 14) remains substantially unchanged after the etching operation illustrated in FIG. 44. In some embodiments, the top surface 141A of the dielectric sublayer 141 (or the remaining dielectric layer 14) remains substantially planar after the etching operation illustrated in FIG. 44. In some embodiments, the dielectric portions 131 remains substantially unchanged after the etching operation illustrated in FIG. 44. A thickness of the layer 371 may be further reduced by the etching operation illustrated in FIG. 44.

Figure 45:
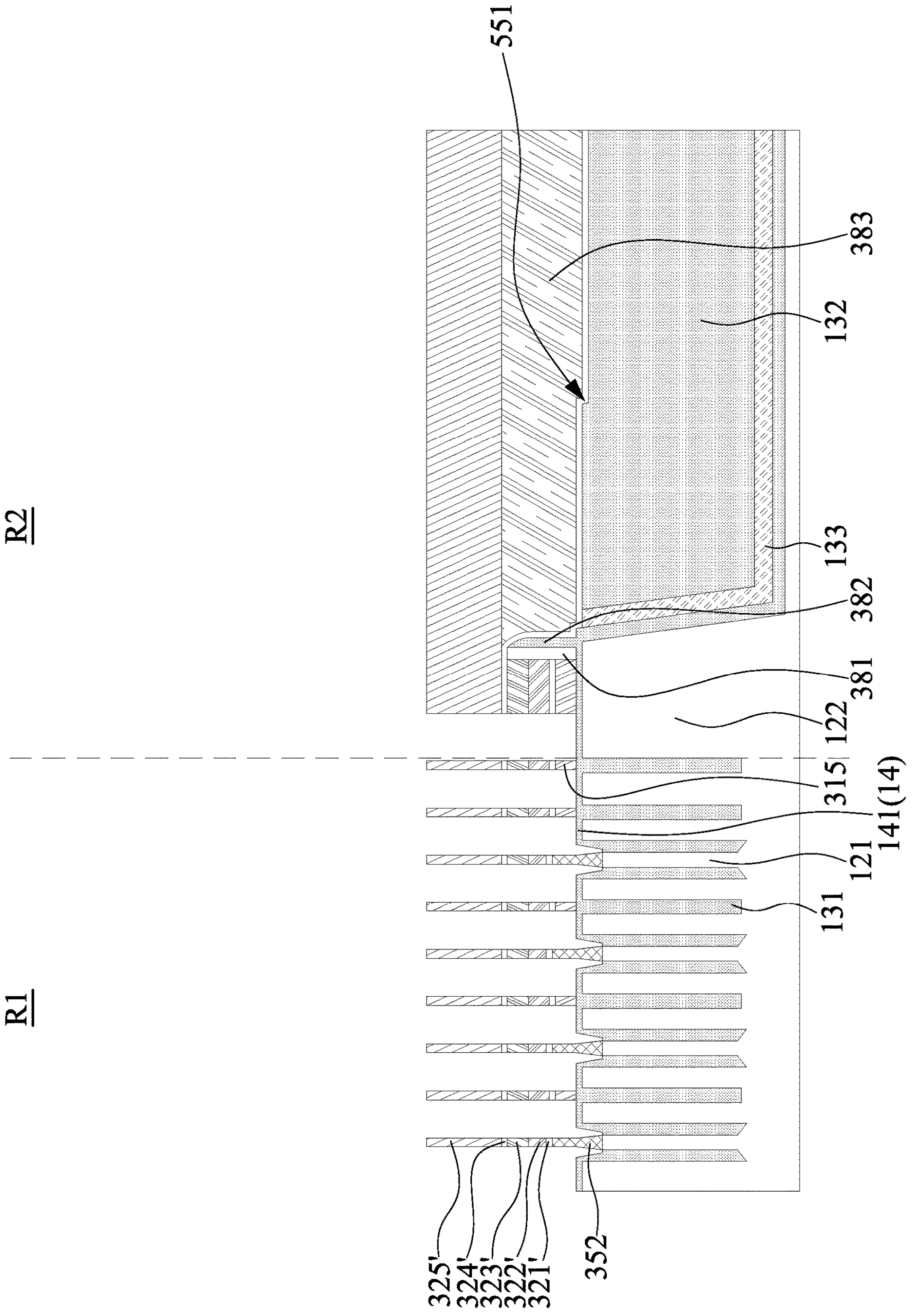

Referring to FIG. 45, the layer 371 is removed. In some embodiments, each of the segments 315 has a substantially straight sidewall after the etching operation illustrated in FIG. 44. In some embodiments, the top surface 141A of the dielectric sublayer 141 (or the remaining dielectric layer 14) is substantially planar after the etching operation illustrated in in FIG. 44.

Figure 46:
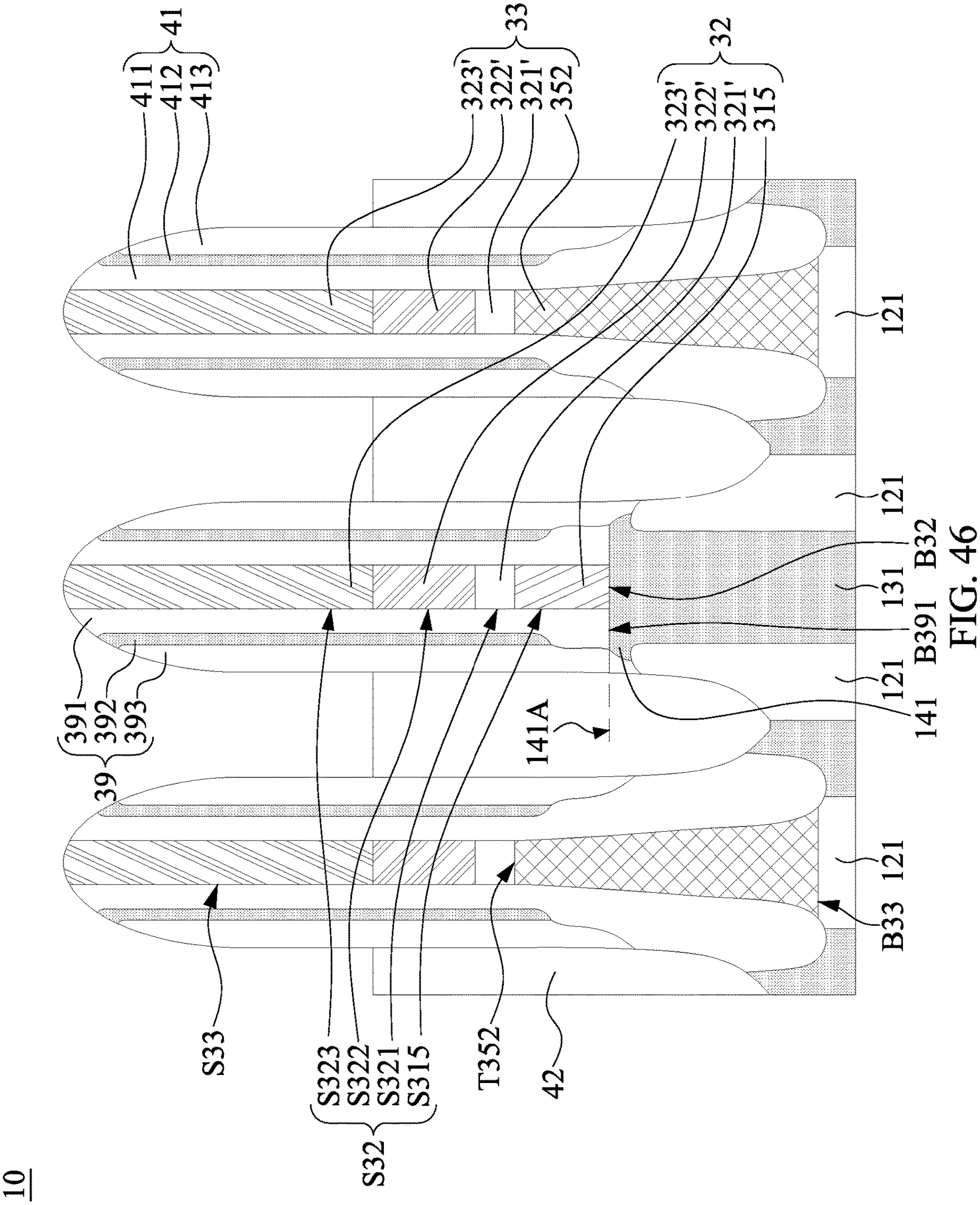
FIG. 46 is a cross-sectional diagram of a semiconductor structure along a line C-C' shown in FIG. 37 in accordance with some embodiments of the present disclosure.

Referring to FIG. 46, a plurality of BL structures 32 and 33 are formed, and a semiconductor structure 10 is thereby formed. The BL structure 32 includes segments 315, 321', 322' and 323' stacked in sequence on the dielectric sublayer 141. In some embodiments, the BL structure 32 may further include segments 324' and 325' depending on different applications. In some embodiments, the layers 324 and 325 are removed prior to formation of a plurality of spacer structures 39 and 41, and the BL structure 32 does not include the segments 324' and 325' as shown in FIG. 46. In some embodiments, a sidewall S32 of the BL structure 32 is substantially straight or extends along a vertical direction.

In some embodiments, a sidewall S315 of the segment 315 is substantially straight. In some embodiments, a sidewall S321 of the segment 321' is substantially aligned with the sidewall S315 of the segment 315. In some embodiments, the sidewall S321 of the segment 321' is substantially straight. In some embodiments, a sidewall S322 of the segment 322' is substantially aligned with the sidewall S321 of the segment 321'. In some embodiments, the sidewall S322 of the segment 322' is substantially straight. In some embodiments, a sidewall S323 of the segment 323' is substantially aligned with the sidewall S322 of the segment 322'. In some embodiments, the sidewall S323 of the segment 323' is substantially straight. The sidewalls of the segments 315, 321', 322' and 323' together define a sidewall of the BL structure 32. A bottom surface B32 of the BL structure 32 is defined by a bottom surface of the segment 315. In some embodiments, the bottom surface B32 of the BL structure 32 is substantially planar or extends along a horizontal direction.

The BL structure 33 includes a BL contact 352, and segments 321', 322' and 323' stacked in sequence on the silicon portion 121. In some embodiments, the BL structure 33 may further include segments 324' and 325' depending on different applications. In some embodiments, the layers 324 and 325 are removed prior to formation of the plurality of spacer structures 39 and 41, and the BL structure 33 does not include the segments 324' and 325' as shown in FIG. 46.

Similar to the BL structure 32, in the BL structure 33, sidewalls of the segments 321', 322' and/or 323' may be substantially straight. In some embodiments, the sidewalls of the segments 321', 322' and 323' are substantially aligned along a vertical direction. In some embodiments, the BL contact 352 has a narrower top and a wider bottom. In some embodiments, a width of a top surface T352 of the BL contact 352 is substantially equal to a width of a bottom surface of the segment 321'. In some embodiments, the top surface T352 of the BL contact 352 is substantially aligned with the bottom surface of the segment 321'. A bottom surface of the BL contact 352 defines a bottom surface B33 of the BL structure 33. In some embodiments, a width of the bottom surface of the BL contact 352 or the bottom surface B33 of the BL structure 33 is substantially equal to a width of a top surface of the silicon portion 121 disposed below the BL contact 352. In some embodiments, the bottom surface of the BL contact 352 or the bottom surface B33 of the BL structure 33 is substantially coplanar with the top surface of the silicon portion 121 disposed below the BL contact 352. The sidewalls of the BL contact 352 and the segments 321', 322' and 323' together define a sidewall S33 of the BL structure 33.

The plurality of spacer structures 39 and 41 may be formed on the intermediate structure of FIG. 45 or after the removal of the layers 324 and 325. The spacer structures 39 surround each of the BL structures 32, and the spacer structures 41 surround each of the BL structures 33.

In some embodiments, each of the spacer structures 39 includes an inner nitride layer 391, an oxide layer 392, and an outer nitride layer 393. In some embodiments, the inner nitride layer 391 is disposed on and extends along the sidewall S32 of the BL structure 32. In some embodiments, the oxide layer 392 is disposed between the inner nitride layer 391 and the outer nitride layer 393. In some embodiments, the outer nitride layer 393 is disposed along a sidewall of the oxide layer 392. In some embodiments, the outer nitride layer 393 contacts the oxide layer 392. In some embodiments, a bottom portion of the outer nitride layer 393 contacts a bottom portion of the inner nitride layer 391.

In some embodiments, a bottom surface B391 of the inner nitride layer 391 contacts the top surface 141A of the dielectric sublayer 141 (or the remaining dielectric layer 14). In some embodiments, the bottom surface B391 of the inner nitride layer 391 is substantially planar. In some embodiments, the bottom surface B391 of the inner nitride layer 391 is substantially aligned with the bottom surface B32 of the BL structure 32. In some embodiments, the outer nitride layer 393 covers sidewalls of the dielectric sublayer 141 (or the remaining dielectric layer 14). In some embodiments, a bottom of the oxide layer 392 is lower than a top surface of the segment 315 and higher than the bottom surface B32 of the BL structure 32. In some embodiments, the outer nitride layer 393 extends below the inner nitride layer 391. In some embodiments, a bottom of the outer nitride layer 393 is lower than the bottom surface B391 of the inner nitride layer 391.

In some embodiments, an inner sidewall of the spacer structure 39 (or the inner nitride layer 391) surrounding the BL structure 32 is substantially straight. In some embodiments, the inner sidewall of the spacer structure 39 (or the inner nitride layer 391) surrounding the BL structure 32 is substantially planar.

In some embodiments, each of the spacer structures 41 includes an inner nitride layer 411, an oxide layer 412, and an outer nitride layer 413. The inner nitride layer 411, the oxide layer 412, and the outer nitride layer 413 may be formed concurrently or in a same step as the formation of the inner nitride layer 391, the oxide layer 392, and the outer nitride layer 393, respectively.

In some embodiments, the inner nitride layer 411 is disposed on and extends along the sidewall S33 of the BL structure 33. In some embodiments, the oxide layer 412 is disposed between the inner nitride layer 411 and the outer nitride layer 413. In some embodiments, the outer nitride layer 413 is disposed along a sidewall of the oxide layer 412. In some embodiments, the outer layer 413 contacts the oxide layer 412. In some embodiments, a bottom portion of the outer nitride layer 413 contacts a bottom portion of the inner nitride layer 411. In some embodiments, a bottom of the oxide layer 412 is lower than a top surface T352 of the BL contact 352 and higher than the bottom surface B33 of the BL structure 33 or the bottom surface of the BL contact 352.

In some embodiments, a bottom of the inner nitride layer 411 extends lower than the top surface 141A of the dielectric sublayer 141 (or the remaining dielectric layer 14). In some embodiments, the bottom of the inner nitride layer 411 extends below a bottom of the outer nitride layer 413. In some embodiments, the inner nitride layer 411 extends below the outer nitride layer 413. In some embodiments, the bottom of the inner nitride layer 411 is below the bottom of the oxide layer 412. In some embodiments, a bottom of the outer nitride layer 413 is above the bottom of the inner nitride layer 411.

After the formation of the spacer structures 39, a plurality of metal contacts 42 are formed between adjacent BL structures 32 and 33. In some embodiments, one or more etching operations are performed to expose portions of the silicon portions 121. In some embodiments, portions of the silicon portions 121 outside coverage areas of the BL contacts 32 and 33 are removed. In some embodiments, the metal contacts 41 contact the silicon portions 121, which are exposed after the removal of the portions of the silicon portions 121 outside the coverage areas of the BL contacts 32 and 33. In some embodiments, the metal contacts 42 are referred to as landing pads 42. In some embodiments, tops of the metal contacts 41 are lower than tops of the BL structures 32 and 33.

The present disclosure provides a novel configuration of a BL structure including a polysilicon layer as a bottom layer of the BL structure. A patterning result of the polysilicon layer can be improved due to an etching selectivity of the polysilicon material to other dielectric and/or metallic materials. Therefore, a configuration of the patterned polysilicon layer having a straight sidewall can be provided, and a better control of a profile of a metal contact/landing pad can be achieved.

One aspect of the present disclosure provides a semiconductor structure. The semiconductor structure includes: a substrate, including a plurality of fin structures; a dielectric layer, disposed over adjacent fin structures, wherein a top surface of the dielectric layer is a substantially planar surface; a bit line structure, disposed over the substrate and between adjacent fin structures, wherein the bit line structure includes a polysilicon layer contacting the top surface of the dielectric layer; and a spacer structure, surrounding the bit line structure, wherein the spacer structure contacts the top surface of the dielectric layer.

In some embodiments, a bottom surface of an inner nitride layer of the spacer structure is substantially planar.

In some embodiments, the bit line structure further comprises: a first metal layer, stacked over the polysilicon layer; a second metal layer, stacked over the first metal layer; and a nitride layer, stacked over the second metal layer.

In some embodiments, a sidewall of the polysilicon layer is substantially aligned with a sidewall of the first metal layer, the second metal layer or the nitride layer along a vertical direction.

In some embodiments, the first metal layer includes titanium (Ti), titanium nitride (TiN), tungsten nitride (WN), tungsten silicon (WSi), or a combination thereof.

In some embodiments, the second metal layer includes tungsten (W).

In some embodiments, the polysilicon layer is a layer of undoped polysilicon.

In some embodiments, a sidewall of the bit line structure is substantially straight.

In some embodiments, the spacer structure comprises: a first nitride layer, proximal to a sidewall of the bit line structure; a second nitride layer, surrounding the first nitride layer; and an oxide layer, disposed between the first nitride layer and the second nitride layer.

In some embodiments, a bottom surface of the first nitride layer contacts the top surface of the dielectric layer.

In some embodiments, the second nitride layer extends below the bottom surface of the first nitride layer.

Another aspect of the present disclosure provides a method for manufacturing a semiconductor structure. The method includes a number of operations. A substrate is provided, wherein the substrate includes a fin structure. A dielectric layer is formed over the substrate, wherein a top surface of the dielectric layer is substantially planar. A polysilicon layer is formed over the substrate and the dielectric layer. A bit line contact is formed on a top of the fin structure, wherein the bit line contact penetrates the polysilicon layer. A patterned mask is formed over the bit line contact and the polysilicon layer. The bit line contact and the polysilicon layer are patterned, wherein a sidewall of the bit line contact is a substantially straight sidewall and the top surface of the dielectric layer remains substantially planar after the patterning of the bit line contact and the polysilicon layer.

In some embodiments, the method further comprises: forming a plurality of word line structures on opposite sides of the fin structure prior to the formation of the polysilicon layer.

In some embodiments, the substrate includes an array region and a peripheral region surrounding the array region, wherein the fin structure is formed in the array region and the dielectric layer is formed in the array region and the peripheral region.

In some embodiments, the method further comprises: forming a step on a top surface of a dielectric portion of the substrate in the peripheral region.

In some embodiments, the polysilicon layer is formed conformal to the top surface of the dielectric layer.

In some embodiments, prior to the formation of the patterned mask, a top surface of the bit line contact is above a top surface of a portion of the polysilicon layer surrounding the bit line contact.

In some embodiments, the formation of the polysilicon layer comprises: depositing a polysilicon material film over the substrate; doping a first portion of the polysilicon material film in a peripheral region of the substrate; and reducing a thickness of a second portion of the polysilicon material film in an array region of the substrate surrounded by the peripheral region.

In some embodiments, the method further comprises: forming a first multi-layer structure over the substrate prior to the formation of the patterned mask.

In some embodiments, the first multi-layer structure is patterned prior to the patterning of the bit line contact and the polysilicon layer.

In some embodiments, the first multi-layer structure includes a first layer, a second layer and a third layer, wherein the first layer, the second layer and the third layer are patterned by different etching operations.

In some embodiments, the formation of the patterned mask comprises: forming a second multi-layer structure over the substrate; patterning a first layer of the second multi-layer structure, thereby forming a patterned first layer; forming a spacer layer surrounding the patterned first layer; performing a spacer etching on the spacer layer, thereby forming a spacer structure; and patterning a second layer of the second multi-layer structure using the spacer structure as a mask, thereby forming a patterned second layer.

In some embodiments, the formation of the patterned mask further comprises: removing the patterned first layer prior to patterning the second layer.

In some embodiments, the patterned second layer becomes the patterned mask, and a pattern of the patterned second layer is transferred to the polysilicon layer and the bit line contact.

Another aspect of the present disclosure provides a method for manufacturing a semiconductor structure. The method includes a number of operations. A substrate is provided, wherein the substrate includes a plurality of fin structures in an array region of the substrate. An oxide layer is formed over the substrate and covers tops of the fin structures. A plurality of word line structures are formed alternately arranged with the plurality of fin structures, wherein a top surface of the oxide layer is substantially aligned with a top surface of the plurality of word line structures. A polysilicon layer is formed over the substrate, the plurality of word line structures, the plurality of fin structures, and the oxide layer. A plurality of bit line contacts are formed over the plurality of fin structures and penetrate the polysilicon layer. A patterned layer is formed over the polysilicon layer. The polysilicon layer is patterned using the patterned layer as a mask, thereby forming a patterned polysilicon layer, wherein a sidewall of the patterned polysilicon layer is substantially straight.

In some embodiments, the substrate includes a peripheral region surrounding the array region, the oxide layer further covers the peripheral region, and the method further comprises: forming a first mask layer, covering the array region of the substrate and exposing the peripheral region; partially removing the oxide layer in the peripheral region, thereby forming a step on an isolation of the substrate; forming the polysilicon layer over the array region and the peripheral region, wherein the polysilicon layer is conformal to the step; doping the polysilicon layer in the peripheral region, thereby forming a doped portion of the polysilicon layer; forming a second mask layer to partially cover the doped portion of the polysilicon layer; and reducing a thickness of the polysilicon layer exposed through the second mask layer.

In some embodiments, a thickness of the polysilicon layer prior to the doping of the polysilicon layer is in a range of 20 to 50 nanometers.

In some embodiments, the thickness of the polysilicon layer is reduced to a range of 10 to 20 nanometers.

In some embodiments, after the reduction of the thickness of the polysilicon layer, the polysilicon layer has a first step conformal to the step of the isolation, and a second step at a boundary of the second mask layer.

In some embodiments, a thickness of an undoped portion of the polysilicon layer in the array region is less than a thickness of the doped portion of the polysilicon layer.

In some embodiments, a thickness of the oxide layer is about 5 nanometers.

In some embodiments, a material of the bit line contacts includes polysilicon.

In some embodiments, the bit line contacts are patterned concurrently with the patterning of the polysilicon layer using the patterned layer as the mask.

In some embodiments, the bit line contact is doped with N-type dopants.

In some embodiments, a top surface of the bit line contacts is about 3 nanometers higher than a top surface of the polysilicon layer in the array region.

In conclusion, the application discloses a semiconductor structure and a method of manufacturing the same. The present disclosure provides a novel configuration of a BL structure including a polysilicon layer as a bottom layer of the BL structure. A patterning result of the polysilicon layer can be improved due to an etching selectivity of the polysilicon material to other dielectric and/or metallic materials. Therefore, a configuration of the patterned polysilicon layer having a straight sidewall can be provided, and a better control of a profile of a metal contact/landing pad can be achieved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A semiconductor structure, comprising:

a substrate, including a plurality of fin structures;

a dielectric layer, disposed over adjacent fin structures, wherein a top surface of the dielectric layer is a substantially planar surface;

a bit line structure, disposed over the substrate and between adjacent fin structures, wherein the bit line structure includes a polysilicon layer contacting the top surface of the dielectric layer;

a bit line contact formed on the fin structure and penetrating through the polysilicon layer at a position that a top surface of the bit line contact is above a top surface of the polysilicon layer, such that an upper portion of the bit line contact is protruded out of the top surface of the polysilicon layer; and a spacer structure, surrounding the bit line structure, wherein the spacer structure contacts the top surface of the dielectric layer;

wherein a sidewall of the polysilicon layer is straight and is aligned with a sidewall of the bit line structure.

2. The semiconductor structure of claim 1, wherein a bottom surface of an inner nitride layer of the spacer structure is substantially planar.

3. The semiconductor structure of claim 1, wherein the bit line structure further comprises:

a first metal layer, stacked over the polysilicon layer;

a second metal layer, stacked over the first metal layer; and a nitride layer, stacked over the second metal layer;

wherein the first metal layer encircles the upper portion of the bit line contact.

4. The semiconductor structure of claim 3, wherein the sidewall of the polysilicon layer is substantially aligned with a sidewall of the first metal layer, the second metal layer or the nitride layer along a vertical direction.

5. The semiconductor structure of claim 3, wherein the first metal layer includes titanium (Ti), titanium nitride (TiN), tungsten nitride (WN), tungsten silicon (WSi), or a combination thereof.

6. The semiconductor structure of claim 3, wherein the second metal layer includes tungsten (W).

7. The semiconductor structure of claim 1, wherein the polysilicon layer is a layer of undoped polysilicon.

8. The semiconductor structure of claim 1, further comprising a spacer layer, wherein the sidewall of the bit line structure is substantially straight, wherein the spacer layer is formed on the sidewall of the polysilicon layer and the sidewall of the bit line structure.

9. The semiconductor structure of claim 1, wherein the spacer structure comprises:

a first nitride layer, proximal to a sidewall of the bit line structure;

a second nitride layer, surrounding the first nitride layer; and an oxide layer, disposed between the first nitride layer and the second nitride layer.

10. The semiconductor structure of claim 9, wherein a bottom surface of the first nitride layer contacts the top surface of the dielectric layer.

11. The semiconductor structure of claim 10, wherein the second nitride layer extends below the bottom surface of the first nitride layer.

* * * * *